(12) United States Patent
Ohnuki

(10) Patent No.: US 8,847,627 B2
(45) Date of Patent: Sep. 30, 2014

(54) SEMICONDUCTOR DEVICE

(75) Inventor: Tatsuya Ohnuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 202 days.

(21) Appl. No.: 13/472,542

(22) Filed: May 16, 2012

(65) Prior Publication Data

US 2012/0292713 A1 Nov. 22, 2012

(30) Foreign Application Priority Data

May 20, 2011 (JP) ................................. 2011-114022

(51) Int. Cl.
*H03K 19/094* (2006.01)
*H03K 19/096* (2006.01)
*H03K 19/0944* (2006.01)
*H01L 27/12* (2006.01)

(52) U.S. Cl.
CPC ................................. *H01L 27/1225* (2013.01)
USPC ........................................... 326/113; 326/95

(58) Field of Classification Search
CPC ............ H03K 19/094; H03K 19/0944; H03K 19/0948; H03K 19/096
USPC ....................... 326/113, 95–98, 112, 119–122
See application file for complete search history.

(56) References Cited

U.S. PATENT DOCUMENTS

| | | | |
|---|---|---|---|
| 4,700,086 A * | 10/1987 | Ling et al. ........................ | 326/25 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Daniel D Chang
(74) *Attorney, Agent, or Firm* — Fish & Richardson P.C.

(57) ABSTRACT

A semiconductor device includes a first transistor, a second transistor, a first transistor group, and a second transistor group. The first transistor group includes a third transistor, a fourth transistor, and four terminals. The second transistor group includes fifth to eighth transistors and four terminals. The first transistor, the third transistor, the sixth transistor, and the eighth transistor are n-channel transistors, and the second transistor, the fourth transistor, the fifth transistor, and the seventh transistor are p-channel transistors.

16 Claims, 26 Drawing Sheets

(56) References Cited

U.S. PATENT DOCUMENTS

| | | |
|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230994 A1* | 9/2009 | Rhee et al. ............... 326/98 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086010 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, C,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technlogy", SID DIGEST '04 : SID International Symposium Digest of Technnical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDs", Journal of the SID, 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID DIGEST '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 ; SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Paperrs, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 ; SID International Symposium Digest of Technical Papers, May 31, 2009, pp. 280-283.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 ; SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Paaivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09; Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanes Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPF '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

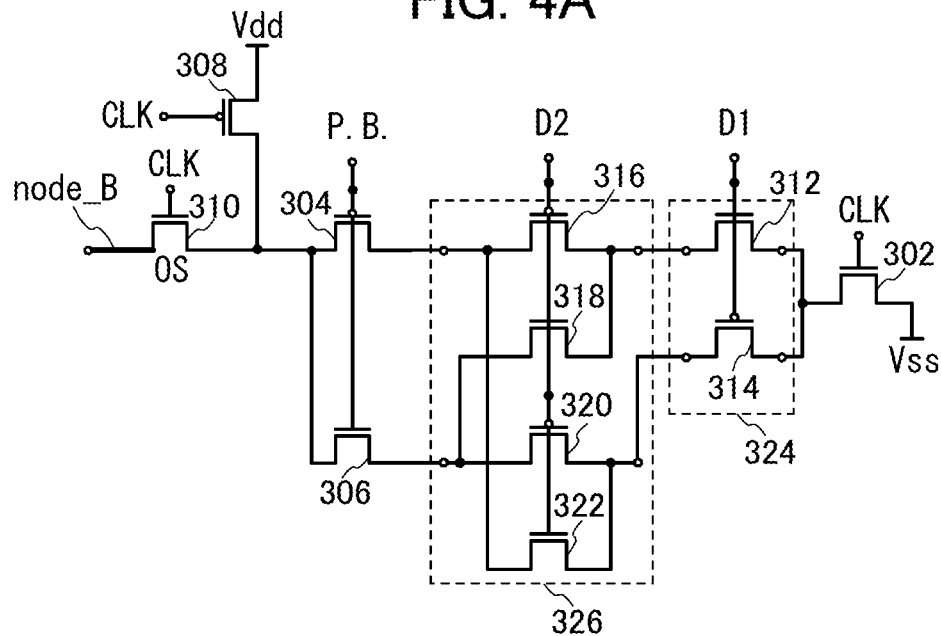
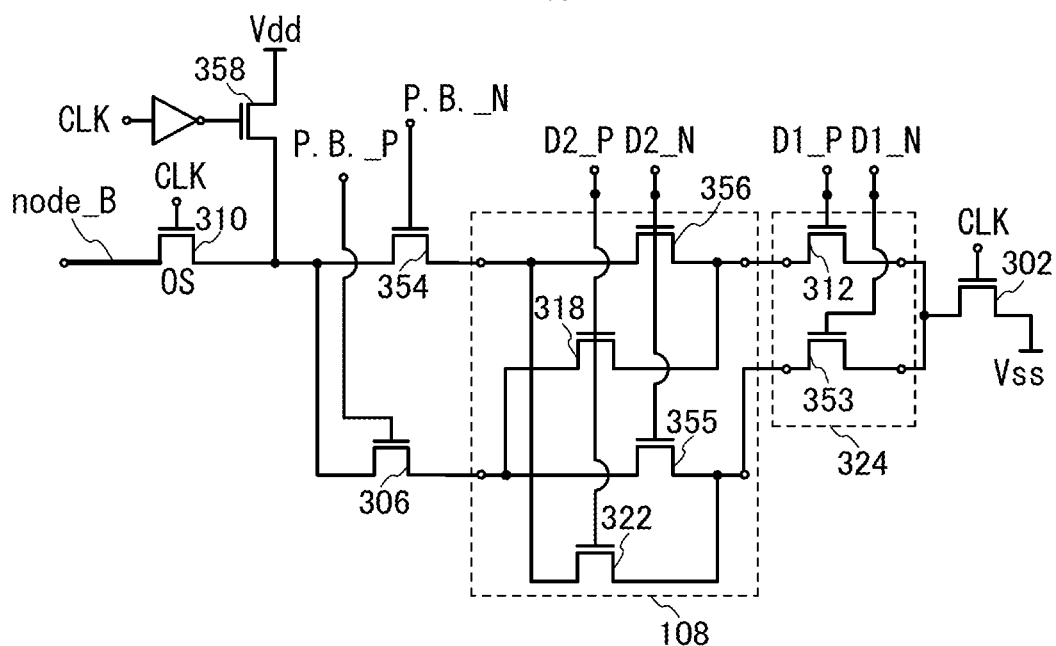

C-AXIS DIRECTION

CHARGE 0

CHARGE +1

CHARGE 0

AB PLANE

CHARGE −1

CHARGE 0

- In
- Sn
- Zn
- O

● In
● Ga
● Zn
● O

- In
- Ga or Zn
- O

- In
- Ga
- Zn
- O

SEMICONDUCTOR DEVICE

BACKGROUND OF THE INVENTION

1. Field of the Invention

The present invention relates to a semiconductor device. Note that in this specification, a semiconductor device refers to a semiconductor element itself or any device including a semiconductor element. As such a semiconductor element, a gate-insulated field-effect transistor can be given, for example. A semiconductor device also includes, in its category, a semiconductor circuit including a semiconductor element, an electro-optical device such as a display device, and an electronic device.

2. Description of the Related Art

A parity bit is a redundant bit signal which is added to a multi-bit digital data signal (hereinafter also referred to as a data potential signal) when the digital data signal is transmitted (or transferred).

Such a redundant bit is also added to a data potential signal after transmission, and parity bits before and after transmission are determined; thus, an error of a data potential signal can be determined. This determination method is called "parity check" and is generally used as a method for determining an error in data communication because determination can be performed only with a 1-bit parity bit added and because a parity bit can be generated by a plurality of XOR gates.

In recent years, metal oxides having semiconductor characteristics (hereinafter, referred to as oxide semiconductors) have attracted attention. Oxide semiconductors can be applied to transistors (see Patent Documents 1 and 2).

REFERENCE

Patent Document

[Patent Document 1] Japanese Published Patent Application No. 2007-123861
[Patent Document 2] Japanese Published Patent Application No. 2007-96055

SUMMARY OF THE INVENTION

In parity check in data communication, a storage element is electrically connected to an output of a parity bit output circuit in order to store a parity bit for a data potential signal before transmission. Further, a storage element is also electrically connected to an output of a parity check circuit in order to store a data potential signal after parity check. As examples of the storage element, a register, a random access memory (RAM), and the like can be given.

Conventional parity bit output circuits generally use a plurality of XOR gates. For example, a parity bit for an 8-bit data potential signal can be output by using 8 XOR gates. However, in the case of using 8 XOR gates, at least 48 transistors are needed as transistors to constitute the XOR gates.

Such provision of a storage element in a parity bit output circuit and a parity check circuit and provision of a large number of transistors for outputting a parity bit lead to an increase in cost and a decrease in yield in manufacturing a semiconductor device. Furthermore, an increase in the number of transistors operated in the parity bit output circuit or the parity check circuit leads to an increase in power consumption.

In view of the above, an object of one embodiment of the present invention is to provide a semiconductor device whose manufacturing cost is reduced and yield is improved. Another object of one embodiment of the present invention is to provide a semiconductor device with less power consumption.

One embodiment of the present invention is a semiconductor device including a first transistor; a second transistor; a first transistor group including a third transistor, a fourth transistor, and four terminals; and a second transistor group including fifth to eighth transistors and four terminals. In the semiconductor device, a data potential signal is input to the first transistor group and the second transistor group.

In the above structure, one of a source and a drain of the first transistor is electrically connected to a low-potential power supply line (hereinafter, referred to as Vss). The other of the source and the drain of the first transistor is electrically connected to the first terminal and the second terminal of the first transistor group. The third terminal of the first transistor group is electrically connected to the first terminal of the second transistor group. The fourth terminal of the first transistor group is electrically connected to the second terminal of the second transistor group. The third terminal of the second transistor group is electrically connected to one of a source and a drain of the second transistor and an output terminal. The other of the source and the drain of the second transistor is electrically connected to a high-potential power supply line (hereinafter, referred to as Vdd). The fourth terminal of the second transistor group is electrically connected to Vss. Note that in this specification, Vss is lower than Vdd, and is a ground potential, for example.

In the first transistor group, one of a source and a drain of the third transistor is electrically connected to the first terminal of the first transistor group. The other of the source and the drain of the third transistor is electrically connected to the third terminal of the first transistor group. One of a source and a drain of the fourth transistor is electrically connected to the second terminal of the first transistor group. The other of the source and the drain of the fourth transistor is electrically connected to the fourth terminal of the first transistor group.

In the second transistor group, one of a source and a drain of the fifth transistor and one of a source and a drain of the sixth transistor are electrically connected to the first terminal of the second transistor group. One of a source and a drain of the seventh transistor and one of a source and a drain of the eighth transistor are electrically connected to the second terminal of the second transistor group. The other of the source and the drain of the fifth transistor and the other of the source and the drain of the eighth transistor are electrically connected to the third terminal of the second transistor group. The other of the source and the drain of the sixth transistor and the other of the source and the drain of the seventh transistor are electrically connected to the fourth terminal of the second transistor group.

A gate of the first transistor and a gate of the second transistor are electrically connected to a first input terminal to which a clock signal is input. Gates of the third to eighth transistors are electrically connected to a second input terminal to which a data potential signal is input. The one of the source and the drain of the second transistor is electrically connected to the output terminal from which an output potential signal (parity bit) is output.

The first transistor, the third transistor, the sixth transistor, and the eighth transistor are n-channel transistors, and the second transistor, the fourth transistor, the fifth transistor, and the seventh transistor are p-channel transistors.

The above semiconductor device outputs a parity bit for a 2-bit data potential signal, because the data potential signal is input to two transistor groups. When the semiconductor device includes the first transistor group and second to m-th (m is a natural number of 3 or more) transistor groups each including fifth to eighth transistors and four terminals, the semiconductor device can output a parity bit for an m-bit data potential signal.

In that case, the following structure may be employed: the first terminal of the m-th transistor group is electrically connected to the third terminal of the (m−1)th transistor group, the second terminal of the m-th transistor group is electrically connected to the fourth terminal of the (m−1)th transistor group, the third terminal of the m-th transistor group is electrically connected to the one of the source and the drain of the second transistor and the output terminal, and the fourth terminal of the m-th transistor group is electrically connected to Vss.

In the above semiconductor device, a ninth transistor whose leakage current in an off state per micrometer of a channel width is lower than or equal to $1 \times 10^{-17}$ A may be provided between the second transistor and the output terminal. In that case, one of a source and a drain of the ninth transistor may be electrically connected to the other of the source and the drain of the second transistor, and the other of the source and the drain of the ninth transistor may be electrically connected to the output terminal.

In addition, it is possible to provide a semiconductor device capable of performing parity check by partly modifying the above semiconductor device that outputs a parity bit.

Therefore, another embodiment of the present invention is a semiconductor device including first to fourth transistors; a first transistor group including a fifth transistor, a sixth transistor, and four terminals; and a second transistor group including seventh to tenth transistors and four terminals.

In the above structure, one of a source and a drain of the first transistor is electrically connected to Vss. The other of the source and the drain of the first transistor is electrically connected to the first terminal of the first transistor group and the second terminal of the first transistor group. The third terminal of the first transistor group is electrically connected to the first terminal of the second transistor group. The fourth terminal of the first transistor group is electrically connected to the second terminal of the second transistor group. The third terminal of the second transistor group is electrically connected to one of a source and a drain of the second transistor. The fourth terminal of the second transistor group is electrically connected to one of a source and a drain of the third transistor. The other of the source and the drain of the second transistor is electrically connected to the other of the source and the drain of the third transistor, one of a source and a drain of the fourth transistor, and an output terminal. The other of the source and the drain of the fourth transistor is electrically connected to Vdd.

In the first transistor group, one of a source and a drain of the fifth transistor is electrically connected to the first terminal of the first transistor group. The other of the source and the drain of the fifth transistor is electrically connected to the third terminal of the first transistor group. One of a source and a drain of the sixth transistor is electrically connected to the second terminal of the first transistor group. The other of the source and the drain of the sixth transistor is electrically connected to the fourth terminal of the first transistor group.

In the second transistor group, one of a source and a drain of the seventh transistor and one of a source and a drain of the eighth transistor are electrically connected to the first terminal of the second transistor group. One of a source and a drain of the ninth transistor and one of a source and a drain of the tenth transistor are electrically connected to the second terminal of the second transistor group. The other of the source and the drain of the seventh transistor and the other of the source and the drain of the tenth transistor are electrically connected to the third terminal of the second transistor group. The other of the source and the drain of the eighth transistor and the other of the source and the drain of the ninth transistor are electrically connected to the fourth terminal of the second transistor group.

A gate of the first transistor and a gate of the fourth transistor are electrically connected to a first input terminal to which a clock signal is input. Gates of the transistors included in the first transistor group and the second transistor group are electrically connected to a second input terminal to which a data potential signal is input. Gates of the second transistor and the third transistor are electrically connected to a third input terminal to which a parity bit for determining a parity bit for the data potential signal is input.

Note that in the above semiconductor device, the first transistor, the third transistor, the fifth transistor, the eighth transistor, and the tenth transistor are n-channel transistors, and the second transistor, the fourth transistor, the sixth transistor, the seventh transistor, and the ninth transistor are p-channel transistors.

The above semiconductor device can perform parity check on a 2-bit data potential signal, because the data potential signal is input to two transistor groups. When provided with, in addition to the first transistor group, second to m-th (m is a natural number of 3 or more) transistor groups each including seventh to tenth transistors and four terminals, the semiconductor device can perform parity check on an m-bit data potential signal.

In the above semiconductor device, an eleventh transistor whose leakage current in an off state per micrometer of a channel width is lower than or equal to $1 \times 10^{-17}$ A may be provided between the second transistor and the output terminal. In that case, the following structure may be employed: one of a source and a drain of the eleventh transistor is electrically connected to the other of the source and the drain of the second transistor, the other of the source and the drain of the third transistor, and the one of the source and the drain of the fourth transistor; the other of the source and the drain of the eleventh transistor is electrically connected to the output terminal; and a gate of the eleventh transistor is electrically connected to the first input terminal.

In the semiconductor device according to one embodiment of the present invention, as the transistor with low leakage current in an off state, a transistor including an oxide semiconductor layer and a channel formation region included in the oxide semiconductor layer may be used, for example. Note that in the drawings, "OS" written below a circuit symbol of the transistor with low leakage current in an off state indicates that a transistor including a channel formation region included in an oxide semiconductor layer can be applied thereto.

In this specification, a leakage current in an off state refers to a current that flows between a source and drain when a voltage applied to a gate (also referred to as $V_{gs}$) is lower than a threshold voltage of the transistor on the basis of the source of the transistor. Therefore, to "turn off a transistor" means to set the voltage $V_{gs}$ to a value lower than or equal to a threshold voltage of the transistor. In addition, the leakage current in an off state may be simply referred to as off-state current. On the other hand, to "turn on a transistor" means to set the voltage $V_{gs}$ to a value higher than or equal to a threshold voltage of the transistor so that current (drain current) flows between a source and a drain of the transistor.

As described above, a transistor with low leakage current in an off state is provided previous to the output terminal, so that even when the power of the semiconductor device is off, an output parity bit and data (potential signal) after parity check can be stored (held). Accordingly, the semiconductor device according to one embodiment of the present invention need not be provided with a storage element, which is needed for a conventional parity bit output circuit or a conventional parity check circuit, and therefore is preferable.

In this specification, to "turn off power" means to set a state where there is no potential difference between Vdd and Vss. Further, to "turn on power" means to set a state where there is a potential difference between Vdd and Vss.

In the drawings, the high-potential power supply line is denoted by Vdd and the low-potential power supply line is denoted by Vss. In this specification, the semiconductor device according to one embodiment of the present invention includes neither Vss nor Vdd, and the output terminal is not electrically connected to a fixed potential or a ground potential, i.e., the output terminal has no leakage path.

The semiconductor device according to one embodiment of the present invention need not be provided with a storage element, which is needed for a conventional parity bit output circuit or a conventional parity check circuit, and therefore can be manufactured with reduced cost and improved yield.

Further, the number of transistors included in a parity bit output circuit and a parity check circuit can be reduced, resulting not only in a reduction in manufacturing cost and an improvement of yield but also in a reduction in power consumption.

Therefore, according to one embodiment of the present invention, a semiconductor device whose manufacturing cost is reduced and yield is improved can be provided. Further, according to one embodiment of the present invention, a semiconductor device with less power consumption can be provided.

BRIEF DESCRIPTION OF THE DRAWINGS

FIGS. 4A and 4B are circuit diagrams each illustrating an example of a semiconductor device according to one embodiment of the present invention.

DETAILED DESCRIPTION OF THE INVENTION

Figure 1A:
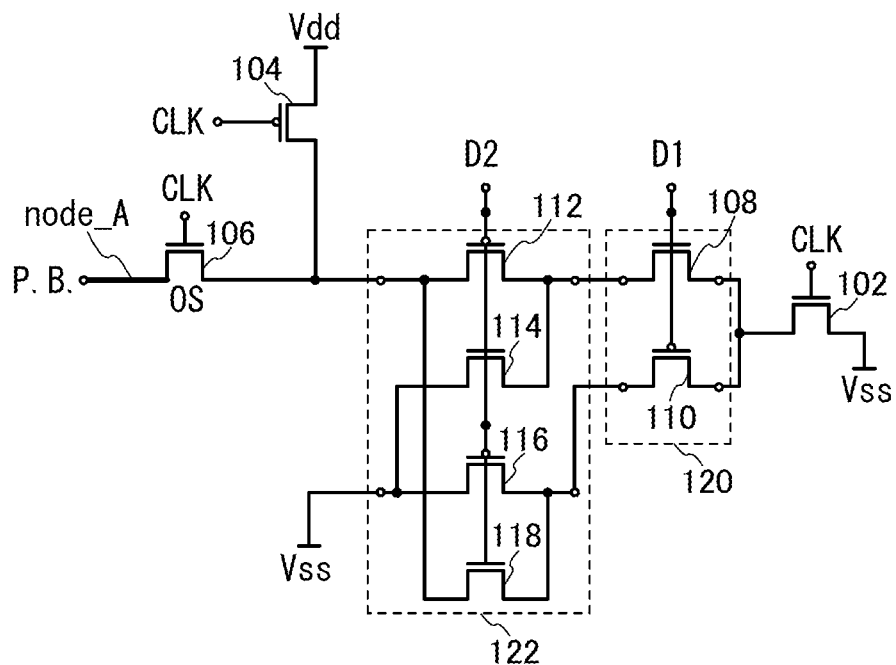
FIGS. 1A and 1B are circuit diagrams each illustrating an example of a semiconductor device according to one embodiment of the present invention.

Embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the description in the following embodiments. Note that the same portions or portions having similar functions in the structure of the present invention described below are denoted by the same reference numerals throughout the drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

In this specification, the expression "A is electrically connected to B" or "A and B are electrically connected" includes a case where A and B are directly connected to one another and a case where A and B are connected to one another with an object interposed therebetween.

In this specification, a "source" includes a source electrode, a region or an object electrically connected to the source electrode (e.g., a source region or a source terminal), and the like. Further, a "drain" includes a drain electrode, a region or an object electrically connected to the drain electrode (e.g., a drain region or a drain terminal), and the like. Since a source and a drain of a transistor change depending on the polarity, the operating condition, and the like of the transistor, it is difficult to define which is a source or a drain. Therefore, "one of a source and a drain" and "the other of the source and the drain" can be replaced with each other. Note that a "gate" includes a gate electrode, a region or an object electrically connected to the gate electrode (e.g., a gate terminal), and the like.

Embodiment 1

In this embodiment, configuration examples of a semiconductor device according to one embodiment of the present invention, specifically a parity bit output circuit, are described.

Figure 1B:
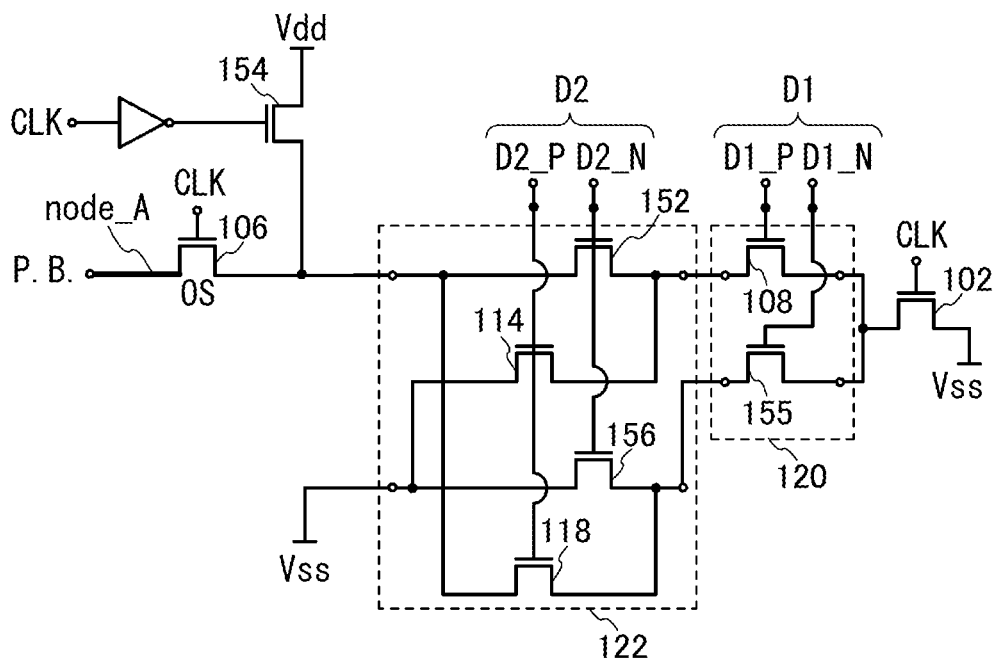

FIGS. 1A and 1B illustrate examples of a parity bit output circuit according to one embodiment of the present invention. A parity bit output circuit 100 illustrated in FIG. 1A outputs a parity bit for a 2-bit data potential signal, and includes first to ninth transistors. The connection relations of the transistors are described below.

The parity bit output circuit 100 is a semiconductor device including a transistor 102, a transistor 104, a transistor 106, and a first transistor group 120 and a second transistor group 122 to which a data potential signal is input. The first transistor group 120 includes a transistor 108, a transistor 110, and four terminals. The second transistor group 122 includes a transistor 112, a transistor 114, a transistor 116, a transistor 118, and four terminals.

One of a source and a drain of the transistor 102 is electrically connected to Vss. The other of the source and the drain of the transistor 102 is electrically connected to the first terminal of the first transistor group 120 and the second terminal of the first transistor group 120. The third terminal of the first transistor group 120 is electrically connected to the first terminal of the second transistor group 122. The fourth terminal of the first transistor group 120 is electrically connected to the second terminal of the second transistor group 122. The third terminal of the second transistor group 122 is electrically connected to one of a source and a drain of the transistor 104 and one of a source and a drain of the transistor 106. The other of the source and the drain of the transistor 104 is electrically connected to Vdd. The fourth terminal of the second transistor group 122 is electrically connected to Vss.

In the first transistor group 120, one of a source and a drain of the transistor 108 is electrically connected to the first terminal of the first transistor group 120. The other of the source and the drain of the transistor 108 is electrically connected to the third terminal of the first transistor group 120. One of a source and a drain of the transistor 110 is electrically connected to the second terminal of the first transistor group 120. The other of the source and the drain of the transistor 110 is electrically connected to the fourth terminal of the first transistor group 120.

In the second transistor group 122, one of a source and a drain of the transistor 112 and one of a source and a drain of the transistor 114 are electrically connected to the first terminal of the second transistor group 122. One of a source and a drain of the transistor 116 and one of a source and a drain of the transistor 118 are electrically connected to the second terminal of the second transistor group 122. The other of the source and the drain of the transistor 112 and the other of the source and the drain of the transistor 118 are electrically connected to the third terminal of the second transistor group 122. The other of the source and the drain of the transistor 114 and the other of the source and the drain of the transistor 116 are electrically connected to the fourth terminal of the second transistor group 122.

Gates of the transistor 102, the transistor 104, and the transistor 106 are electrically connected to a first input terminal to which a clock signal is input. A gate of the transistor 108, a gate of the transistor 110, a gate of the transistor 112, a gate of the transistor 114, a gate of the transistor 116, and a gate of the transistor 118 are electrically connected to a second input terminal to which a data potential signal is input. The other of the source and the drain of the transistor 106 is electrically connected to an output terminal from which an output potential signal (parity bit, denoted by P.B. in the drawings) is output.

Note that in the parity bit output circuit according to one embodiment of the present invention, a plurality of input terminals, the number of which corresponds to the number of bits of the data potential signal, is collectively referred to as a second input terminal.

The transistor 102, the transistor 108, the transistor 114, and the transistor 118 are n-channel transistors. The transistor 104, the transistor 110, the transistor 112, and the transistor 116 are p-channel transistors.

The transistor 106 is a transistor whose leakage current in an off state (an off-state current) per micrometer of a channel width is lower than or equal to $1 \times 10^{-17}$ A/μm. The off-state current of the transistor is preferably lower than or equal to $1 \times 10^{-18}$ A/μm, more preferably lower than or equal to $1 \times 10^{-21}$ A/μm, further preferably lower than or equal to $1 \times 10^{-24}$ A/μm.

Note that the parity bit output circuit 100 may have a circuit configuration in which the transistor 106 is not provided and the one of the source and the drain of the transistor 104 is electrically connected to the output terminal.

Next, an operation of the parity bit output circuit 100 is described. The parity bit output circuit 100 outputs a parity bit for a 2-bit data potential signal. Here, a data potential signal input to the gate of the transistor 108 and the gate of the transistor 110 is denoted by D1, and a data potential signal input to the gate of the transistor 112, the gate of the transistor 114, the gate of the transistor 116, and the gate of the transistor 118 is denoted by D2. Since D1 and D2 are digital signals, either one of a high potential signal or a low potential signal is always input as each of D1 and D2.

The clock signal(s) input to the gate of the transistor 102, the gate of the transistor 104, and the gate of the transistor 106 have the same cycle. The potential of the clock signal is switched between high-level and low-level in a certain cycle.

First, when a low-potential clock signal is input to the gate of the transistor 102, the gate of the transistor 104, and the gate of the transistor 106, the potentials of the gate of the transistor 102 and the gate of the transistor 106 become low, whereby the transistor 102 and the transistor 106 are turned off. On the other hand, although the potential of the gate of the transistor 104 also becomes low, the transistor 104 is turned on. Thus, the parity bit output circuit 100 is charged (precharged) with a high power supply potential Vdd. Note that, here, to be "charged" means that the potential of any node included in the parity bit output circuit 100 is increased to be equal to the high power supply potential regardless of the potential of an input data potential signal.

Here, the case where D1 is a high potential signal and D2 is a low potential signal is described. In that case, in the first transistor group 120, the potential of the gate of the transistor 108 becomes high, whereby the transistor 108 is turned on. The potential of the gate of the transistor 110 becomes high, whereby the transistor 110 is turned off. In the second transistor group 122, the potentials of the gate of the transistor 112 and the gate of the transistor 116 become low, whereby the transistor 112 and the transistor 116 are turned on. The potentials of the gate of the transistor 114 and the gate of the transistor 118 become low, whereby the transistor 114 and the transistor 118 are turned off.

When the above data potential signals are input and a high-potential clock signal is input to the gate of the transistor 102, the gate of the transistor 104, and the gate of the transistor 106, the potentials of the gate of the transistor 102 and the gate of the transistor 106 become high, whereby the transistor 102 and the transistor 106 are turned on. On the other hand, although the potential of the gate of the transistor 104 also becomes high, the transistor 104 is off.

Consequently, Vss electrically connected to the transistor 102, the transistor 102, the transistor 108, the transistor 106, the transistor 112, and the output terminal are electrically connected to one another. When Vss and the output terminal are thus electrically connected to each other, a low potential signal with the low power supply potential is output to the output terminal. That is, when D1 and D2 of an input data potential signal are a high potential signal and a low potential signal, respectively, a parity bit for the data potential signal is a low potential signal.

Then, when a low-potential clock signal is input to the gate of the transistor 102, the gate of the transistor 104, and the gate of the transistor 106, the potentials of the gate of the transistor 102 and the gate of the transistor 106 become low, whereby the transistor 102 and the transistor 106 are turned off. The transistor 106 has low leakage current in an off state, and the output terminal electrically connected to the transistor 106 is not electrically connected to a fixed potential or a ground potential, i.e., the output terminal has no leakage path; thus, a node (node_A, corresponding to a heavy line in FIG. 1A) between the one of the source and the drain of the transistor 106 and the output terminal is brought into a floating state. Therefore, during a period in which the transistor 106 is off (while the clock signal is a low potential signal), the parity bit for the input data potential signal is held (stored) in the node_A.

During the period in which the transistor 106 is off (while the clock signal is a low potential signal), the parity bit output circuit 100 is charged with the high power supply potential in order to output a parity bit for a data potential signal which is input next. At this time, the nodes included in the parity bit output circuit 100 except the node_A are charged to have a potential equal to the high power supply potential.

After that, a next data potential signal can be input. Here, description is made assuming that D1 and D2 of the next data potential signal are high potential signals. In this case, the transistor 108, the transistor 114, and the transistor 118 are turned on. When a high-potential clock signal is input again to the gate of the transistor 102, the gate of the transistor 104, and the gate of the transistor 106, the transistor 102 and the transistor 106 are turned on. On the other hand, the potential of the gate of the transistor 104 becomes high, whereby the transistor 104 is turned off.

Thus, the output terminal and Vss which is electrically connected to the transistor 102 the transistor 116 are not electrically connected to each other, so that a high potential signal with the high power supply potential with which the parity bit output circuit 100 is charged is output to the output terminal. That is, the parity bit for the next input data potential signal (of which D1 and D2 are high potential signals) is a high potential signal. Note that the previously held (stored) parity bit that is the low potential signal is replaced by the next output parity bit (the high potential signal).

After the output of the parity bit that is the high potential signal, a low-potential clock signal is input to the gate of the transistor 102, the gate of the transistor 104, and the gate of the transistor 106, so that the node_A is brought into a floating state as in the previous case; thus, the parity bit can be held (stored) in the node_A.

As set forth above, the parity bit output circuit 100 outputs a parity bit which is a low potential signal when the number of high potential signals of an input data potential signal (here, D1 and D2) is an odd number, and outputs a parity bit which is a high potential signal when the number of high potential signals of an input data potential signal is an even number.

Since the parity bit output circuit 100 can hold (store) a parity bit for an input data potential signal, a storage element (a register or a RAM) which is needed for a conventional parity bit output circuit and is electrically connected to the conventional parity bit output circuit can be replaced with one transistor; thus, a semiconductor device manufactured with reduced cost can be provided.

The parity bit held (stored) in the parity bit output circuit 100 is kept being held (stored) even when the power of the parity bit output circuit 100 is turned off, so that it is unnecessary to re-output a parity bit for the original data potential signal when the power is turned on again. In other words, the transistor with low off-state current provided in the parity bit output circuit 100 enables the circuit to start operation quickly when the power is turned on again.

In the case where data potential signals are sequentially input to the parity bit output circuit 100, a parity bit which is held (stored) is preferably added to the previous data potential signal and transmitted to a destination before the held (stored) parity bit is replaced by a parity bit output for an input data potential signal.

Note that the parity bit output circuit 100 may have a circuit configuration in which the clock signal input to the gate of the transistor 102 and the gate of the transistor 104 is not input to the gate of the transistor 106. For example, a low potential signal with a desired period can be input to the gate of the transistor 106, instead of synchronizing the period in which a once output and held parity bit is held with the period in which the clock signal is a low potential signal.

The parity bit output circuit 100 may also have a circuit configuration in which an inverter is electrically connected between the other of the source and the drain of the transistor 106 and the output terminal. In that case, the parity bit output circuit 100 outputs a parity bit which is a high potential signal when the number of high potential signals of an input data potential signal is an odd number, and outputs a parity bit which is a low potential signal when the number of high potential signals of an input data potential signal is an even number.

Although the parity bit output circuit 100 illustrated in FIG. 1A is a circuit including a plurality of n-channel transistors and a plurality of p-channel transistors, the p-channel transistors included in the parity bit output circuit 100 may be replaced with n-channel transistors. FIG. 1B is a circuit diagram of a parity bit output circuit 150 in which all the transistors are n-channel transistors. The parity bit output circuit 150 is described using the reference numerals in FIG. 1A as appropriate.

The parity bit output circuit 150 includes the same number of transistors as the parity bit output circuit 100 (first to ninth transistors). In the parity bit output circuit 150, the transistor 104, the transistor 110, the transistor 112, and the transistor 116 of the parity bit output circuit 100 are replaced with a transistor 154, a transistor 155, a transistor 152, and a transistor 156, respectively. The other components of the parity bit output circuit 150 are the same as those of the parity bit output circuit 100.

Such a parity bit output circuit including transistors which all have the same polarities is preferable because it can be manufactured in fewer steps than a parity bit output circuit which includes transistors with different polarities.

Note that the parity bit output circuit 150 may have a circuit configuration in which the transistor 106 is not provided and the one of the source and the drain of the transistor 154 is electrically connected to the output terminal.

In the parity bit output circuit 150, according to its circuit configuration, it is necessary that the transistor 102 be off when the transistor 154 is on and the transistor 102 be on when the transistor 154 is off. Therefore, an inverter is preferably electrically connected to a gate of the transistor 154 so that a clock signal inverted from a clock signal input to the gate of the transistor 102 is input to the gate of the transistor 154. In the case where the inverter is not provided, it is preferable that a clock signal inverted from a clock signal input to the gate of the transistor 102 be constantly input to the gate of the transistor 154.

A data potential signal which is input will be described. A data potential signal input to a gate of the transistor 155 of the data potential signal D1 is a data potential signal inverted from the data potential signal input to the gate of the transistor 108, according to the circuit operation of the parity bit output circuit 150. In FIG. 1B, the data potential signal input to the gate of the transistor 108 is denoted by D1_P and the data potential signal input to the gate of the transistor 155 is denoted by D1_N. D1_P and D1_N are potential signals inverted from each other.

A data potential signal input to a gate of the transistor 152 and a gate of the transistor 156 of the data potential signal D2 is a data potential signal inverted from the data potential signal input to the gate of the transistor 114 and the gate of the transistor 118, according to the circuit operation of the parity bit output circuit 150. In FIG. 1B, the data potential signal input to the gate of the transistor 114 and the gate of the transistor 118 is denoted by D2_P and the data potential signal input to the gate of the transistor 152 and the gate of the transistor 156 is denoted by D2_N. D2_P and D2_N are potential signals inverted from each other.

Here, description is made assuming that D1_P and D1_N having opposite polarities and D2_P and D2_N having opposite polarities are generated by a peripheral circuit electrically connected to the parity bit output circuit 150. Alternatively, an inverter may be electrically connected to the gate of the transistor 155, the gate of the transistor 152, and the gate of the transistor 156, in which case data potential signals with one polarity are input.

A method for outputting a parity bit (circuit operation) in the parity bit output circuit 150 is the same as that in the parity bit output circuit 100.

The parity bit output circuit 150 operates in a manner similar to that of the parity bit output circuit 100, whereby the node_A is brought into a floating state. Therefore, the parity bit can be held (stored) in the node_A.

The parity bit output circuit 100 and the parity bit output circuit 150 are parity bit output circuits used in the case where the input data potential signal is a 2-bit signal; a parity bit for a data potential signal of three or more bits can be output when two or more second transistor groups 122 are provided.

Figure 2A:
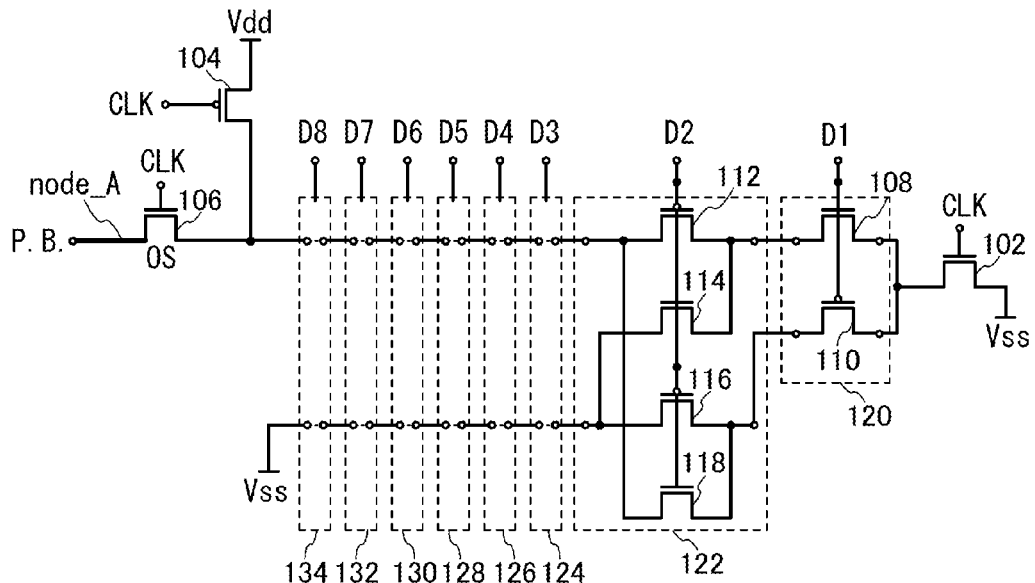
FIGS. 2A and 2B are circuit diagrams each illustrating an example of a semiconductor device according to one embodiment of the present invention.

Here, a parity bit output circuit 200 for an 8-bit data potential signal will be described. FIG. 2A illustrates a circuit diagram of the parity bit output circuit 200. The parity bit output circuit 200 is the parity bit output circuit 100 illustrated in FIG. 1A which is provided with a plurality of second transistor groups, and therefore is described using the reference numerals in FIG. 1A as appropriate.

In the parity bit output circuit 200, seven transistor groups each having the same configuration as the second transistor group 122 are provided in the circuit configuration of the parity bit output circuit 100. That is, the parity bit output circuit 200 includes the transistor 102, the transistor 104, the transistor 106, and first to eighth transistor groups 120 to 134.

The connection relations of the first transistor group 120 and the second transistor group 122 in the parity bit output circuit 200 are similar to those in the parity bit output circuit 100.

The first terminal of the eighth transistor group 134 is electrically connected to the third terminal of the seventh transistor group 132. The second terminal of the eighth transistor group 134 is electrically connected to the fourth terminal of the seventh transistor group 132. The third terminal of the eighth transistor group 134 is electrically connected to the one of the source and the drain of the transistor 104 and the one of the source and the drain of the transistor 106. The fourth terminal of the eighth transistor group 134 is electrically connected to Vss.

Next, the connection relations of the third to seventh transistor groups 124 to 132 will be described. Among the third to seventh transistor groups 124 to 132, the first terminal of a given transistor group (e.g., the fifth transistor group 128 or the sixth transistor group 130) is electrically connected to the third terminal of a transistor group provided previous to the given transistor group, and the second terminal of the given transistor group is electrically connected to the fourth terminal of the transistor group provided previous to the given transistor group. Further, the third terminal of the given transistor group is electrically connected to the first terminal of a transistor group provided subsequent to the given transistor group, and the fourth terminal of the given transistor group is electrically connected to the second terminal of the transistor group provided subsequent to the given transistor group.

For example, the first terminal of the third transistor group 124 is electrically connected to the third terminal of the second transistor group 122, and the second terminal of the third transistor group 124 is electrically connected to the fourth terminal of the second transistor group 122. The third terminal of the third transistor group 124 is electrically connected to the first terminal of the fourth transistor group 126, and the fourth terminal of the third transistor group 124 is electrically connected to the second terminal of the fourth transistor group 126.

The connection relations of the transistors included in the first transistor group 120 and the second transistor group 122 in the parity bit output circuit 200 are the same as those in the parity bit output circuit 100.

Further, the connection relations between Vss and the transistor 102, between the transistor 102 and the first transistor group 120, between Vdd and the transistor 104, and between the transistor 104 and the transistor 106 in the parity bit output circuit 200 are all the same as those in the parity bit output circuit 100.

Note that the parity bit output circuit 200 may have a circuit configuration in which the transistor 106 is not provided and the one of the source and the drain of the transistor 104 is electrically connected to the output terminal.

The operation of the parity bit output circuit 200 is similar to that of the parity bit output circuit 100. First, when a clock signal input to the gate of the transistor 102, the gate of the transistor 104, and the gate of the transistor 106 is a low potential signal, the parity bit output circuit 200 is charged with a high power supply potential.

Next, when the clock signal is a high potential signal and a data potential signal is input to the first to eighth transistor groups 120 to 134, the transistors included in the first to eighth transistor groups 120 to 134 are turned on or off in response to the data potential signal. When the number of high potential signals of the data potential signal is an odd number, Vss electrically connected to the one of the source and the drain of the transistor 102 and the output terminal are electrically connected to each other, so that a low potential signal with a low power supply potential is output as a parity bit. When the number of high potential signals of the data potential signal is an even number, Vss and the output terminal are not electrically connected to each other, so that a high potential signal with the high power supply potential with which the parity bit output circuit 200 is charged is output to the output terminal as a parity bit. That is, a parity bit which is a low potential signal is output when the number of high potential signals of the input data potential signal is an odd number, and a parity bit which is a high potential signal is output when the number of high potential signals of the input data potential signal is an even number.

After the output of the parity bit, a low-potential clock signal is input to the gate of the transistor 102, the gate of the transistor 104, and the gate of the transistor 106, so that the node_A is brought into a floating state; thus, the parity bit is held (stored) in the node_A during a period in which the transistor 106 is off (while the clock signal is a low potential signal).

As in the parity bit output circuit 100, a storage element (a register or a RAM) which is needed for a conventional parity bit output circuit and is electrically connected to the conventional parity bit output circuit can be replaced with one transistor in the parity bit output circuit 200; thus, a semiconductor device manufactured with reduced cost can be provided.

In addition, as in the parity bit output circuit 100, the transistor with low off-state current provided in the parity bit output circuit 200 enables the circuit to start operation quickly when the power is turned on again.

In the parity bit output circuit 200, data potential signals can be sequentially input and parity bits for the respective data potential signals can be output as in the parity bit output circuit 100. In that case, a parity bit which is held (stored) is preferably added to the previous data potential signal and transmitted to a destination before the held (stored) parity bit is replaced by a parity bit output for an input data potential signal.

The parity bit output circuit 200 may also have a circuit configuration in which an inverter is electrically connected between the other of the source and the drain of the transistor 106 and the output terminal. In that case, the parity bit output circuit 100 outputs a parity bit which is a high potential signal when the number of high potential signals of an input data potential signal is an odd number, and outputs a parity bit which is a low potential signal when the number of high potential signals of an input data potential signal is an even number.

Note that the parity bit output circuit 200 may have a circuit configuration in which the clock signal input to the gate of the transistor 102 and the gate of the transistor 104 is not input to the gate of the transistor 106. For example, a low potential signal with a desired period can be input to the gate of the transistor 106, instead of synchronizing the period in which a once output and held parity bit is held with the period in which the clock signal is a low potential signal.

Figure 2B:
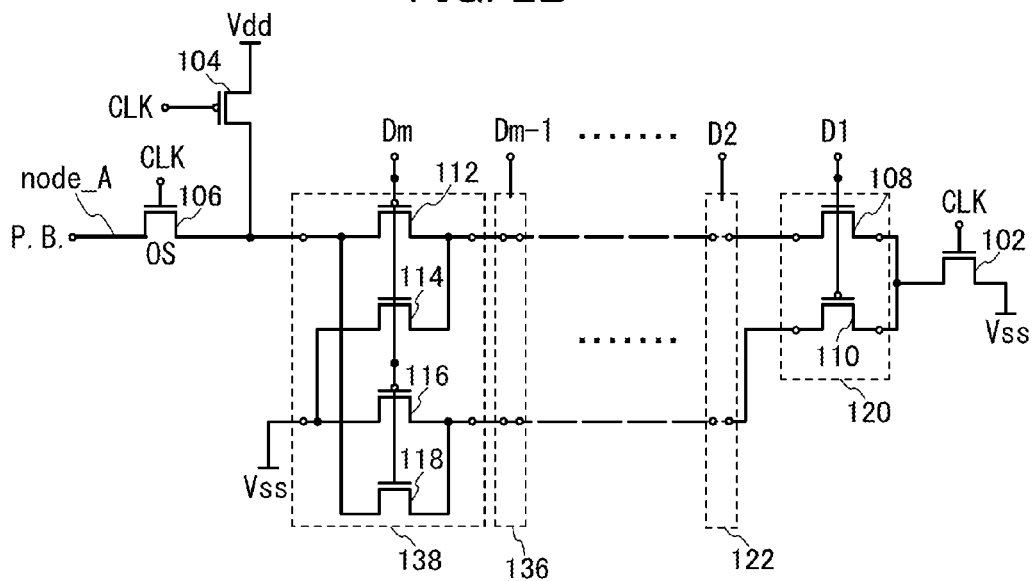

The parity bit output circuit 200 is a parity bit output circuit for an 8-bit data potential signal; any parity bit output circuit which is for a data potential signal of three or more bits has the connection relations described below (see FIG. 2B).

A parity bit output circuit for a data potential signal of three or more bits includes the transistor 102, the transistor 104, the transistor 106, and first to m-th (m is a natural number of 3 or more) transistor groups 120 to 138. The first transistor group 120 includes a transistor 108, a transistor 110, and four terminals. The m-th transistor group 138 has the same structure as the second transistor group 122, and includes the transistor 112, the transistor 114, the transistor 116, the transistor 118, and four terminals. The first terminal of the first transistor group 120 and the second terminal of the first transistor group 120 are electrically connected to the other of the source and the drain of the transistor 102. The third terminal of the first transistor group 120 is electrically connected to the first terminal of the second transistor group 122. The fourth terminal of the first transistor group 120 is electrically connected to the second terminal of the second transistor group 122. The first terminal of the m-th transistor group 138 is electrically connected to the third terminal of the (m−1)th transistor group 136. The second terminal of the m-th transistor group 138 is electrically connected to the fourth terminal of the (m−1)th transistor group 136. The third terminal of the m-th transistor group 138 is electrically connected to the one of the source and the drain of the transistor 104 and the one of the source and the drain of the transistor 106. The fourth terminal of the m-th transistor group 138 is electrically connected to Vss. Besides, the connection relations of the transistor 102, the transistor 104, and the transistor 106 and the connection relations of the transistors (the transistor 108, the transistor 110, the transistor 112, the transistor 114, the transistor 116, and the transistor 118) included in the first to m-th transistor groups 120 to 138 can be similar to those in the parity bit output circuit 100.

A parity bit output circuit having the above connection relations can operate in a manner similar to those of the parity bit output circuit 100, the parity bit output circuit 150, and the parity bit output circuit 200.

When a parity bit output circuit for a data potential signal of three or more bits has the above connection relations, the number of transistors included therein can be reduced as compared to that in a conventional parity bit output circuit. For example, when eight XOR gates are used as a conventional parity bit output circuit for an 8-bit data potential signal, at least 48 transistors are needed as transistors included in the circuit, whereas the number of transistors included in the parity bit output circuit 200 can be reduced to 35. Therefore, power consumption can be reduced and the parity bit output circuit itself can be miniaturized as compared to a conventional parity bit output circuit. As a result, a semiconductor device whose power consumption is reduced and which is miniaturized as compared to a conventional semiconductor device can be provided. Further, the manufacturing cost of the semiconductor device can be reduced and the yield thereof can be improved.

Figure 3:
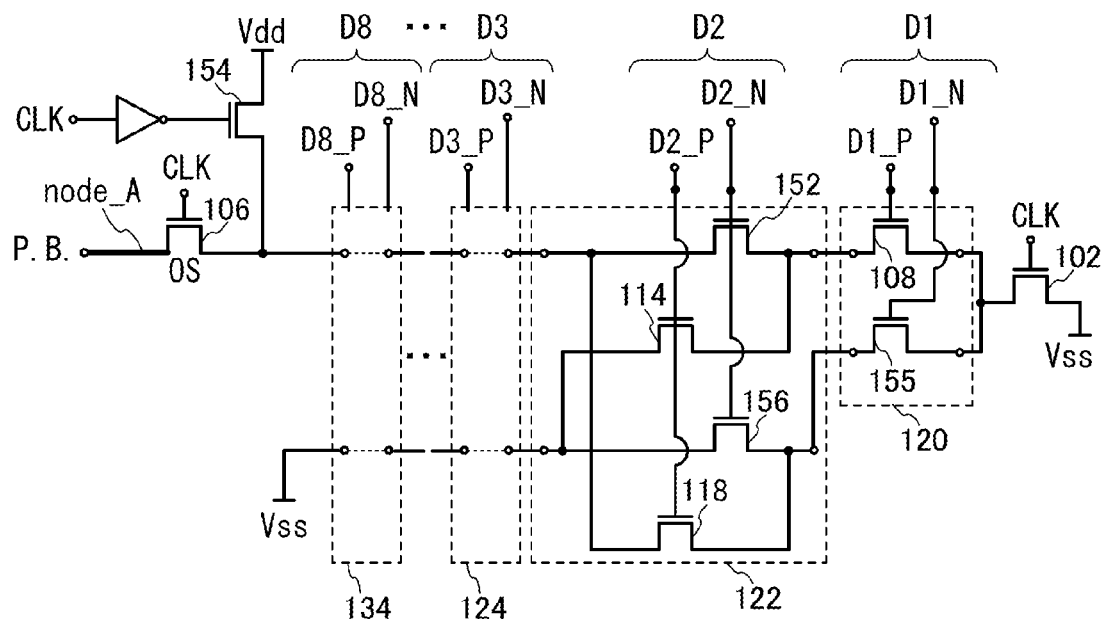
FIG. 3 is a circuit diagram illustrating an example of a semiconductor device according to one embodiment of the present invention.

All the p-channel transistors included in the parity bit output circuit 200 may be replaced with n-channel transistors. FIG. 3 illustrates a parity bit output circuit 250 as an example of such a case. The parity bit output circuit 250 is a modification example of the parity bit output circuit 200, and therefore is described using the reference numerals in FIG. 2A as appropriate.

The parity bit output circuit 250 includes the same number of transistors as the parity bit output circuit 200. In the parity bit output circuit 250, the transistor 104 of the parity bit output circuit 200 is replaced with the transistor 154. The transistor 110 in the first transistor group 120 is replaced with the transistor 155. The transistor 112 and the transistor 116 in the second transistor group 122 are replaced with the transistor 152 and the transistor 156, respectively. Further, in the third to eighth transistor groups 124 to 134, p-channel transistors are replaced with n-channel transistors as in the second transistor group 122. The other components of the parity bit output circuit 250 are the same as those of the parity bit output circuit 200.

Note that the parity bit output circuit 250 may have a circuit configuration in which the transistor 106 is not provided and the one of the source and the drain of the transistor 154 is electrically connected to the output terminal.

The operation of the parity bit output circuit 250 is the same as that of the parity bit output circuit 150 except for that the input data potential signal is changed from a 2-bit signal (D1_P and D1_N and D2_P and D2_N) to an 8-bit signal (D1_P and D1_N to D8_P and D8_N). Therefore, the description of the operation of the parity bit output circuit 150 can be referred to.

The parity bit output circuit according to one embodiment of the present invention is not limited to having the circuit configuration described in this embodiment, as long as it has the above described connection relations. For example, in the parity bit output circuit 100, a capacitor may be provided between the one of the source and the drain of the transistor 104 and the one of the source and the drain of the transistor 106. In that case, one electrode of the capacitor may be electrically connected to the one of the source and the drain of the transistor 104 and the other of the source and the drain of the transistor 112, and the other electrode of the capacitor may be electrically connected to the one of the source and the drain of the transistor 106.

In the parity bit output circuit 100 and the parity bit output circuit 200, there is no particular limitation on the transistor 102, the transistor 104, the transistor 108, the transistor 110, the transistor 112, the transistor 114, the transistor 116, and the transistor 118 as long as a transistor is formed using a substrate including a semiconductor material. Further, in the parity bit output circuit 150 and the parity bit output circuit 250, there is no particular limitation on the transistor 154, the transistor 155, the transistor 152, and the transistor 156 as long as a transistor is formed using a substrate including a semiconductor material.

In the parity bit output circuit according to one embodiment of the present invention, the transistor electrically connected to the output terminal (e.g., the transistor 106 in the above parity bit output circuit) is a transistor whose off-state current per micrometer of a channel width is lower than or equal to $1\times10^{-17}$ A, as described above. As an example of the transistor, a transistor whose channel formation region is formed in a wide-gap semiconductor such as an oxide semiconductor can be given. Further, in the oxide semiconductor, hydrogen which serves as a carrier supplier is preferably reduced to an extremely low level. Thus, the channel formation region is preferably formed using an oxide semiconductor layer where the hydrogen concentration is $5\times10^{19}/cm^3$ or lower, more preferably, $5\times10^{18}/cm^3$ or lower, and in which oxygen exceeds the stoichiometric proportion. The hydrogen concentration in the oxide semiconductor used for forming the channel formation region is measured by secondary ion mass spectrometry (SIMS).

The oxide semiconductor is preferably formed using a metal oxide containing at least indium (In) or zinc (Zn). In particular, In and Zn are preferably contained. As a stabilizer for reducing variation in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

The carrier concentration in the oxide semiconductor is preferably lower than $1.0\times10^{14}/cm^3$. By decreasing the carrier concentration, the off-state current of the transistor can be reduced.

Note that in the parity bit output circuit described in this embodiment, the transistor whose channel formation region is formed using a wide-gap semiconductor such as an oxide semiconductor may also be used for all the transistors other than the transistor 106.

Here, the advantage of using a transistor with low leakage current in an off state (a transistor including an oxide semiconductor) for the semiconductor device according to one embodiment of the present invention will be described.

The semiconductor device according to one embodiment of the present invention includes the transistor with low leakage current in an off state; therefore, when the power is turned on again, the parity bit which is output just before the power is turned off can be output again. This is because nonvolatility can be achieved by a transistor including an oxide semiconductor.

In addition, a nonvolatile semiconductor device can be achieved by using a magnetic tunnel junction element (MTJ element) utilizing spintronics. The MTJ element stores data by setting a low-resistance state when the magnetization directions of ferromagnetic films provided above and below an insulating film are parallel, or a high-resistance state when the direction thereof are anti-parallel. Thus, in achieving nonvolatility, the principle of the MTJ element is completely different from that of an oxide semiconductor as in the semiconductor device according to one embodiment of the present invention.

Now, comparison is made between a nonvolatile semiconductor device including the MTJ element and a nonvolatile semiconductor device including the transistor including an oxide semiconductor with reference to Table 1.

TABLE 1

|  | Spintronics (MTJ element) | Oxide semiconductor/Si |
|---|---|---|
| Heat resistance | Curie temperature | Process temperature around 500° C. (Reliability at 150° C.) |
| Driving method | Current driving | Voltage driving |
| Writing principle | Changing spin direction of magnetic body | On/off of FET |
| Si LSI | Suitable for bipolar LSI (MOS device is preferable for high integration because bipolar device is unsuitable for high integration. Note that W gets larger.) | Suitable for MOS LSI |

TABLE 1-continued

|  | Spintronics (MTJ element) | Oxide semiconductor/Si |
|---|---|---|
| Overhead | Large (Because of high Joule heat) | Smaller by 2 to 3 or more orders of magnitude than the MTJ element (Because of charging and discharging of parasitic capacitance) |
| Nonvolatility | Utilizing spin | Utilizing low off-state current |
| Number of times electric charge can be held | Without limitation | Without limitation |
| 3D conversion | Difficult (at most two layers) | Easy (the number of layers is limitless) |
| Material | Magnetic rare-earth element | Oxide semiconductor material |
| Element cost | High | Low (Might be slightly high depending on oxide semiconductor material (such as In)) |

As shown in Table 1, the MTJ element is current-driven, so that a potential is input or held by changing the magnetization direction of the ferromagnetic film. In contrast, the transistor including an oxide semiconductor is voltage-driven, so that a potential is input or held by switching the on and off states of the transistor.

In theory, both the MTJ element and the transistor including an oxide semiconductor can achieve nonvolatility without limitation on the number of times electric charge can be held.

The MTJ element has a disadvantage in that a magnetic property is lost when the temperature is higher than or equal to the Curie temperature because a magnetic material is used. In addition, the MTJ element is compatible with a silicon bipolar device because current driving is employed; however, the bipolar device is unsuitable for high integration. Furthermore, the MTJ element has a problem in that its power consumption is increased with the integration, although the MTJ element requires low write current.

In order to achieve high integration of semiconductor devices, a variety of elements are stacked to obtain three-dimensional integration. However, such three-dimensional integration is difficult for semiconductor devices including MTJ elements. In contrast, semiconductor devices including transistors including an oxide semiconductor are suitable for stacked three-dimensional integration.

In principle, the MTJ element has low resistance to a magnetic field, so that the magnetization direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that is sensitive to metal contamination. The material cost per element of the MTJ element is expensive.

On the other hand, the transistor including an oxide semiconductor has an element structure and an operation principle which are similar to those of a silicon MOSFET except that the channel formation region is formed using a semiconductor material such as a metal oxide. Further, the transistor including an oxide semiconductor layer is not affected by a magnetic field. Therefore, the semiconductor device according to one embodiment of the present invention has a high stability against the magnetic field compared to a nonvolatile semiconductor device including the MTJ element. Further, the semiconductor device according to one embodiment of the present invention may be highly compatible with a silicon integrated circuit.

From the above, in order to achieve a nonvolatile semiconductor device, a transistor with extremely low off-state current, in particular, a transistor including an oxide semiconductor is preferably used.

Consequently, according to one embodiment of the present invention, a semiconductor device whose power consumption and manufacturing cost are reduced and yield is improved can be provided. Note that the contents of this embodiment or part thereof can be combined freely with the contents of other embodiments or part thereof.

Embodiment 2

A parity check circuit can be formed by applying the circuit configuration of the parity bit output circuit described in the above embodiment. In this embodiment, a parity check circuit according to one embodiment of the present invention will be described. Note that the reference numerals used for the parity bit output circuit in the above embodiment are used as appropriate for describing the parity check circuit.

FIGS. 4A and 4B illustrate examples of a parity check circuit according to one embodiment of the present invention. A parity check circuit 300 illustrated in FIG. 4A is a circuit which determines a parity bit for a 2-bit data potential signal and includes first to eleventh transistors. The connection relations of the transistors are described below.

The parity check circuit 300 is a semiconductor device including a transistor 302, a transistor 304, a transistor 306, a transistor 308, and a transistor 310, two of which are transistors to which a parity bit to be determined (a parity bit for a data potential signal before transmission) is input, a first transistor group 324, and a second transistor group 326. The first transistor group 324 includes a transistor 312, a transistor 314, and four terminals. The second transistor group 326 includes a transistor 316, a transistor 318, a transistor 320, a transistor 322, and four terminals.

The parity check circuit 300 has a circuit configuration in which the transistor 304 and the transistor 306 are provided between the second transistor group 122 and the transistor 106 of the parity bit output circuit 100. That is, the transistors in the parity check circuit 300 except the transistor 304 and the transistor 306 which are additionally provided are connected to one another in a manner similar to that of the transistors included in the parity bit output circuit 100.

One of a source and a drain of the transistor 302 is electrically connected to Vss. The other of the source and the drain of the transistor 302 is electrically connected to the first terminal of the first transistor group 324 and the second terminal of the first transistor group 324. The third terminal of the first transistor group 324 is electrically connected to the first terminal of the second transistor group 326. The fourth terminal of the first transistor group 324 is electrically connected to the second terminal of the second transistor group 326. The third terminal of the second transistor group 326 is electrically connected to one of a source and a drain of the transistor 304. The fourth terminal of the second transistor group 326 is electrically connected to one of a source and a drain of the transistor 306. The other of the source and the drain of the transistor 304 and the other of the source and the drain of the transistor 306 are electrically connected to one of a source and a drain of the transistor 308 and one of a source and a drain of the transistor 310. The other of the source and the drain of the transistor 308 is electrically connected to Vdd.

The connection relations of the transistors in the first transistor group 324 are similar to those in the first transistor group 120 of the parity bit output circuit 100, and the connection relations of the transistors in the second transistor group 326 are similar to those in the second transistor group 122 of the parity bit output circuit 100.

Gates of the transistor 302, the transistor 308, and the transistor 310 are electrically connected to a first input terminal to which a clock signal is input. A gate of the transistor 312, a gate of the transistor 314, a gate of the transistor 316, a gate of the transistor 318, a gate of the transistor 320, and a gate of the transistor 322 are electrically connected to a second input terminal to which a data potential signal is input. A gate of the transistor 304 and a gate of the transistor 306 are electrically connected to a third input terminal to which a parity bit for a data potential signal before transmission is input. The other of the source and the drain of the transistor 310 is electrically connected to an output terminal from which an output potential signal (a potential signal corresponding to a result of parity check) is output.

Note that in the parity check circuit according to one embodiment of the present invention, a plurality of input terminals, the number of which corresponds to the number of bits of the data potential signal, is collectively referred to as a second input terminal.

The transistor 302, the transistor 306, the transistor 312, the transistor 318, and the transistor 322 are n-channel transistors. The transistor 304, the transistor 308, the transistor 314, the transistor 316, and the transistor 320 are p-channel transistors.

The transistor 310 is a transistor whose leakage current in an off state (an off-state current) per micrometer of a channel width is lower than or equal to $1\times10^{-17}$ A/μm. The off-state current of the transistor is preferably lower than or equal to $1\times10^{-18}$ A/μm, more preferably lower than or equal to $1\times10^{-21}$ A/μm, further preferably lower than or equal to $1\times10^{-24}$ A/μm.

Note that the parity check circuit 300 may have a circuit configuration in which the transistor 310 is not provided and the other of the source and the drain of the transistor 304, the other of the source and the drain of the transistor 306, and the one of the source and the drain of the transistor 308 are electrically connected to the output terminal.

Next, an operation of the parity check circuit 300 is described. The parity check circuit 300 performs parity check on a 2-bit data potential signal. Here, a data potential signal input to the gate of the transistor 312 and the gate of the transistor 314 is denoted by D1, and a data potential signal input to the gate of the transistor 316, the gate of the transistor 318, the gate of the transistor 320, and the gate of the transistor 322 is denoted by D2. Here, D1 and D2 are data potential signals after transmission (transfer). The parity check circuit 300 outputs a low potential signal when data potential signals before and after transmission are the same, and outputs a high potential signal when there is an error of a data potential signal.

The clock signal(s) input to the gate of the transistor 302, the gate of the transistor 308, and the gate of the transistor 310 have the same cycle. The potential of the clock signal is switched between high-level and low-level in a certain cycle.

First, when a low-potential clock signal is input to the gate of the transistor 302, the gate of the transistor 308, and the gate of the transistor 310, the potentials of the gate of the transistor 302 and the gate of the transistor 310 become low, whereby the transistor 302 and the transistor 310 are turned off. On the other hand, although the potential of the gate of the transistor 308 also becomes low, the transistor 308 is turned on. Thus, the parity check circuit 300 is charged with a high power supply potential Vdd. Note that, here, to be "charged" means that the potential of any node included in the parity check circuit 300 is increased to be equal to the high power supply potential Vdd regardless of the potential of an input data potential signal.

Here, the case where there is no difference (error) between the data potential signals before and after transmission, D1 is a high potential signal, and D2 is a low potential signal will be described. As a parity bit (P.B. in FIG. 4A) for a data potential signal before transmission, a low potential signal is output when the number of high potential signals of the data potential signal before transmission is an odd number, and a high potential signal is output when the number of high potential signals of the data potential signal before transmission is an even number (see Embodiment 1).

When a high potential signal is input as D1 and a low potential signal is input as D2, the transistor 312, the transistor 318, and the transistor 322 are turned on, and the transistor 314, the transistor 316, and the transistor 320 are turned off. When a low potential signal is input as a parity bit for a data potential signal before transmission, the transistor 306 is turned on and the transistor 304 is turned off.

When parity bits for the data potential signal after transmission and the data potential signal before transmission are input and a high-potential clock signal is input to the gate of the transistor 302, the gate of the transistor 308, and the gate of the transistor 310, the transistor 302 and the transistor 310 are turned on. On the other hand, the transistor 308 is turned off.

In other words, when the parity bits for the data potential signals before and after transmission are the same, Vss electrically connected to the transistor 302 and the output terminal are electrically connected to each other. When Vss and the output terminal are thus electrically connected to each other, a low potential signal with the low power supply potential is output to the output terminal That is, when the low potential signal is output to the output terminal, it is confirmed that the parity bits for the data potential signals before and after transmission are the same; thus, it can be simply determined that the data potential signals before and after transmission are the same.

Then, when a low-potential clock signal is input to the gate of the transistor 302, the gate of the transistor 308, and the gate of the transistor 310, the transistor 302 and the transistor 310 are turned off. The transistor 310 has low leakage current in an off state, and the output terminal electrically connected to the transistor 310 is not electrically connected to a fixed potential or a ground potential, i.e., the output terminal has no leakage path; thus, a node (node_B, corresponding to a heavy line in FIG. 4A) between the one of the source and the drain of the transistor 310 and the output terminal is brought into a floating state. Therefore, a potential signal based on parity check (a result of parity check) is held (stored) in the node_B during a period in which the transistor 310 is off (while the clock signal is a low potential signal).

After that, a next transmitted data potential signal can be input and parity check can be performed. A high potential signal or a low potential signal is output in response to parity bits for the next transmitted data potential signal and a data potential signal before the transmission of the next transmitted data potential. Note that the previously held (stored) potential signal based on parity check (the result of parity check) is replaced by the output potential signal based on parity check. The above operation is repeated, whereby it can be simply determined that there is no error in transmission of the data potential signal.

Here, the case where there is a difference (error) between the data potential signals before and after transmission will be described. As an example, the case where high potential signals are input as D1 and D2 of the data potential signal after transmission (the parity bit is a high potential signal) and the parity bit for the data potential signal before transmission is a low potential signal will be described. It is assumed that the parity check circuit 300 is already charged with the high power supply potential. When the high potential signals are input as D1 and D2, the transistor 312, the transistor 318, and the transistor 322 are turned on, and the transistor 314, the transistor 316, and the transistor 320 are turned off. Further, when the low potential signal which is a parity bit is input to the gate of the transistor 304 and the gate of the transistor 306, the transistor 304 is turned on and the transistor 306 is turned off.

When the above data potential signal is input and a high-potential clock signal is input to the gate of the transistor 302, the gate of the transistor 308, and the gate of the transistor 310, the transistor 302 and the transistor 310 are turned on. On the other hand, the transistor 308 is turned off.

When the parity bits for the data potential signals before and after transmission are different, Vss electrically connected to the one of the source and the drain of the transistor 302 and the output terminal are not electrically connected to each other, so that a high potential signal with the high power supply potential with which the parity check circuit 300 is charged is output. That is, when the high potential signal is output to the output terminal, it is confirmed that the parity bits for the data potential signals before and after transmission are different; thus, it can be simply determined that there is a difference between the data potential signals before and after transmission.

In the parity check circuit 300, the node_B is brought into a floating state by turning off the transistor 310, whereby the potential signal based on parity check of the data potential signals before and after transmission can be held (stored). Therefore, a storage element (a register or a RAM) which is needed for a conventional parity check circuit and is electrically connected to the conventional parity check circuit can be replaced with one transistor; thus, a semiconductor device manufactured with reduced cost can be provided.

In the case where data potential signals are sequentially input to the parity check circuit 300, a potential signal based on parity check which is held (stored) is preferably transmitted to another destination (e.g., a storage capacitor) electrically connected to the parity check circuit 300 in advance before the held (stored) potential signal based on parity check is replaced by a potential signal based on parity check of a next input data potential signal.

Note that the parity check circuit 300 may have a circuit configuration in which the clock signal input to the gate of the transistor 302 and the gate of the transistor 308 is not input to the gate of the transistor 310. For example, a low potential signal with a desired period can be input to the gate of the transistor 310, instead of synchronizing the period in which a once output and held parity bit is held with the period in which the clock signal is a low potential signal.

The parity check circuit 300 may also have a circuit configuration in which an inverter is electrically connected between the other of the source and the drain of the transistor 310 and the output terminal. In that case, a high potential signal is output when parity bits for data potential signals before and after transmission are the same, and a low potential signal is output when the parity bits are different.

The p-channel transistors included in the parity check circuit 300 illustrated in FIG. 4A may be replaced with n-channel transistors. FIG. 4B is a circuit diagram of a parity check circuit 350 in which all the transistors are n-channel transistors. The parity check circuit 350 is described using the reference numerals in FIG. 3 as appropriate.

The parity check circuit 350 includes the same number of transistors as the parity check circuit 300 (first to eleventh transistors). In the parity check circuit 350, the transistor 304, the transistor 308, the transistor 314, the transistor 316, and the transistor 320 of the parity check circuit 300 are replaced with a transistor 354, a transistor 358, a transistor 353, a transistor 356, and a transistor 355, respectively. The other components of the parity check circuit 350 are the same as those of the parity check circuit 300.

Such a parity check circuit including transistors which all have the same polarities is preferable because it can be manufactured in fewer steps than a parity check circuit which includes transistors with different polarities.

Note that the parity check circuit 350 may have a circuit configuration in which the transistor 310 is not provided and the other of the source and the drain of the transistor 354, the other of the source and the drain of the transistor 306, and the one of the source and the drain of the transistor 358 are electrically connected to the output terminal.

In the parity check circuit 350, as in the parity bit output circuit 150, an inverter is preferably electrically connected to a gate of the transistor 358 so that a clock signal inverted from a clock signal input to the gate of the transistor 302 is input to the gate of the transistor 358. In the case where the inverter is not provided, it is preferable that a clock signal inverted from a clock signal input to the gate of the transistor 302 be constantly input to the gate of the transistor 358.

A data potential signal after transmission which is input will be described. A data potential signal input to a gate of the transistor 353 of the data potential signal D1 is a data potential signal inverted from the data potential signal input to the gate of the transistor 312, as in the parity bit output circuit 150. In FIG. 4B, the data potential signal input to the gate of the transistor 312 is denoted by D1_P and the data potential signal input to the gate of the transistor 353 is denoted by D1_N. D1_P may be the same potential signal as D1 or D1_N may be the same potential signal as D1 as long as D1_P and D1_N are potential signals inverted from each other.

A data potential signal input to a gate of the transistor 356 and a gate of the transistor 355 of the data potential signal D2 is a data potential signal inverted from the data potential signal input to the gate of the transistor 318 and the gate of the transistor 322, as in the parity bit output circuit 150. In FIG. 4B, the data potential signal input to the gate of the transistor 318 and the gate of the transistor 322 is denoted by D2_P and the data potential signal input to the gate of the transistor 356 and the gate of the transistor 355 is denoted by D2_N. D2_P may be the same potential signal as D2 or D2_N may be the same potential signal as D2 as long as D2_P and D2_N are potential signals inverted from each other.

A method for outputting a potential signal based on parity check (circuit operation) in the parity check circuit 350 is the same as that in the parity check circuit 300.

The parity check circuit 350 operates in a manner similar to that of the parity check circuit 300, whereby the node_B (a heavy line in FIG. 4B) is brought into a floating state. Therefore, the potential signal based on parity check can be held (stored) in the node_B.

The parity check circuit 300 and the parity check circuit 350 are parity check circuits used in the case where the input data potential signal is a 2-bit signal; a parity bit output for a data potential signal of three or more bits can be checked when two or more second transistor groups 326 are provided.

Figure 5A:
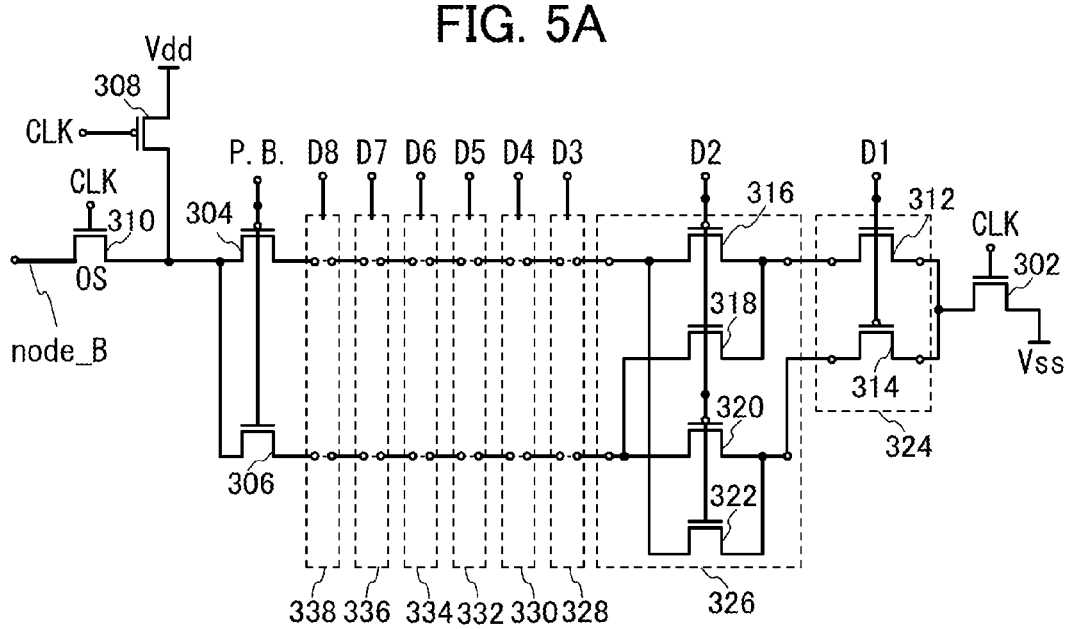
FIGS. 5A and 5B are circuit diagrams each illustrating an example of a semiconductor device according to one embodiment of the present invention.

Here, a parity check circuit 400 in which data potential signals before and after transmission are 8-bit data potential signals will be described. FIG. 5A illustrates a circuit diagram of the parity check circuit 400. The parity check circuit 400 is the parity check circuit 300 illustrated in FIG. 4A which is provided with a plurality of second transistor groups, and therefore is described using the reference numerals in FIG. 4A as appropriate.

In the parity check circuit 400, seven transistor groups each having the same configuration as the second transistor group 326 are provided in the circuit configuration of the parity check circuit 300. That is, the parity check circuit 400 includes the transistor 302, the transistor 304, the transistor 306, the transistor 308, the transistor 310, and first to eighth transistor groups 324 to 338.

The connection relations of the first transistor group 324 and the second transistor group 326 in the parity check circuit 400 are similar to those in the parity check circuit 300.

The first terminal of the eighth transistor group 338 is electrically connected to the third terminal of the seventh transistor group 336. The second terminal of the eighth transistor group 338 is electrically connected to the fourth terminal of the seventh transistor group 336. The third terminal of the eighth transistor group 338 is electrically connected to the one of the source and the drain of the transistor 304. The fourth terminal of the eighth transistor group 338 is electrically connected to the one of the source and the drain of the transistor 306.

Next, the connection relations of the third to seventh transistor groups 328 to 336 will be described. Among the third to seventh transistor groups 328 to 336, the first terminal of a given transistor group (e.g., the fifth transistor group 332 or the sixth transistor group 334) is electrically connected to the third terminal of a transistor group provided previous to the given transistor group, and the second terminal of the given transistor group is electrically connected to the fourth terminal of the transistor group provided previous to the given transistor group. Further, the third terminal of the given transistor group is electrically connected to the first terminal of a transistor group provided subsequent to the given transistor group, and the fourth terminal of the given transistor group is electrically connected to the second terminal of the transistor group provided subsequent to the given transistor group.

For example, the first terminal of the third transistor group 328 is electrically connected to the third terminal of the second transistor group 326, and the second terminal of the third transistor group 328 is electrically connected to the fourth terminal of the second transistor group 326. The third terminal of the third transistor group 328 is electrically connected to the first terminal of the fourth transistor group 330, and the fourth terminal of the third transistor group 328 is electrically connected to the second terminal of the fourth transistor group 330.

The connection relations of the transistors included in the first transistor group 324 and the second transistor group 326 in the parity check circuit 400 are the same as those in the parity check circuit 300.

Further, the connection relations between Vss and the transistor 302, between the transistor 302 and the first transistor group 324, between Vdd and the transistor 308, and between the transistor 304, the transistor 306, the transistor 308, and the transistor 310 in the parity check circuit 400 are all the same as those in the parity check circuit 300.

Note that the parity check circuit 400 may have a circuit configuration in which the transistor 310 is not provided and the other of the source and the drain of the transistor 304, the other of the source and the drain of the transistor 306, and the one of the source and the drain of the transistor 308 are electrically connected to the output terminal.

The operation of the parity check circuit 400 is similar to that of the parity check circuit 300. First, when a clock signal input to the gate of the transistor 302, the gate of the transistor 308, and the gate of the transistor 310 is a low potential signal, the parity check circuit 400 is charged with a high power supply potential.

Next, when the clock signal is a high potential signal and a data potential signal after transmission is input to the first to eighth transistor groups 324 to 338, the transistors included in the first to eighth transistor groups 324 to 338 are turned on or off in response to the data potential signal. A parity bit for the data potential signal before transmission is input to the gate of the transistor 304 and the gate of the transistor 306. When the parity bits for the data potential signals before and after transmission are the same, Vss electrically connected to the one of the source and the drain of the transistor 302 and the output terminal are electrically connected to each other, so that a low potential signal with the low power supply potential is output. That is, when the low potential signal is output, it can be simply determined that the data potential signals before and after transmission are the same.

On the other hand, when the parity bits for the data potential signals before and after transmission are different, Vss electrically connected to the one of the source and the drain of the transistor 302 and the output terminal are not electrically connected to each other, so that a high potential signal with the high power supply potential with which the parity check circuit 400 is charged is output. That is, when the high potential signal is output, it can be simply determined that there is a difference between the data potential signals before and after transmission.

Also in the parity check circuit 400, the node_B is brought into a floating state by turning off the transistor 310, whereby the potential signal based on parity check of the data potential signals before and after transmission can be held (stored) in the node_B. Therefore, a storage element (a register or a RAM) which is needed for a conventional parity check circuit and is electrically connected to the conventional parity check circuit can be replaced with one transistor; thus, a semiconductor device manufactured with reduced cost can be provided.

In addition, as in the parity check circuit 300, the transistor with low off-state current provided in the parity check circuit 400 enables the circuit to start operation quickly when the power is turned on again.

In the case where data potential signals are sequentially input to the parity check circuit 400, a potential signal based on parity check which is held (stored) is preferably transmitted to another destination (e.g., a storage capacitor) electrically connected to the parity check circuit 400 before the held (stored) potential signal based on parity check is replaced by a potential signal based on parity check of a next input data potential signal.

Note that the parity check circuit 400 may have a circuit configuration in which the clock signal input to the gate of the transistor 302 and the gate of the transistor 308 is not input to the gate of the transistor 310. For example, a low potential signal with a desired period can be input to the gate of the transistor 310, instead of synchronizing the period in which a once output and held parity bit is held with the period in which the clock signal is a low potential signal.

The parity check circuit 400 may also have a circuit configuration in which an inverter is electrically connected between the other of the source and the drain of the transistor 310 and the output terminal. In that case, a high potential signal is output when parity bits for data potential signals before and after transmission are the same, and a low potential signal is output when the parity bits are different.

Figure 5B:
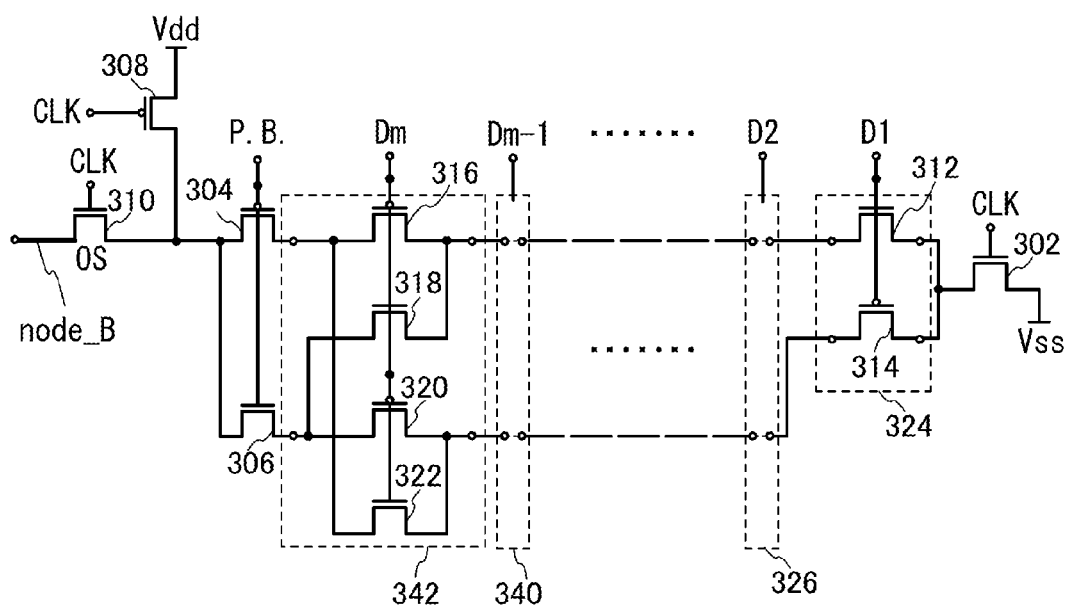

The parity check circuit 400 is a parity check circuit for an 8-bit data potential signal; any parity check circuit which is for a data potential signal of three or more bits has the connection relations described below (see FIG. 5B).

A parity check circuit for a data potential signal of three or more bits includes the transistor 302, the transistor 304, the transistor 306, the transistor 308, the transistor 310, and first to m-th (m is a natural number of 3 or more) transistor groups 324 to 342. The first transistor group 324 includes the transistor 312, the transistor 314, and four terminals. The m-th transistor group 342 has the same structure as the second transistor group 326, and includes the transistor 316, the transistor 318, the transistor 320, the transistor 322, and four terminals. The first terminal of the first transistor group 324 and the second terminal of the first transistor group 324 are electrically connected to the other of the source and the drain of the transistor 302. The third terminal of the first transistor group 324 is electrically connected to the first terminal of the second transistor group 326. The fourth terminal of the first transistor group 324 is electrically connected to the second terminal of the second transistor group 326. The first terminal of the m-th transistor group 342 is electrically connected to the third terminal of the (m−1)th transistor group 340. The second terminal of the m-th transistor group 342 is electrically connected to the fourth terminal of the (m−1)th transistor group 340. The third terminal of the m-th transistor group 342 is electrically connected to the one of the source and the drain of the transistor 304. The fourth terminal of the m-th transistor group 342 is electrically connected to the one of the source and the drain of the transistor 306. Besides, the connection relations of the transistor 302, the transistor 308, the transistor 310, Vss, and Vdd and the connection relations of the transistors (the transistor 312, the transistor 314, the transistor 316, the transistor 318, the transistor 320, and the transistor 322) included in the first to m-th transistor groups 324 to 342 can be similar to those in the parity check circuit 300.

A parity check circuit having the above connection relations can operate in a manner similar to those of the parity check circuit 300, the parity check circuit 350, and the parity check circuit 400.

When a parity check circuit for a data potential signal of three or more bits has the above connection relations, the number of transistors included therein can be reduced as compared to that in a conventional parity check circuit. Therefore, power consumption can be reduced and the parity check circuit itself can be miniaturized as compared to a conventional parity check circuit. As a result, a semiconductor device whose power consumption is reduced and which is miniaturized as compared to a conventional semiconductor device can be provided. Further, the manufacturing cost of the semiconductor device can be reduced and the yield thereof can be improved.

Figure 6:
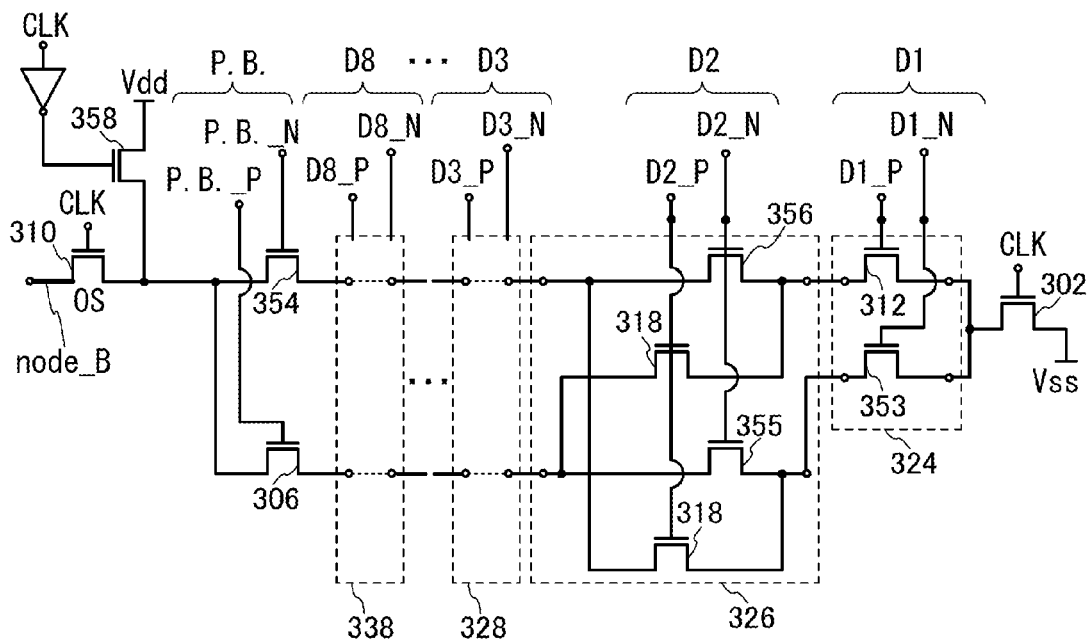
FIG. 6 is a circuit diagram illustrating an example of a semiconductor device according to one embodiment of the present invention.

All the p-channel transistors included in the parity check circuit 400 may be replaced with n-channel transistors. FIG. 6 illustrates a parity check circuit 450 as an example of such a case. The parity check circuit 450 is described using the reference numerals in FIG. 5A as appropriate.

The parity check circuit 450 includes the same number of transistors as the parity check circuit 400. In the parity check circuit 450, the transistor 304 of the parity check circuit 400 is replaced with the transistor 354. The transistor 314 in the first transistor group 324 is replaced with the transistor 353. The transistor 316 and the transistor 320 in the second transistor group 326 are replaced with the transistor 356 and the transistor 355, respectively. Further, in the third to eighth transistor groups 328 to 338, p-channel transistors are replaced with n-channel transistors as in the second transistor group 326. The other components of the parity check circuit 450 are the same as those of the parity check circuit 400.

Such a parity check circuit including transistors which all have the same polarities is preferable because it can be manufactured in fewer steps than a parity check circuit which includes transistors with different polarities.

Note that the parity check circuit 450 may have a circuit configuration in which the transistor 310 is not provided and the other of the source and the drain of the transistor 354, the other of the source and the drain of the transistor 306, and the one of the source and the drain of the transistor 358 are electrically connected to the output terminal.

The operation of the parity check circuit 450 is the same as that of the parity check circuit 400 except for that the input data potential signal is changed from a 2-bit signal (D1_P and D1_N and D2_P and D2_N) to an 8-bit signal (D1_P and D1_N to D8_P and D8_N). Therefore, the description of the operation of the parity check circuit 400 can be referred to.

The parity check circuit according to one embodiment of the present invention is not limited to having the circuit configuration described in this embodiment, as long as it has the above described connection relations. For example, in the parity check circuit 300, a capacitor may be provided between the one of the source and the drain of the transistor 308 and the one of the source and the drain of the transistor 310. In that case, one electrode of the capacitor may be electrically connected to the one of the source and the drain of the transistor 308, and the other electrode of the capacitor may be electrically connected to the one of the source and the drain of the transistor 310.

In the parity check circuit 300 and the parity check circuit 400, there is no particular limitation on the transistor 302, the transistor 304, the transistor 306, the transistor 308, the transistor 312, the transistor 314, the transistor 316, the transistor 318, the transistor 320, and the transistor 322 as long as a transistor is formed using a substrate including a semiconductor material. Further, in the parity check circuit 350 and the parity check circuit 450, there is no particular limitation on the transistor 354, the transistor 358, the transistor 353, the transistor 356, and the transistor 355 as long as a transistor is formed using a substrate including a semiconductor material.

In the parity check circuit according to one embodiment of the present invention, the transistor electrically connected to the output terminal (e.g., the transistor 310 in the above parity check circuit) is a transistor whose off-state current per micrometer of a channel width is lower than or equal to $1 \times 10^{-17}$ A, as described above. As an example of the transistor, a transistor whose channel formation region is formed in a wide-gap semiconductor such as an oxide semiconductor can be given. The transistor electrically connected to the output terminal in the parity check circuit in this embodiment is similar to the transistor electrically connected to the output terminal in the parity bit output circuit described in the above embodiment; thus, Embodiment 1 can be referred to for description.

Note that in the parity check circuit described in this embodiment, the transistor whose channel formation region is formed using a wide-gap semiconductor such as an oxide semiconductor may be used as appropriate for all the transistors other than the transistor 310.

Also in the parity check circuit in this embodiment, in order to achieve non-volatility, use of a transistor with extremely low off-state current, particularly a transistor including an oxide semiconductor, is preferable to use of an MTJ element.

Consequently, according to one embodiment of the present invention, a semiconductor device whose power consumption and manufacturing cost are reduced and yield is improved can be provided. Note that the contents of this embodiment or part thereof can be combined freely with the contents of other embodiments or part thereof.

Embodiment 3

In this embodiment, a method for manufacturing a transistor included in the parity bit output circuit or the parity check circuit described in any of the above embodiments is described.

The p-channel and n-channel transistors included in the parity bit output circuit or the parity check circuit described in any of the above embodiments are formed by a general method using a substrate including a semiconductor material. Note that in this embodiment, one of the p-channel and n-channel transistors is illustrated over a semiconductor substrate for simplicity of the drawings.

Specifically, the transistor having low off-state current included in the parity bit output circuit or the parity check circuit described in any of the above embodiments can be obtained in the following manner: a p-channel transistor and an n-channel transistor are formed using a substrate including a semiconductor material and then a transistor whose channel formation region is formed in an oxide semiconductor layer is formed over the p-channel and n-channel transistors. A semiconductor substrate 700 over which p-channel and n-channel transistors are provided is used as a formation substrate and a transistor whose channel formation region is formed using an oxide semiconductor is provided over the substrate, whereby the area occupied by the transistors in the parity bit output circuit or the parity check circuit can be reduced; thus, miniaturization of the parity bit output circuit or the parity check circuit can be achieved. Note that the transistor whose channel formation region is formed in an oxide semiconductor layer may be applied to any other n-channel transistor included in the parity bit output circuit or the parity check circuit.

Figure 7:
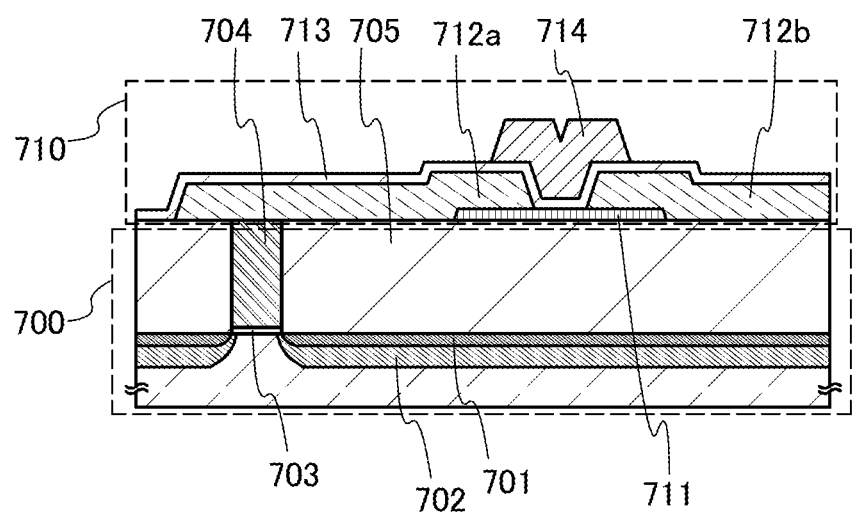
FIG. 7 is a cross-sectional view illustrating a transistor according to one embodiment of the present invention.

The semiconductor substrate 700 over which the p-channel and n-channel transistors are formed includes a high-concentration impurity region 701 serving as a source and a drain, a low-concentration impurity region 702, a gate insulating film 703, a gate electrode 704, and an interlayer insulating film 705 (see FIG. 7).

A transistor 710 whose channel formation region is formed in an oxide semiconductor layer includes an oxide semiconductor layer 711 formed over the semiconductor substrate 700 over which the p-channel and n-channel transistors are provided, a source electrode 712a and a drain electrode 712b which are formed separately from each other and are in contact with the oxide semiconductor layer 711, a gate insulating film 713 formed over at least the channel formation region of the oxide semiconductor layer 711, and a gate electrode 714 formed over the gate insulating film 713 to overlap with the oxide semiconductor layer 711 (see FIG. 7).

The interlayer insulating film 705 also serves as a base insulating film of the oxide semiconductor layer 711.

The interlayer insulating film 705 contains oxygen at least in its surface, and is formed using an insulating oxide from which part of the oxygen is desorbed by heat treatment. As an insulating oxide from which part of oxygen is desorbed by heat treatment, a material containing more oxygen than that in the stoichiometric proportion is preferably used. This is because oxygen can be supplied to an oxide semiconductor film in contact with the interlayer insulating film 705 by the heat treatment.

As an insulating oxide containing more oxygen than that in the stoichiometric proportion, silicon oxide represented by $SiO_x$ where $x>2$ can be given, for example. However, the interlayer insulating film 705 may be, without limitation, formed using silicon oxide, silicon oxynitride, silicon nitride oxide, aluminum oxide, aluminum oxynitride, gallium oxide, hafnium oxide, yttrium oxide, or the like.

Note that the interlayer insulating film 705 may be formed by a plurality of stacked films. For example, the interlayer insulating film 705 may have a stacked structure in which a silicon oxide film is formed over a silicon nitride film.

In an insulating oxide which contains more oxygen than that in the stoichiometric proportion, part of the oxygen is easily desorbed by heat treatment. The amount of desorbed oxygen (the value converted into that of oxygen atoms) obtained by TDS analysis when part of oxygen is easily desorbed by heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, a measurement method using the TDS analysis is described. The desorption amount of gas in the TDS analysis is proportional to an integral value of a spectrum in the TDS analysis. Thus, the desorption amount of gas can be calculated from the integral value of the spectrum in the TDS analysis of an oxide and a reference value of a standard sample. The reference value of a standard sample refers to the ratio of the density of a predetermined atom contained in a sample (standard sample) to the integral value of a spectrum.

For example, from a spectrum in the TDS analysis of a silicon wafer (standard sample) containing hydrogen at a predetermined density and a spectrum in the TDS analysis of an oxide, the desorption amount ($N_{O2}$) of oxygen molecules ($O_2$) of the oxide can be obtained by the following formula.

$$N_{O2} = \frac{N_{H2}}{S_{H2}} \times S_{O2} \times \alpha$$

$N_{H2}$ is a value obtained by conversion of the number of hydrogen molecules ($H_2$) desorbed from the standard sample into density. $S_{H2}$ is an integral value of a spectrum in a TDS analysis of hydrogen molecules ($H_2$) of the standard sample. In other words, the reference value of the standard sample is $N_{H2}/S_{H2}$. $S_{O2}$ is an integral value of a spectrum in a TDS analysis of oxygen molecules ($O_2$) of the insulating oxide. $\alpha$ is a coefficient affecting the intensity of the spectrum in the TDS analysis. Refer to Japanese Published Patent Application No. H06-275697 for details of the above formula.

Note that the desorption amount of the oxygen obtained by TDS analysis (the value converted into that of oxygen atoms) is measured with use of a silicon wafer containing hydrogen atoms at $1 \times 10^{16}$ atoms/cm$^3$ as the standard sample, by using a thermal desorption spectrometer, EMD-WA1000S/W manufactured by ESCO, Ltd.

Note that in the TDS analysis, oxygen is partly detected as an oxygen atom. The ratio between oxygen molecules and oxygen atoms can be calculated from the ionization rate of the oxygen molecules. Note that, since the coefficient α includes the ionization rate of the oxygen molecules, the number of the released oxygen atoms can also be calculated through the evaluation of the number of the released oxygen molecules.

In addition, $N_{O2}$ is the amount of desorbed oxygen molecules ($O_2$). Therefore, the amount of desorbed oxygen converted into oxygen atoms is twice the number of desorbed oxygen molecules ($O_2$).

The interlayer insulating film 705 is formed by a sputtering method, a CVD method, or the like, preferably a sputtering method. When a silicon oxide film is formed as the interlayer insulating film 705, a quartz (preferably synthesized quartz) target is used as a target and an argon gas is used as a sputtering gas. Alternatively, a silicon target and a gas containing oxygen may be used as a target and a sputtering gas, respectively. As a gas containing oxygen, a mixed gas of an argon gas and an oxygen gas may be used or only an oxygen gas may be used.

After the interlayer insulating film 705 is formed and before an oxide semiconductor film to be processed into the oxide semiconductor layer 711 is formed, first heat treatment is performed. The first heat treatment is a step for removing water and hydrogen contained in the interlayer insulating film 705. Therefore, the temperature of the first heat treatment is preferably higher than or equal to a temperature at which water and hydrogen contained in the interlayer insulating film 705 is desorbed (temperature at which the amount of desorbed water and hydrogen has a peak) and lower than a temperature at which the semiconductor substrate 700 over which the p-channel and n-channel transistors are formed is changed in quality or deformed, for example, lower than the temperature of second heat treatment performed later.

Then, the second heat treatment is performed after the oxide semiconductor film is formed. The second heat treatment is a step for removing water and hydrogen from the oxide semiconductor film, which is mixed therein when the oxide semiconductor film is formed and further is a step for supplying oxygen to the oxide semiconductor film by using the interlayer insulating film 705 as a supply source of oxygen. The second heat treatment is preferably performed at a temperature higher than or equal to 200° C. and lower than the strain point of the semiconductor substrate 700, for example. However, the timing of the second heat treatment is not limited thereto, and may be after the oxide semiconductor film is processed into the oxide semiconductor layer 711. The concentration of hydrogen in the oxide semiconductor film is reduced in this manner, whereby the threshold voltage of the transistor can be prevented from shifting to the negative direction.

As the step for supplying oxygen to the oxide semiconductor film, it is possible to perform an oxygen doping treatment by using oxygen plasma or an oxygen doping treatment by using an ion implantation method. By the oxygen doping treatment by an ion implantation method, oxygen can be excessively contained in the oxide semiconductor film. By the second heat treatment or the oxygen doping treatment after the second heat treatment, variations in electric characteristics of the transistor 710 to be formed can be reduced.

Note that it is preferable that in the second heat treatment, hydrogen, water, a hydroxyl group, hydride, and the like be not contained in a nitrogen gas or a rare gas such as a helium gas, a neon gas, or an argon gas. Alternatively, the purity of a nitrogen gas or a rare gas such as a helium gas, a neon gas, or an argon gas that is introduced into the heat treatment apparatus is preferably higher than or equal to 6N (99.9999%), more preferably higher than or equal to 7N (99.99999%) (that is, the impurity concentration is 1 ppm or lower, preferably 0.1 ppm or lower).

Further, the oxide semiconductor film or the oxide semiconductor layer 711 might have a single crystal structure or a non-single-crystal structure depending on conditions of the second heat treatment or a material of the oxide semiconductor film or the oxide semiconductor layer 711. The non-single-crystal structure includes a microcrystalline structure and a polycrystalline structure. For example, the oxide semiconductor film or the oxide semiconductor layer 711 is a microcrystalline semiconductor layer having a degree of crystallization of 90% or more, or 80% or more. Moreover, the non-single-crystal structure includes an amorphous structure including no crystal region and an amorphous structure including a crystal region. An example of the amorphous structure including a crystal region is an oxide semiconductor layer in which a portion of microcrystals (with a grain diameter of greater than or equal to 1 nm and less than or equal to 20 nm, typically greater than or equal to 2 nm and less than or equal to 4 nm) is mixed into an amorphous structure.

The average surface roughness ($R_a$) of the interlayer insulating film 705 which is a surface over which the oxide semiconductor film is to be formed is preferably less than or equal to 1 nm, preferably less than or equal to 0.3 nm in order to align the crystal orientation when the oxide semiconductor film is crystalline. By increasing the planarity of the interlayer insulating film 705 over which the oxide semiconductor film or the oxide semiconductor layer 711 is to be formed, the oxide semiconductor film or the oxide semiconductor layer 711 can have high surface planarity; thus, a transistor having higher field-effect mobility can be obtained.

In the case of the oxide semiconductor film or the oxide semiconductor layer 711 having an amorphous structure, a flat surface can be obtained relatively easily, so that when a transistor is formed with the use of such an oxide semiconductor film, interface scattering can be reduced, and relatively high field-effect mobility can be obtained relatively easily.

In the case of the oxide semiconductor film or the oxide semiconductor layer 711 having a crystal structure (a single crystal structure, an amorphous structure including a region having crystallinity, a polycrystalline structure, and a microcrystalline structure), defects in the bulk can be further reduced. In that case, when the surface flatness of the oxide semiconductor film or the oxide semiconductor layer 711 is improved, a field-effect mobility higher than that in the case of an oxide semiconductor film having an amorphous structure can be obtained. To increase the planarity of the surface, the oxide semiconductor film is preferably formed over a planar surface (in this embodiment, the interlayer insulating film 705) having an average surface roughness ($R_a$) of 1 nm or less, more preferably 0.3 nm or less, as described above.

Here, the average surface roughness ($R_a$) is obtained by expanding center line average surface roughness ($R_a$) which is defined by JIS B 0601:2001 (ISO 4287:1997) into three dimensions so as to be able to apply $R_a$ to a measurement surface. The average surface roughness ($R_a$) is expressed as an average value of the absolute values of deviations from a reference surface to a specific surface.

Here, the center line average roughness ($R_a$) is shown by the following formula (1) assuming that a portion having a measurement length L is picked up from a roughness curve in the direction of the center line of the roughness curve, the direction of a center line of the roughness curve of the picked portion is represented by an X-axis, the direction of longitudinal magnification (direction perpendicular to the X-axis) is represented by a Y-axis, and the roughness curve is expressed as Y=F(X).

$$R_a = \frac{1}{L}\int_0^L |F(X)| dX \quad (1)$$

When the measurement surface which is a surface represented by measurement data is expressed as Z=F(X, Y), the average surface roughness ($R_a$) is an average value of the absolute values of deviations from the reference surface to the specific surface and is shown by the following formula (2).

$$R_a = \frac{1}{S_0}\int_{Y_1}^{Y_2}\int_{X_1}^{X_2} |F(X, Y) - Z_0| dX\, dY \quad (2)$$

Here, the specific surface is a surface which is a target of roughness measurement, and is a rectangular region which is surrounded by four points represented by the coordinates ($X_1$, $Y_1$), ($X_1$, $Y_2$), ($X_2$, $Y_1$), and ($X_2$, $Y_2$). $S_0$ represents the area of the specific surface when the specific surface is flat ideally.

In addition, the reference surface refers to a surface parallel to an X-Y surface at the average height of the specific surface. In short, when the average value of the height of the specific surface is denoted by $Z_0$, the height of the reference surface is also denoted by $Z_0$.

The average surface roughness ($R_a$) can be measured using an atomic force microscope (AFM).

To make the average surface roughness of the interlayer insulating film 705 less than or equal to 1 nm, preferably less than or equal to 0.3 nm, as described above, chemical mechanical polishing (CMP) treatment is performed. The CMP treatment is performed before the oxide semiconductor film is formed, preferably before the first heat treatment.

Here, the CMP treatment is performed once or plural times. When the CMP treatment is performed plural times, first polishing is preferably performed with a high polishing rate followed by final polishing with a low polishing rate.

To planarize the interlayer insulating film 705, a plasma treatment or the like may be performed instead of the CMP treatment. A rare gas may be used in the plasma treatment. By the plasma treatment, ions of an inert gas are sputtered onto a process surface so as to planarize minute unevenness on the process surface by the sputtering effect. Such a plasma treatment is also called reverse sputtering.

One or more of the above treatments may be performed in order to planarize the interlayer insulating film 705. For example, only the reverse sputtering may be performed, or the CMP treatment and then the dry etching may be performed. Note that it is preferable to perform the dry etching or the reverse sputtering in order to prevent the entrance of water into the interlayer insulating film 705 over which the oxide semiconductor film is to be formed. In particular, when a planarization treatment is performed after the first heat treatment, the dry etching or the reverse sputtering is preferably performed.

The oxide semiconductor layer 711 may be selectively formed, for example, in a manner such that an oxide semiconductor film is formed, an etching mask is formed thereover, and then etching is performed. Alternatively, an inkjet method or the like may be used.

For the oxide semiconductor film, it is possible to use a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide. Alternatively, it is possible to use a three-component metal oxide such as an In—Ga—Zn-based metal oxide, an In—Al—Zn-based metal oxide, an In—Sn—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, or a Sn—Ga—Zn-based metal oxide. Further alternatively, it is possible to use a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide. It is also possible to use indium oxide, tin oxide, zinc oxide, or the like. Note that an n-component metal oxide includes n kinds of metal oxides. For example, an In—Ga—Zn-based metal oxide means an oxide containing indium (In), gallium (Ga), and zinc (Zn), and there is no particular limitation on the composition ratio thereof. The In—Ga—Zn-based metal oxide may contain a metal element other than the In, Ga, and Zn.

Alternatively, a metal oxide material expressed by $InMO_3(ZnO)_m$ (m>0 is satisfied, and m is not an integer) may be used for the oxide semiconductor film. Note that M represents one or more metal elements selected from Ga, Fe, Mn, and Co. Still alternatively, a metal oxide material represented by $In_3SnO_5(ZnO)_n$ (n>0 is satisfied, and n is an integer) may be used for the oxide semiconductor film.

For example, it is possible to use an In—Ga—Zn-based metal oxide with an atomic ratio of In:Ga:Zn=1:1:1 (=1/3:1/3:1/3) or In:Ga:Zn=2:2:1 (=2/5:2/5:1/5), or any of metal oxides whose composition is in the neighborhood of the above compositions. Alternatively, it is possible to use an In—Sn—Zn-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of metal oxides whose composition is in the neighborhood of the above compositions.

However, without limitation to the materials given above, a material with an appropriate composition may be used depending on needed semiconductor characteristics (e.g., field-effect mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high field-effect mobility can be obtained relatively easily in the case where the In—Sn—Zn-based metal oxide is used. However, the field-effect mobility can be increased by reducing the defect density in the bulk also in the case where the In—Ga—Zn-based metal oxide (also can be referred to as IGZO) is used.

Note that for example, the expression "the composition of a metal oxide including In, Ga, and Zn at the atomic ratio, In:Ga:Zn=a:b:c (a+b+c=1), is in the neighborhood of the composition of a metal oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. This relation is satisfied with the other metal oxides.

Note that it is preferable that oxygen be excessively contained in the metal oxide as compared to oxygen in the stoichiometric proportion. When oxygen is excessively contained, generation of carriers due to oxygen deficiency in the oxide semiconductor film to be formed can be prevented.

Note that the energy gap of a metal oxide which can be applied to the oxide semiconductor film is preferably 2 eV or more, more preferably 2.5 eV or more, still more preferably 3 eV or more. In this manner, the off-state current of a transistor can be reduced by using a metal oxide having a wide band gap.

Note that the oxide semiconductor film contains hydrogen. Note that the hydrogen may be contained in the oxide semiconductor film in the form of a hydrogen molecule, water, a hydroxyl group, or hydride in some cases, in addition to a hydrogen atom. It is preferable that hydrogen contained in the oxide semiconductor film be as little as possible.

Note that the concentrations of an alkali metal and an alkaline earth metal in the oxide semiconductor film are preferably low, and these concentrations are preferably $1 \times 10^{18}$ atoms/cm$^3$ or lower, more preferably $2 \times 10^{16}$ atoms/cm$^3$ or lower. When an alkali metal and an alkaline earth metal are bonded to an oxide semiconductor, carriers may be generated, which causes an increase in the off-state current of the transistor.

Note that there is no particular limitation on the formation method and the thickness of the oxide semiconductor film, and they can be determined in consideration of the size or the like of a transistor to be manufactured. The formation method of the oxide semiconductor film may be, for example, a sputtering method, a coating method, a printing method, a molecular beam epitaxy method, a pulsed laser deposition method, or the like. The thickness of the oxide semiconductor film may be greater than or equal to 3 nm and less than or equal to 50 nm. This is because the transistor might be normally on when the oxide semiconductor film has a large thickness of 50 nm or more. Further, when the channel length of the transistor is 30 μm, the thickness of the oxide semiconductor film is set to less than or equal to 5 nm to prevent a short channel effect.

For example, in the case where the oxide semiconductor film is formed using an In—Zn-based metal oxide by a sputtering method, a target has a composition ratio where In/Zn is 1 to 100, preferably 1 to 20, more preferably 1 to 10 in an atomic ratio. The atomic ratio of Zn is in the above preferred range, whereby the field-effect mobility can be improved. Here, when the atomic ratio of the compound is In:Zn:O=X:Y:Z, it is preferable to satisfy the relation of Z>1.5X+Y so that excessive oxygen is contained.

In the case where the oxide semiconductor film is formed using an In—Sn—Zn-based metal oxide by a sputtering method, a target has a composition ratio of In:Sn:Zn=1:2:2, 2:1:3, 1:1:1, or 20:45:35 in an atomic ratio. It is preferable that the In—Sn—Zn-based metal oxide also contain excessive oxygen.

In this embodiment, as a preferable example, the oxide semiconductor film is formed by a sputtering method using an In—Ga—Zn-based metal oxide target. A rare gas (for example, argon), an oxygen gas, or a mixed gas of a rare gas and an oxygen gas may be used as a sputtering gas.

As the In—Ga—Zn-based metal oxide target, for example, it is preferable to use a target having an atomic ratio of In:Ga:Zn=1:1:1, 4:2:3, 3:1:2, 1:1:2, 2:1:3, or 3:1:4. It is preferable that the IGZO also contain excessive oxygen.

A high-purity gas in which hydrogen, water, a hydroxyl group, hydride, or the like is removed is preferably used as the sputtering gas for the formation of the oxide semiconductor film. To make the sputtering gas a high-purity gas, a gas attached to an inner wall or the like of a treatment chamber is removed and the semiconductor substrate 700 over which the p-channel and n-channel transistors are formed is subjected to heat treatment before the oxide semiconductor film is formed. In addition, a high-purity sputtering gas may be introduced to the treatment chamber. In that case, the purity of an argon gas may be higher than or equal to 9N (99.9999999%), the dew point thereof may be −121° C. or lower, the concentration of water may be 0.1 ppb, and the concentration of hydrogen may be 0.5 ppb. The purity of an oxygen gas is higher than or equal to 8N (99.999999%), the dew point is −112° C. or lower, and the concentrations of water and hydrogen are each 1 ppb. The oxide semiconductor film is formed in a state where the semiconductor substrate 700 over which the p-channel and n-channel transistors are formed is kept at high temperature, whereby the impurity concentration in the oxide semiconductor film can be reduced. Here, the temperature of the semiconductor substrate 700 over which the p-channel and n-channel transistors are formed is higher than or equal to 150° C., preferably higher than or equal to 200° C., more preferably higher than or equal to 400° C. Note that damage in the oxide semiconductor film caused by a sputtering method can be reduced.

In the case where the oxide semiconductor film has a crystalline structure, a c-axis aligned crystalline oxide semiconductor (CAAC-OS) film is preferably used. When the oxide semiconductor film is a CAAC-OS film, the reliability of the transistor can be increased.

Note that a CAAC-OS film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis varies in the a-b plane (or the surface, or at the interface) (the crystal rotates around the c-axis).

In a broad sense, the CAAC-OS film means a non-single-crystal oxide semiconductor film including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

The CAAC-OS film is not a single crystal, but this does not mean that the CAAC-OS film is composed of only an amorphous component. Although the CAAC-OS film includes a crystalline region (a crystal region), a boundary between one crystal region and another crystal region is not clear in some cases.

Nitrogen may be substituted for part of oxygen included in the CAAC-OS film. The c-axes of individual crystal region included in the CAAC-OS film may be aligned in one direction (e.g., a direction perpendicular to a surface of a substrate over which the CAAC-OS film is formed, or a surface, a film surface, or an interface of the CAAC-OS film). Alternatively, normals to the a-b planes of individual crystal regions included in the CAAC-OS film may be aligned in one direction (e.g., a direction perpendicular to the surface of the substrate, or the surface, the film surface, or the interface of the CAAC-OS film).

The CAAC-OS film may be a conductor, a semiconductor, or an insulator depending on its composition or the like. Further, the CAAC-OS film may transmit or not transmit visible light depending on its composition or the like.

As an example of such a CAAC-OS film, there is a material which is formed into a film shape and has a triangular or hexagonal atomic arrangement when observed from the direction perpendicular to a surface of the film or, a surface of a substrate, or an interface and in which metal atoms are arranged in a layered manner or metal atoms and oxygen atoms (or nitrogen atoms) are arranged in a layered manner when a cross section of the film is observed.

An example of a crystal structure included in the CAAC-OS film is described in detail. In the description below, in principle, the upward direction corresponds to the c-axis direction and a plane perpendicular to the c-axis direction corresponds to the a-b plane in FIGS. 9A to 9E, FIGS. 10A to 10C, and FIGS. 11A to 11C. When the expressions "an upper half" and "a lower half" are simply used, they refer to an upper half above the a-b plane and a lower half below the a-b plane. Furthermore, in FIGS. 9A to 9E, O surrounded by a circle represents a tetracoordinate O atom, and a double circle represents a tricoordinate O atom.

Figure 9A:
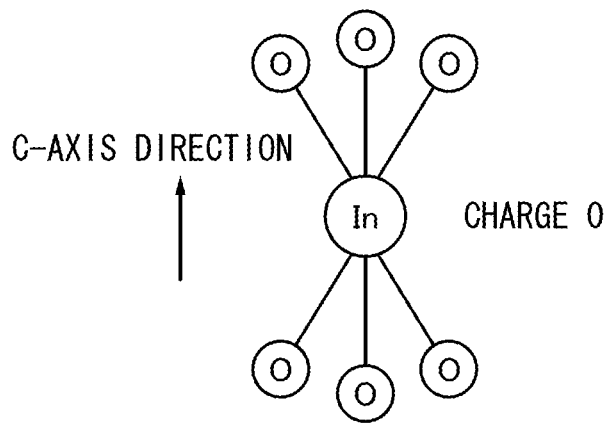
FIGS. 9A to 9E illustrate a crystal structure of a metal oxide according to one embodiment of the present invention.

FIG. 9A illustrates a structure including one hexacoordinate indium (hereinafter referred to as In) atom and six tetracoordinate oxygen (hereinafter referred to as tetracoordinate O) atoms proximate to the In atom. Here, a structure including one metal atom and oxygen atoms proximate thereto is referred to as small group. The structure in FIG. 9A is actually an octahedral structure, but is illustrated as a planar structure for simplicity. Note that three tetracoordinate O atoms exist in each of an upper half and a lower half in FIG. 9A. In the small group illustrated in FIG. 9A, electric charge is 0.

Figure 9D:
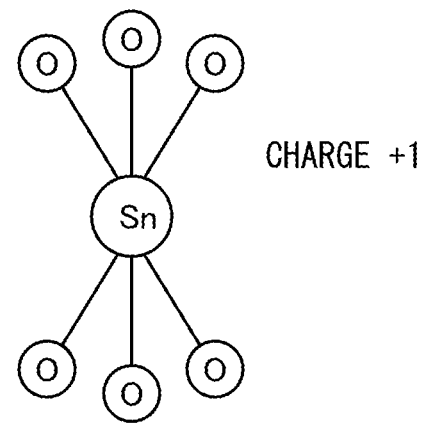
Figure 9B:
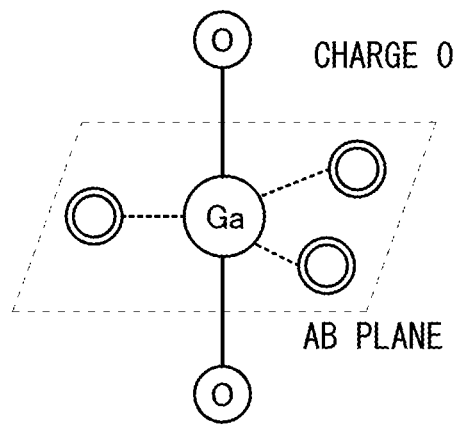

FIG. 9B illustrates a structure including one pentacoordinate gallium (hereinafter referred to as Ga) atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 9B. An In atom can also have the structure illustrated in FIG. 9B because an In atom can have five ligands. In the small group illustrated in FIG. 9B, electric charge is 0.

Figure 9E:
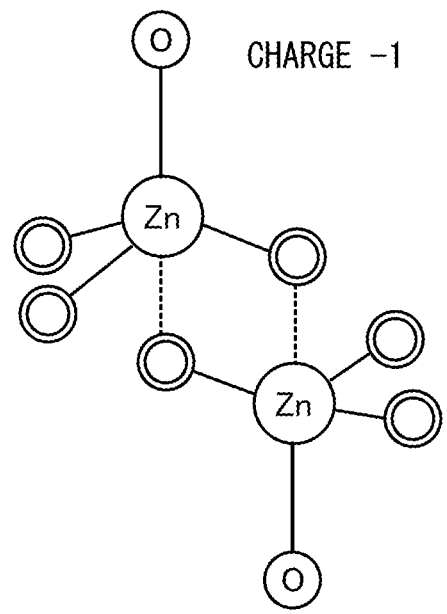
Figure 9C:
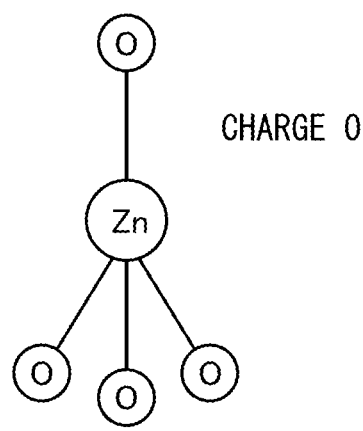

FIG. 9C illustrates a structure including one tetracoordinate zinc (hereinafter referred to as Zn) atom and four tetracoordinate O atoms proximate to the Zn atom. In FIG. 9C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 9C. In the small group illustrated in FIG. 9C, electric charge is 0.

FIG. 9D illustrates a structure including one hexacoordinate Sn atom and six tetracoordinate O atoms proximate to the Sn atom. In FIG. 9D, three tetracoordinate O atoms exist in each of an upper half and a lower half In the small group illustrated in FIG. 9D, electric charge is +1.

FIG. 9E illustrates a small group including two Zn atoms. In FIG. 9E, one tetracoordinate O atom exists in each of an upper half and a lower half. In the small group illustrated in FIG. 9E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 9A each have three proximate In atoms in the downward direction, and the three O atoms in the lower half each have three proximate In atoms in the upward direction. The one O atom in the upper half with respect to the pentacoordinate Ga atom in FIG. 9B has one proximate Ga atom in the downward direction, and the one O atom in the lower half has one proximate Ga atom in the upward direction. The one O atom in the upper half with respect to the tetracoordinate Zn atom in FIG. 9C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the upper half, it is bonded to tetracoordinate O atoms in the upper half of the pentacoordinate metal (Ga or In) atom, tetracoordinate O atoms in the lower half of the pentacoordinate metal (Ga or In) atom, or tetracoordinate O atoms in the upper half of the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 10A:
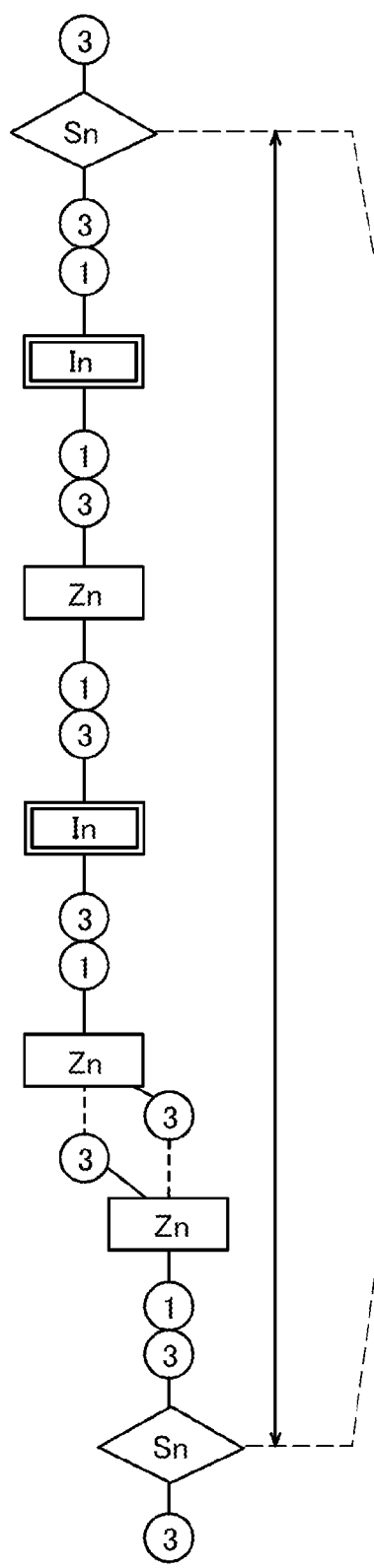
FIGS. 10A to 10C illustrate a crystal structure of a metal oxide according to one embodiment of the present invention.
Figure 10B:
Figure 10C:

FIG. 10A illustrates a model of a medium group included in a layered structure of an In—Sn—Zn-based metal oxide. FIG. 10B illustrates a large group including three medium groups. Note that FIG. 10C illustrates an atomic arrangement in the case where the layered structure in FIG. 10B is observed from the c-axis direction.

In FIG. 10A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 10A, one tetracoordinate O atom existing in each of an upper half and a lower half with respect to an In atom is denoted by circled 1. FIG. 10A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based metal oxide in FIG. 10A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 9E can be given. For example, with one small group including two Zn atoms, electric charge of one small group including a Sn atom can be cancelled, so that the total electric charge of the layered structure can be 0.

When the large group illustrated in FIG. 10B is repeated, an In—Sn—Zn-based metal oxide crystal ($In_2SnZn_3O_8$) can be obtained. Note that a layered structure of the obtained In—Sn—Zn-based metal oxide can be expressed as a composition formula, $In_2SnZn_2O_7(ZnO)_m$ (m is 0 or a natural number).

The above-described rule also applies to the following oxides: the above-described four-component metal oxides, three-component metal oxides, or two-component metal oxides.

Figure 11A:
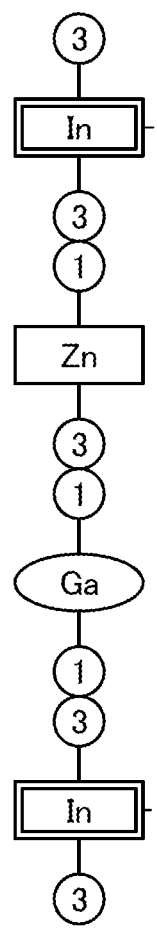
FIGS. 11A to 11C illustrate a crystal structure of a metal oxide according to one embodiment of the present invention.

FIG. 11A illustrates a model of a medium group included in a layered structure of an In—Ga—Zn-based metal oxide.

In the medium group included in the layered structure of the In—Ga—Zn-based metal oxide in FIG. 11A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 11B:
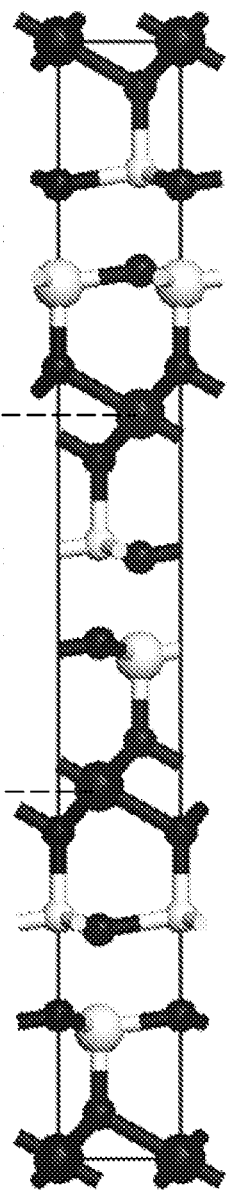
Figure 11C:
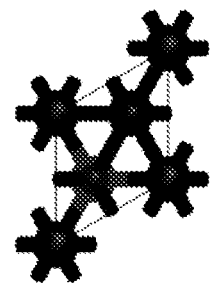

FIG. 11B illustrates a large group including three medium groups. Note that FIG. 11C illustrates an atomic arrangement in the case where the layered structure in FIG. 11B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based metal oxide, a large group can be formed using not only the medium group illustrated in FIG. 11A but also a medium group in which the arrangement of the In atom, the Ga atom, and the Zn atom is different from that in FIG. 11A.

When the large group illustrated in FIG. 11B is repeated, an In—Ga—Zn-based metal oxide crystal can be obtained. Note that a layered structure of the obtained In—Ga—Zn-based metal oxide can be expressed as a composition formula, $InGaO_3(ZnO)_n$ (n is a natural number).

Figure 12A:
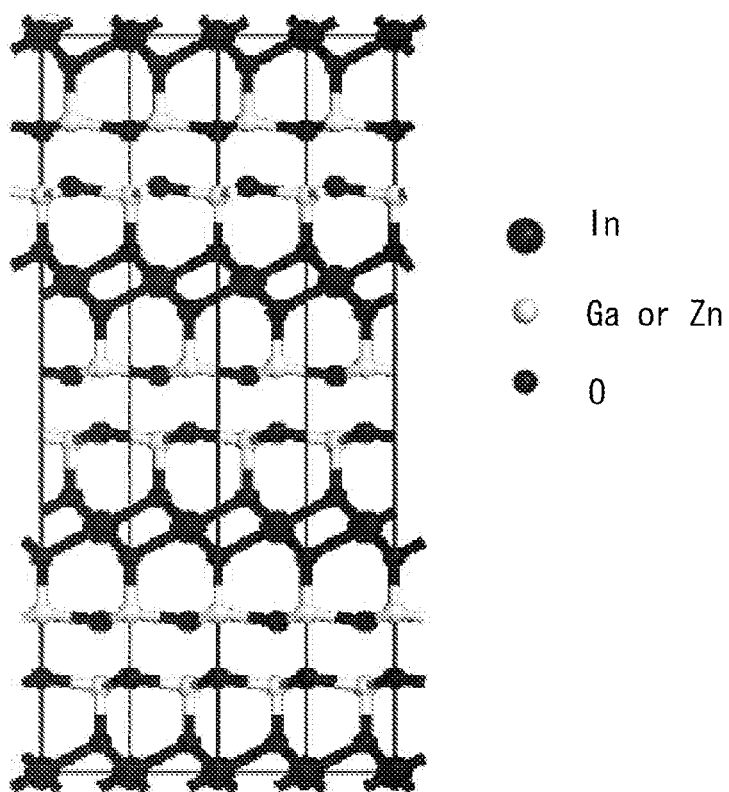
FIGS. 12A and 12B each illustrate a crystal structure of a metal oxide according to one embodiment of the present invention.

In the case where n=1 ($InGaZnO_4$), a crystal structure illustrated in FIG. 12A can be obtained, for example. Note that in the crystal structure in FIG. 12A, since a Ga atom and an In atom each have five ligands as described in FIG. 9B, a structure in which Ga is replaced with In can be obtained.

Figure 12B:
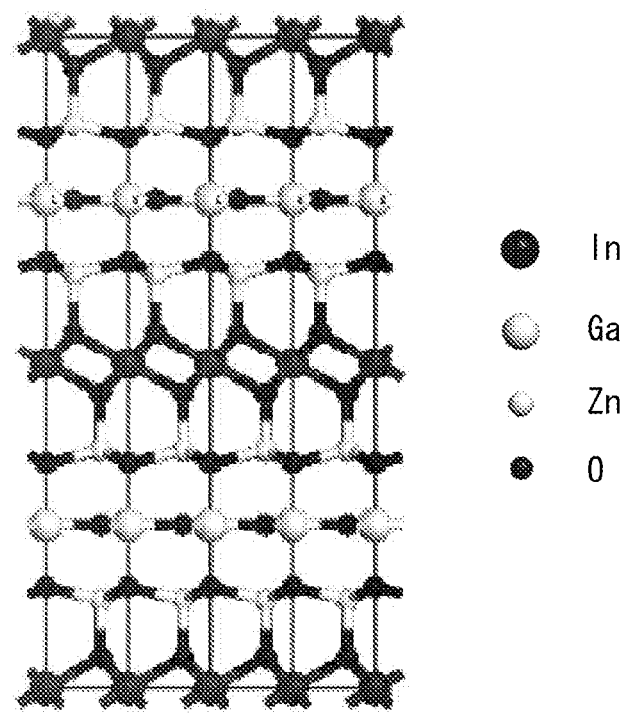

In the case where n=2 ($InGaZn_2O_5$), a crystal structure illustrated in FIG. 12B can be obtained, for example. Note that in the crystal structure in FIG. 12B, since a Ga atom and an In atom each have five ligands as described with FIG. 9B, a structure in which Ga is replaced with In can be obtained.

Here, a method for forming the CAAC-OS film is described.

First, an oxide semiconductor film is formed by a sputtering method, a molecular beam epitaxy method, an atomic layer deposition method, a pulsed laser deposition method, or the like. Note that by forming an oxide semiconductor film while keeping the semiconductor substrate 700 at high temperature, the ratio of a crystal region to an amorphous region can be high. At this time, the temperature of the semiconductor substrate 700 is, for example, higher than or equal to 150° C. and lower than or equal to 700° C., preferably higher than or equal to 150° C. and lower than or equal to 450° C., more preferably higher than or equal to 200° C. and lower than or equal to 350° C.

Here, the formed oxide semiconductor film may be subjected to heat treatment. By the heat treatment, the ratio of the crystal region to the amorphous portion can be higher. In this heat treatment, the temperature applied to the semiconductor substrate 700 over which the p-channel and n-channel transistors are provided is, for example, higher than or equal to 200° C. and lower than a temperature at which the semiconductor substrate 700 over which the p-channel or n-channel transistor is formed is changed in quality or deformed, for example, higher than or equal to 150° C., preferably higher than or equal to 200° C., more preferably higher than or equal to 400° C. The heat treatment is performed for longer than or equal to 3 minutes, preferably for longer than or equal to 3 minutes and shorter than or equal to 24 hours. When the time for the heat treatment is increased, the ratio of the crystal region to the amorphous region can be made higher; however, the productivity is decreased. Note that the heat treatment may be performed in, without limitation, an oxidizing atmosphere or an inert atmosphere. This heat treatment may be performed under a reduced pressure.

The oxidizing atmosphere is an atmosphere containing an oxidizing gas. Examples of the oxidizing gas include oxygen, ozone, nitrous oxide, and the like. It is preferable that components (e.g., water and hydrogen) which are not preferably contained in the oxide semiconductor film be removed from the oxidizing atmosphere as much as possible. For example, the purity of oxygen, ozone, or nitrous oxide is higher than or equal to 8N (99.999999%), preferably higher than or equal to 9N (99.9999999%).

The oxidizing atmosphere may contain an inert gas such as a rare gas. Note that the oxidizing atmosphere contains an oxidizing gas at a concentration of higher than or equal to 10 ppm.

Note that an inert atmosphere contains an inert gas (e.g., a nitrogen gas or a rare gas) and contains a reactive gas such as an oxidizing gas at a concentration of less than 10 ppm.

Note that a rapid thermal anneal (RTA) apparatus may be used for all the heat treatments. With the use of the RTA apparatus, only in a short time, the heat treatments can be performed at higher temperature. Thus, the oxide semiconductor film can have a higher ratio of the crystal region to the amorphous region and the productivity can be prevented from decreasing.

However, the apparatus used for all the heat treatments is not limited to the RTA apparatus; for example, an apparatus provided with a unit that heats an object to be processed by thermal conduction or thermal radiation from a resistance heater or the like may be used. Examples of the heat treatment apparatus used for all the heat treatments include an electric furnace and a rapid thermal anneal (RTA) apparatus such as a gas rapid thermal anneal (GRTA) apparatus or a lamp rapid thermal anneal (LRTA) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

With the use of an In—Ga—Zn-based metal oxide in which the nitrogen concentration is higher than or equal to $1 \times 10^{17}$ atoms/cm$^3$ and lower than or equal to $5 \times 10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

The CAAC-OS film can be formed in the above manner.

The CAAC-OS film has high orderliness of a bond between metal and oxygen as compared to an oxide semiconductor film having an amorphous structure. In other words, in an oxide semiconductor film having an amorphous structure, the number of oxygen atoms coordinating to a metal atom may vary according to the kind of an adjacent metal, whereas in the CAAC-OS film, the number of oxygen atoms coordinating to a metal atom is substantially the same. Therefore, oxygen deficiency is hardly observed even at a microscopic level, and charge transfer and instability of electric conductivity due to hydrogen atoms (including hydrogen ions), alkali metal atoms, or the like can be prevented.

Therefore, when a transistor has a channel formation region formed using a CAAC oxide semiconductor film, it is possible to suppress the shift of the threshold voltage of the transistor which occurs through light irradiation or a bias-temperature stress (BT) test on the transistor, so that the transistor can have stable electrical characteristics.

Figure 8A:
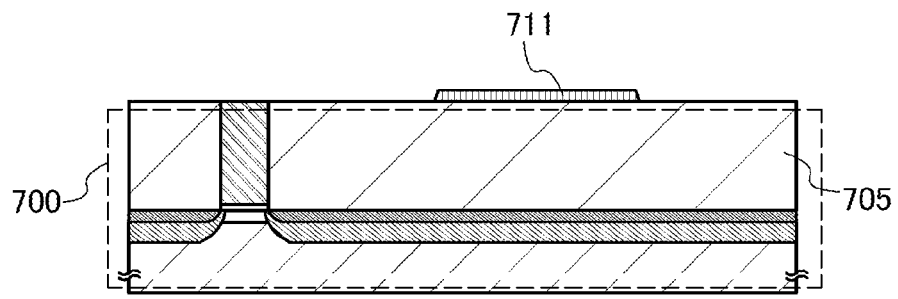
FIGS. 8A to 8D are cross-sectional views illustrating a method for manufacturing a transistor according to one embodiment of the present invention.

Next, an etching mask is formed over the oxide semiconductor film and etching is performed, so that the oxide semiconductor layer 711 is formed (see FIG. 8A).

Figure 8B:
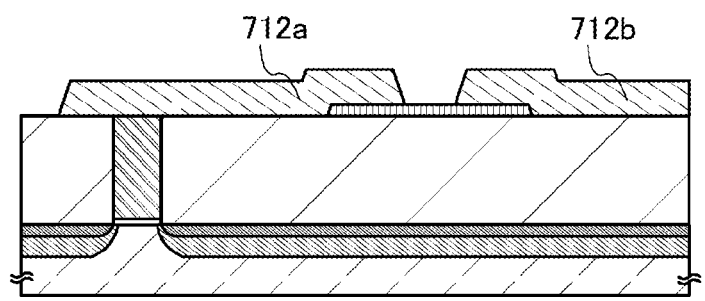

Then, the source electrode 712a and the drain electrode 712b are formed separately from each other and in contact with the oxide semiconductor layer 711 (see FIG. 8B).

The source electrode 712a and the drain electrode 712b is selectively formed in a manner such that, for example, a conductive film (e.g., a metal film or a silicon film to which an impurity element imparting one conductivity type is added) is formed by a sputtering method, an etching mask is formed over the conductive film, and etching is performed. Alternatively, an ink-jet method may be used. Note that the conductive film to be the source electrode 712a and the drain electrode 712b may be formed with a single layer or a plurality of stacked layers. For example, the conductive film may have a three-layer structure in which an Al layer is sandwiched between Ti layers. Note that the source electrode 712a and the drain electrode 712b also serve as signal lines.

Figure 8C:
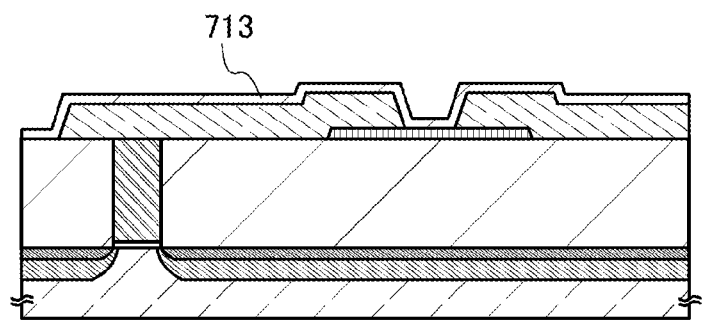

Next, the gate insulating film 713 is formed over at least the channel formation region of the oxide semiconductor layer 711 (see FIG. 8C).

The gate insulating film 713 is formed by, for example, a sputtering method using an insulating material (e.g., silicon nitride, silicon nitride oxide, silicon oxynitride, or silicon oxide). Note that the gate insulating film 713 may be formed with a single layer or a plurality of stacked layers. Here, for example, a two-layer structure in which a silicon oxynitride layer is stacked over a silicon nitride layer is employed. Note that in the case where the gate insulating film 713 is formed by a sputtering method, hydrogen and moisture can be prevented from entering the oxide semiconductor layer 711. Further, the gate insulating film 713 is preferably an insulating oxide film because oxygen can be supplied to compensate for oxygen vacancies.

Note that "silicon nitride oxide" contains more nitrogen than oxygen. Further, "silicon oxynitride" contains more oxygen than nitrogen.

Here, the oxide semiconductor film may be processed by dry etching. For example, a chlorine gas or a mixed gas of a boron trichloride gas and a chlorine gas may be used as an etching gas used for the dry etching. However, there is no limitation thereto; wet etching may be used or another method capable of processing the oxide semiconductor film may be used.

The gate insulating film 713 contains oxygen at least in a portion in contact with the oxide semiconductor layer 711 and is preferably formed using an insulating oxide in which part of the oxygen is desorbed by heat treatment. In other words, any of the materials given as the material of the interlayer insulating film 705 is preferably used. When the portion of the gate insulating film 713, which is in contact with the oxide semiconductor layer 711, is formed using silicon oxide, oxygen can be supplied to the oxide semiconductor layer 711 and reduction in the resistance of the transistor can be prevented.

Note that when the gate insulating film 713 is formed using a high-k material such as hafnium silicate (HfSiO$_x$ (x>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), hafnium oxide, yttrium oxide, or lanthanum oxide, gate leakage current can be reduced. Here, gate leakage current refers to leakage current which flows between a gate electrode and a source or drain electrode. Further, a layer formed using the high-k material and a layer formed using any of silicon oxide, silicon oxynitride, silicon nitride, silicon nitride oxide, aluminum oxide, aluminum oxynitride, and gallium oxide may be stacked. Note that even when the gate insulating film 713 has a stacked structure, the portion in contact with the oxide semiconductor layer 711 is preferably formed using the above insulating oxide. Further, in order not to release oxygen from the oxide semiconductor layer 711, aluminum oxide or the like which hardly permeate oxygen is preferably formed over the insulating oxide. For example, as the gate insulating film 713, silicon oxide deposited by a sputtering method, aluminum oxide deposited by a sputtering method, and silicon oxynitride may be stacked in that order.

The thickness of the gate insulating film 713 is greater than or equal to 1 nm and less than or equal to 300 nm, preferably greater than or equal to 5 nm and less than or equal to 50 nm. When the thickness of the gate insulating film 713 is greater than or equal to 5 nm, the gate leakage current can be particularly reduced.

Here, a third heat treatment (preferably at a temperature higher than or equal to 200° C. and lower than or equal to 400° C., for example, higher than or equal to 250° C. and lower than or equal to 350° C.) may be further performed in an inert gas atmosphere or an oxygen gas atmosphere. Note that the third heat treatment can be performed under the same conditions as the second heat treatment, for example, at higher than or equal to 200° C. and lower than the strain point of the semiconductor substrate 700, preferably higher than or equal to 200° C. and lower than or equal to 400° C., more preferably higher than or equal to 250° C. and lower than or equal to 350° C. By the third heat treatment, hydrogen or moisture remaining in the oxide semiconductor layer 711 can be diffused into the gate insulating film. Further, oxygen can be supplied to the oxide semiconductor layer 711 by the third heat treatment in which the gate insulating film 713 serves as a supply source.

The third heat treatment may be performed not only after the gate insulating film 713 is formed over the oxide semiconductor layer 711 but also after the gate electrode 714 or a conductive film to be the gate electrode 714 is formed.

Here, the hydrogen concentration in the oxide semiconductor layer 711 is lower than or equal to $5.0 \times 10^{19}$ atoms/cm$^3$, preferably lower than or equal to $5.0 \times 10^{18}$ atoms/cm$^3$.

Figure 8D:
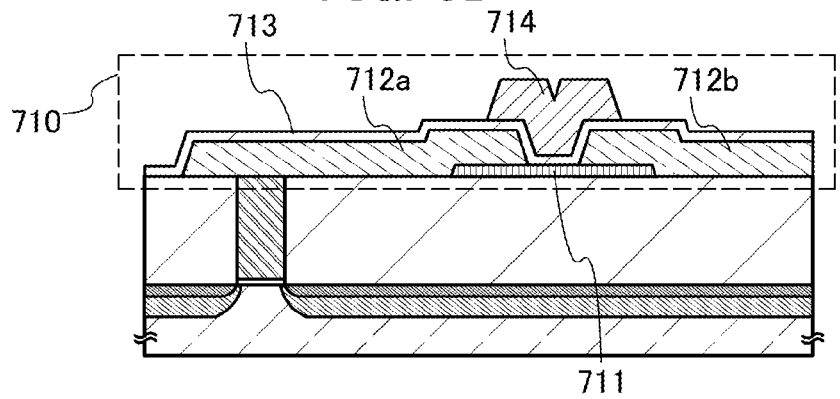

Next, a conductive film is formed over the gate insulating film 713, an etching mask is formed over the conductive film, and etching is performed, so that the gate electrode 714 is formed (see FIG. 8D). Note that the gate electrode 714 serves at least as a scan line.

The gate electrode 714 is formed using the same material and method as the source electrode 712a and the drain electrode 712b.

Although not illustrated, a dopant is preferably added to the oxide semiconductor layer 711 by using the gate electrode 714 as a mask, so that a source region and a drain region are formed in the oxide semiconductor layer 711. Note that, here, the dopant may be added by an ion implantation method or an ion doping method. Alternatively, the dopant may be added by performing plasma treatment in an atmosphere of a gas containing the dopant. As the added dopant, nitrogen, phosphorus, boron, or the like may be used.

Note that in the case where the etching mask is formed using a resist material, the etching mask may be removed only by ashing.

Although not illustrated, a protective insulating film may be formed to cover the transistor 710. When the protective insulating film is a single layer, an insulating film that hardly permeates oxygen, hydrogen, and water, such as an aluminum oxide film, is formed. When the protective insulating film is a stacked layer, an insulating oxide film in which the oxygen proportion is higher than that in the stoichiometric proportion and which releases part of the oxygen by heat treatment and an insulating film that hardly permeates oxygen, hydrogen, and water are preferably formed. For example, a stack of the insulating oxide film exemplified for the interlayer insulating film 705 and an aluminum oxide film is formed. Note that by using the aluminum oxide film as the protective insulating film, oxygen in the oxide semiconductor layer 711 can be prevented from being released outside and hydrogen and water can be prevented from entering from the outside to the oxide semiconductor layer 711; thus, the electric characteristics of the transistor 710 can be made favorable.

After the formation of the protective insulating film, heat treatment similar to the second or third heat treatment may be performed.

In the above manner, the transistor whose channel formation region is formed in the oxide semiconductor layer can be formed over the transistor provided over the semiconductor substrate, which is illustrated in FIG. 7.

The transistor formed in the above manner can have an off-state current value per micrometer of a channel width, which is lower than or equal to 10 aA/μm ($1 \times 10^{-17}$ A/μm), 1 aA/μm ($1 \times 10^{-18}$ A/μm), 1 zA/μm ($1 \times 10^{-21}$ A/μm), or 1 yA/μm ($1 \times 10^{-24}$ A/μm) at room temperature.

In either or both the scan line and the signal line, copper is preferably used to form a conductive layer for forming the scan line and the signal line because the wiring can have lower resistance.

Further, the transistor described as the transistor whose channel formation region is formed in the oxide semiconductor layer is an example; therefore, a transistor whose channel formation region is formed in an oxide semiconductor layer can have a variety of modes without limitation to the above transistor.

An example of a transistor in which an In—Sn—Zn—O film is used as an oxide semiconductor film will be described with reference to FIGS. 13A and 13B. In this embodiment, an In—Sn—Zn—O film refers to a film formed using an In—Sn—Zn-based metal oxide.

Figure 13A:
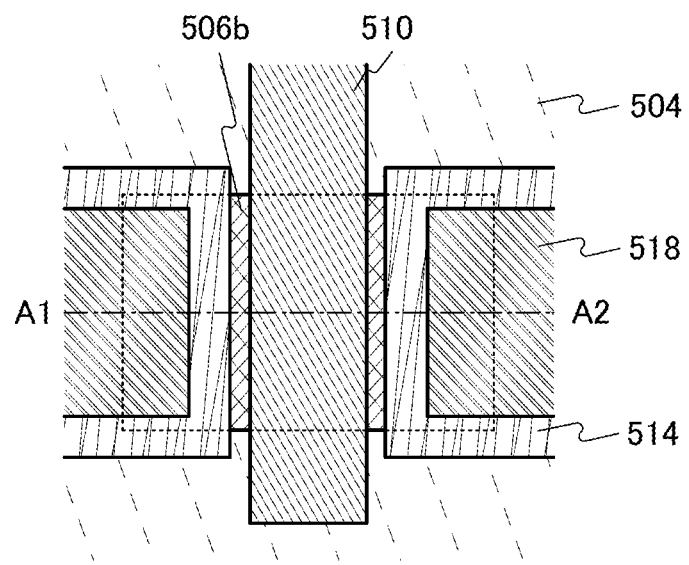
FIGS. 13A and 13B are a top view and a cross-sectional view illustrating a transistor according to one embodiment of the present invention.
Figure 13B:
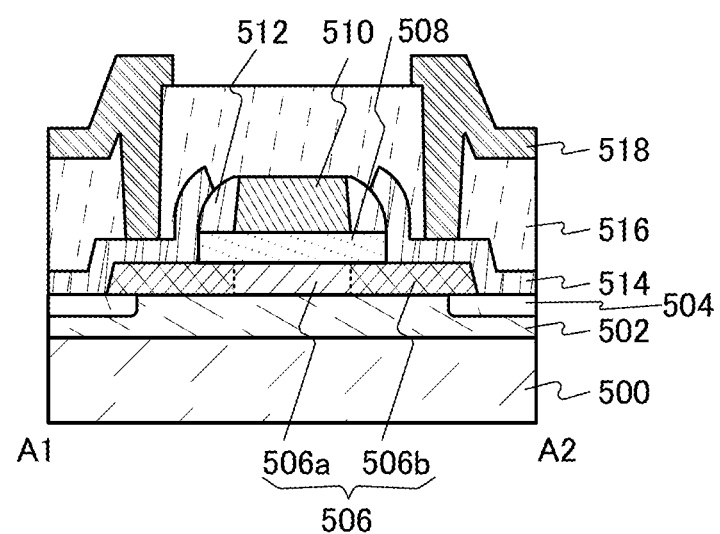

FIGS. 13A and 13B are a top view and a cross-sectional view of a coplanar transistor having a top-gate top-contact structure. FIG. 13A is the top view of the transistor. FIG. 13B illustrates cross section A1-A2 along dashed-dotted line A1-A2 in FIG. 13A.

The transistor illustrated in FIG. 13B includes a substrate 500; a base insulating film 502 provided over the substrate 500; a protective insulating film 504 provided in the periphery of the base insulating film 502; an oxide semiconductor film 506 which is provided over the base insulating film 502 and the protective insulating film 504 and which includes a high-resistance region 506a and low-resistance regions 506b; a gate insulating film 508 provided over the oxide semiconductor film 506; a gate electrode 510 provided to overlap with the oxide semiconductor film 506 with the gate insulating film 508 provided therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

The substrate 500 corresponds to the semiconductor substrate 700. The base insulating film 502 corresponding to the interlayer insulating film 705 is formed using a silicon oxide film. The oxide semiconductor film 506 corresponding to the oxide semiconductor layer 711 is formed using an In—Sn—Zn—O film. The pair of electrodes 514 corresponding to the source electrode 712a and the drain electrode 712b is formed using a tungsten film. The gate insulating film 508 corresponding to the gate insulating film 713 is formed using a silicon oxide film. The gate electrode 510 corresponding to the gate electrode 714 has a stacked structure of a tantalum nitride film and a tungsten film. The interlayer insulating film 516 has a stacked structure of a silicon oxynitride film and a polyimide film. The wiring 518 has a stacked structure in which a titanium film, an aluminum film, and a titanium film are formed in this order. For the method for manufacturing the transistor, the description of this embodiment can be referred to, as appropriate.

Although not illustrated, a protective film may be provided to cover the interlayer insulating film 516 and the wiring 518. With the protective film, a minute amount of leakage current generated by surface conduction of the interlayer insulating film 516 can be reduced and thus the off-state current of the transistor can be reduced.

Another example of a transistor in which an In—Sn—Zn—O film is used as an oxide semiconductor film will be described below.

Figure 14A:
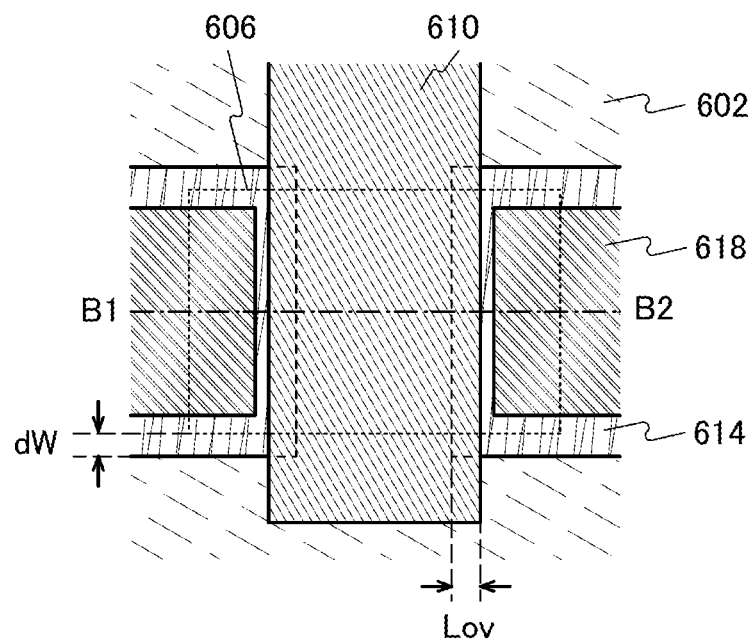
FIGS. 14A and 14B are a top view and a cross-sectional view illustrating a transistor according to one embodiment of the present invention.
Figure 14B:
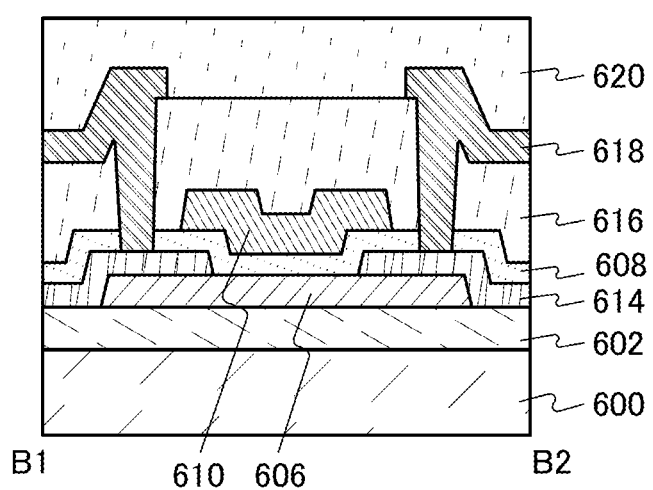

FIG. 14A is the top view of the transistor. FIG. 14B is a cross-sectional view along dashed-dotted line B1-B2 in FIG. 14A.

The transistor illustrated in FIG. 14B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618. For the method for manufacturing the transistor, the description of this embodiment can be referred to, as appropriate.

The substrate 600 corresponds to the semiconductor substrate 700. The base insulating film 602 corresponding to the interlayer insulating film 705 is formed using a silicon oxide film. The oxide semiconductor film 606 corresponding to the oxide semiconductor layer 711 is formed using an In—Sn—Zn—O film. The pair of electrodes 614 corresponding to the source electrode 712a and the drain electrode 712b is formed using a tungsten film. The gate insulating film 608 corresponding to the gate insulating film 713 is formed using a silicon oxide film. The gate electrode 610 corresponding to the gate electrode 714 has a stacked structure of a tantalum nitride film and a tungsten film. The interlayer insulating film 616 has a stacked structure of a silicon oxynitride film and a polyimide film. The wirings 618 each have a stacked structure in which a titanium film, an aluminum film, and a titanium film are formed in this order. The protective film 620 is formed using a polyimide film.

Note that in the transistor having the structure illustrated in FIG. 14A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

The actually measured field-effect mobility of an insulated gate transistor which can be used for a transistor included in a semiconductor device according to one embodiment of the present invention can be lower than its original mobility because of a variety of reasons; this phenomenon occurs not only in the case of using an oxide semiconductor. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the field-effect mobility $\mu$ can be expressed as the following formula (3). Here, E represents the height of the potential barrier, k represents the Boltzmann constant, and T represents the absolute temperature.

$$\mu = \mu_0 \exp\left(-\frac{E}{kT}\right) \quad (3)$$

When the potential barrier is assumed to be attributed to a defect, the height of the potential barrier E can be expressed as the following formula (4) according to the Levinson model.

$$E = \frac{e^2 N^2}{8\varepsilon n} = \frac{e^3 N^2 t}{8\varepsilon C_{ox} V_g} \quad (4)$$

Here, e represents the elementary charge, N represents the average defect density per unit area in a channel, $\varepsilon$ represents the permittivity of the semiconductor, n represents carrier surface density of the channel, $C_{ox}$ represents the capacitance per unit area, $V_g$ (a potential difference between the gate and the source) represents the gate voltage, and t represents the thickness of the channel.

In the case where the thickness of the semiconductor layer used in the insulated gate transistor is less than or equal to 30 nm, the thickness of the channel formation region may be regarded as being the same as the thickness of the semiconductor layer. The drain current $I_d$ in a linear region can be expressed as the following formula (5). Note that a current that flows between a source and a drain when $V_g$ is higher than the threshold voltage of the transistor is called a drain current.

$$I_d = \frac{W \mu V_g V_d C_{ox}}{L} \exp\left(-\frac{E}{kT}\right) \quad (5)$$

Here, L represents the channel length and W represents the channel width, and L and W are each 10 μm. In addition, $V_d$ represents the drain voltage. When dividing both sides of the above equation by $V_g$ and then taking logarithms of both sides, the following formula (6) can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad (6)$$

The right side of the formula (6) is a function of $V_g$. From Formula (6), it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/cm^2$.

On the basis of the defect density obtained in this manner, or the like, to can be calculated to be 120 $cm^2/Vs$ from the formulas (3) and (4). The measured field-effect mobility of an In—Sn—Zn-based metal oxide including a defect is approximately 40 $cm^2/Vs$. However, assuming that no defect exists inside the semiconductor and at the interface between the semiconductor and an insulating film, the mobility $\mu_0$ of the oxide semiconductor is expected to be 120 $cm^2/Vs$.

Note that even when no defect exists inside an oxide semiconductor film, scattering at an interface between a channel formation region and a gate insulating film affects the transport property of the transistor. In other words, the field-effect mobility $\mu_1$ at a position that is distance x away from the interface between the channel formation region and the gate insulating film can be expressed by the following formula (7).

$$\frac{1}{\mu_1} = \frac{1}{\mu_0} + \frac{D}{B}\exp\left(-\frac{x}{l}\right) \quad (7)$$

Here, D represents the electric field in the gate direction, and B and l are constants. B and l can be obtained from actual measurement results; according to the above measurement results, B is 4.75×10$^7$ cm/s and l is 10 nm (the depth to which the influence of interface scattering reaches). When D is increased (i.e., when the gate voltage is increased), the second term of the formula (7) is increased and accordingly the field-effect mobility $\mu_1$ is decreased.

Figure 15:
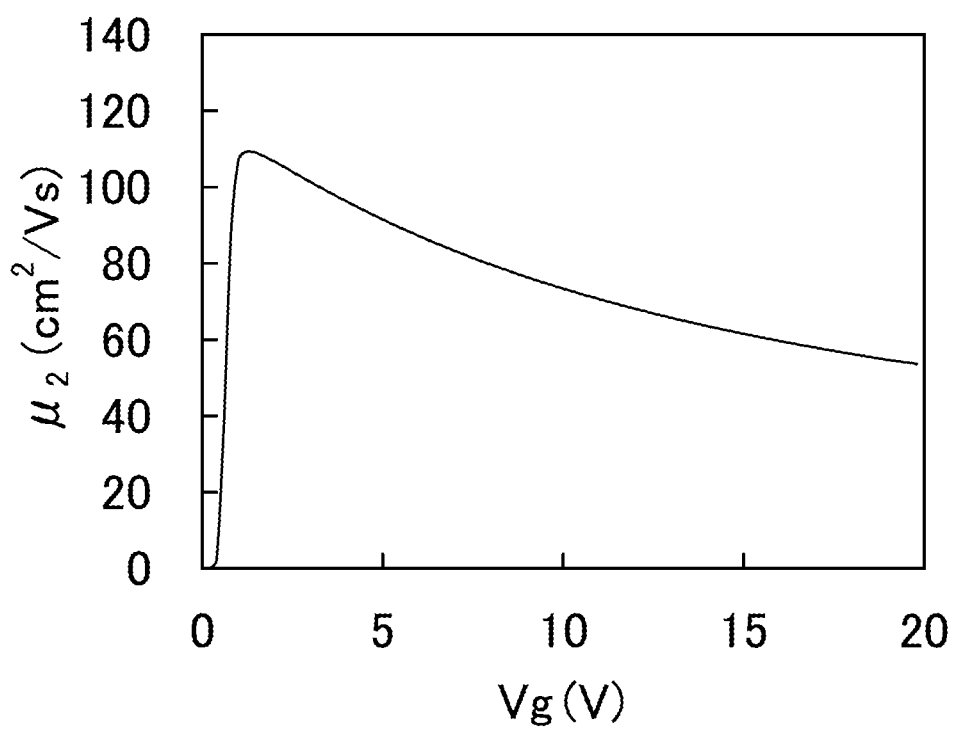
FIG. 15 shows a calculation result of the gate voltage dependence of field-effect mobility of a transistor including an oxide semiconductor.

Calculation results of the field-effect mobility $\mu_2$ of a transistor having a channel formation region including an ideal oxide semiconductor without a defect inside are shown in FIG. 15. For the calculation, device simulation software Sentaurus Device manufactured by Synopsys, Inc. was used, and the band gap, the electron affinity, the relative permittivity, and the thickness of the oxide semiconductor were assumed to be 3.1 eV, 4.6 eV, 15, and 30 nm, respectively. Further, the work functions of a gate electrode, a source electrode, and a drain electrode were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 15, the field-effect mobility has a peak of 100 cm$^2$/Vs or more at a gate voltage that is a little over 1 V and is decreased as the gate voltage becomes higher because the influence of interface scattering is increased. Note that in order to reduce interface scattering, it is preferable that a surface of the oxide semiconductor layer be flat at the atomic level (atomic layer flatness).

Figure 16A:
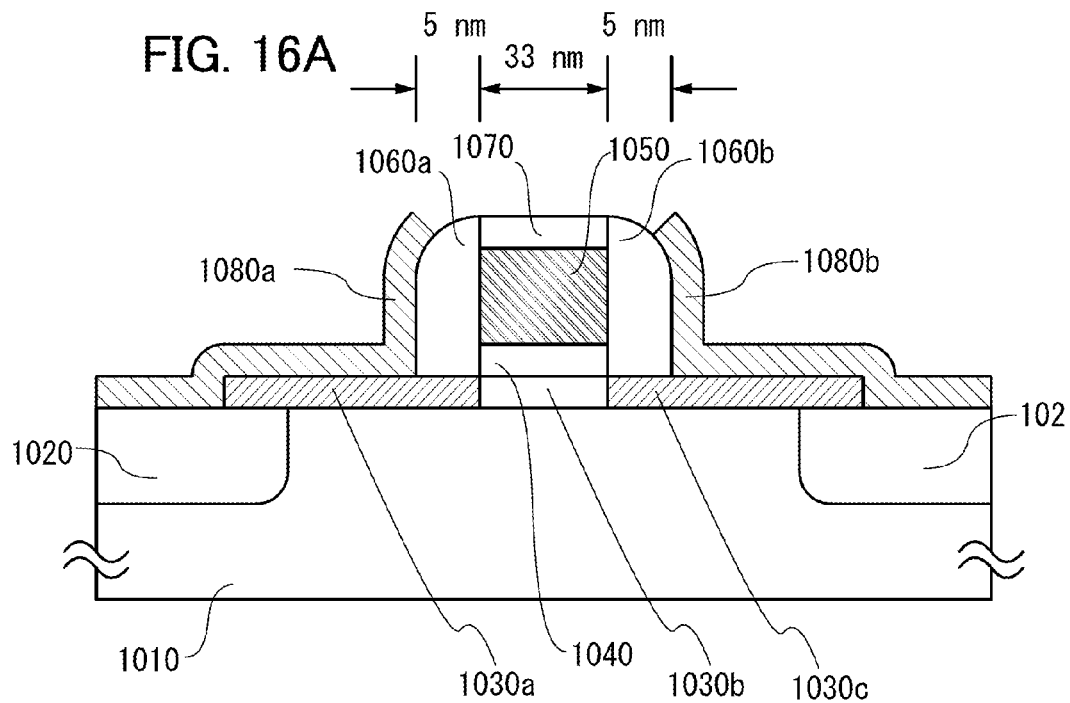
FIGS. 16A and 16B illustrate cross-sectional structures of transistors used for calculation.
Figure 16B:
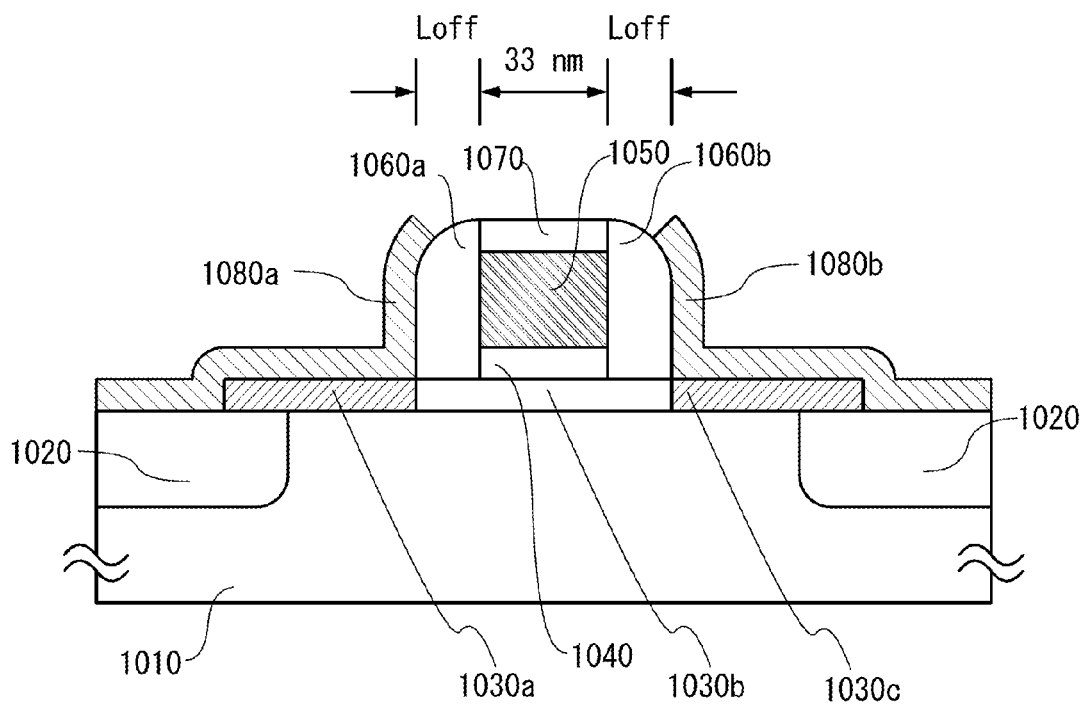

Calculation results of electric characteristics of minute transistors formed using an oxide semiconductor having such a field-effect mobility are shown in FIGS. 17A to 17C, FIGS. 18A to 18C, and FIGS. 19A to 19C. FIGS. 16A and 16B illustrate cross-sectional structures of the transistors used for the calculation. The transistors illustrated in FIGS. 16A and 16B each include a semiconductor region 1030a and a semiconductor region 1030c which have n$^+$-type conductivity in an oxide semiconductor layer. The resistivities of the semiconductor region 1030a and the semiconductor region 1030c are 2×10$^{-3}$ Ωcm.

The transistor in FIG. 16A is formed over a base insulator 1010 and an embedded insulator 1020 that is embedded in the base insulating insulator 1010 and formed of aluminum oxide. The transistor includes the semiconductor region 1030a, the semiconductor region 1030c, an intrinsic semiconductor region 1030b that is placed between the semiconductor regions 1030a and 1030c and serves as a channel formation region, and a gate electrode 1050. The width of the gate electrode 1050 is 33 nm.

A gate insulator 1040 is formed between the gate electrode 1050 and the semiconductor region 1030b. A sidewall insulator 1060a and a sidewall insulator 1060b are formed on both side surfaces of the gate electrode 1050, and an insulator 1070 is formed over the gate electrode 1050 to prevent a short circuit between the gate electrode 1050 and another wiring. The sidewall insulator has a width of 5 nm. A source electrode 1080a and a drain electrode 1080b are provided in contact with the semiconductor region 1030a and the semiconductor region 1030c, respectively. Note that the channel width of this transistor is 40 nm.

The transistor of FIG. 16B is the same as the transistor of FIG. 16A in that it is formed over the base insulator 1010 and the embedded insulator 1020 formed of aluminum oxide and that it includes the semiconductor region 1030a, the semiconductor region 1030c, the intrinsic semiconductor region 1030b provided therebetween, the gate electrode 1050 having a width of 33 nm, the gate insulator 1040, the sidewall insulator 1060a, the sidewall insulator 1060b, the insulator 1070, the source electrode 1080a, and the drain electrode 1080b.

The transistor illustrated in FIG. 16A is different from the transistor illustrated in FIG. 16B in the conductivity type of semiconductor regions under the sidewall insulator 1060a and the sidewall insulator 1060b. In the transistor illustrated in FIG. 16A, the semiconductor regions under the sidewall insulator 1060a and the sidewall insulator 1060b are part of the semiconductor region 1030a having n$^+$-type conductivity and part of the semiconductor region 1030c having n$^+$-type conductivity, whereas in the transistor illustrated in FIG. 16B, the semiconductor regions under the sidewall insulator 1060a and the sidewall insulator 1060b are part of the intrinsic semiconductor region 1030b. In other words, in the semiconductor layer of FIG. 16B, a region having a width of $L_{off}$ which overlaps with neither the semiconductor region 1030a (the semiconductor region 1030c) nor the gate electrode 1050 is provided. This region is called an offset region, and the width $L_{off}$ is called an offset length. As is seen from the drawing, the offset length is equal to the width of the sidewall insulator 1060a (the sidewall insulator 1060b).

Figure 17A:
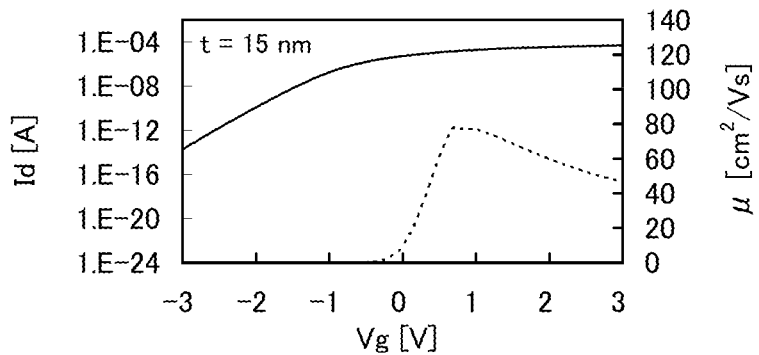
FIGS. 17A to 17C show calculation results of the gate voltage dependence of drain current and field-effect mobility of a transistor including an oxide semiconductor.
Figure 17B:
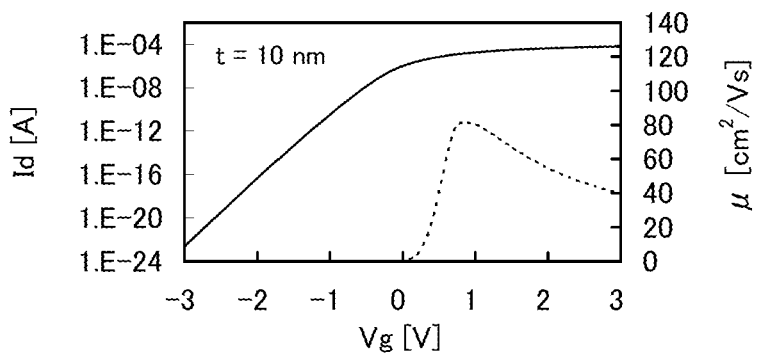
Figure 17C:
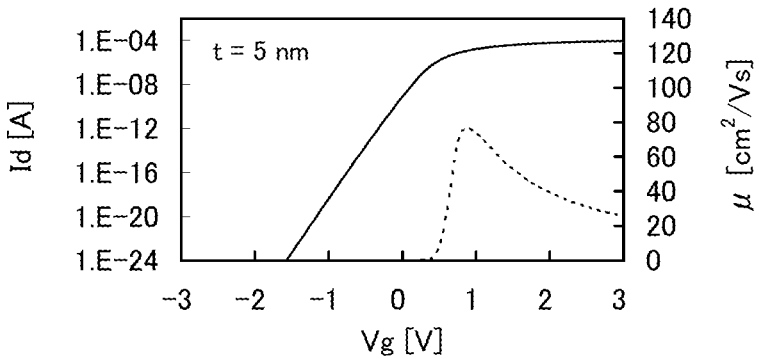

The other parameters used in calculation are as described above. For the calculation, the same device simulation software manufactured by Synopsys, Inc. was used. FIGS. 17A to 17C show the gate voltage ($V_g$: a potential difference between the gate and the source) dependence of the drain current ($I_d$, a solid line) and the field-effect mobility (μ a dotted line) of the transistor having the structure illustrated in FIG. 16A. The drain current $I_d$ is obtained by calculation under the assumption that the drain voltage (a potential difference between the drain and the source) is +1 V and the field-effect mobility μ is obtained by calculation under the assumption that the drain voltage is +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility μ and the drain current $I_d$ in an on state (on-state current). The graphs show that the drain current exceeds 10 μA at a gate voltage of around 1 V.

Figure 18A:
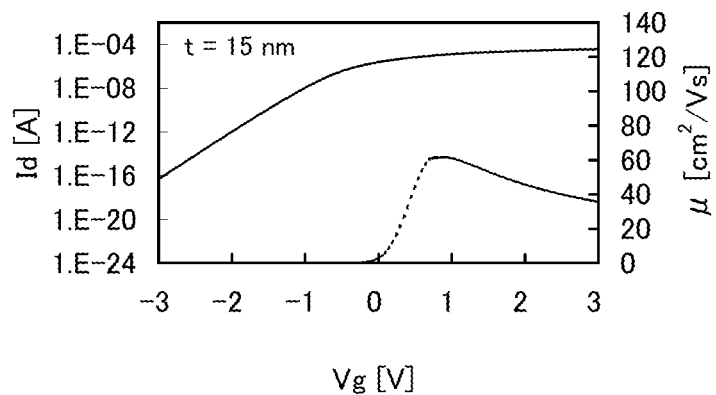
FIGS. 18A to 18C show calculation results of the gate voltage dependence of drain current and field-effect mobility of a transistor including an oxide semiconductor.
Figure 18B:
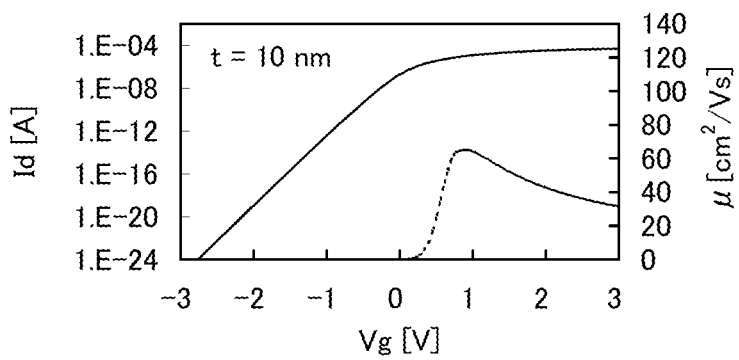
Figure 18C:
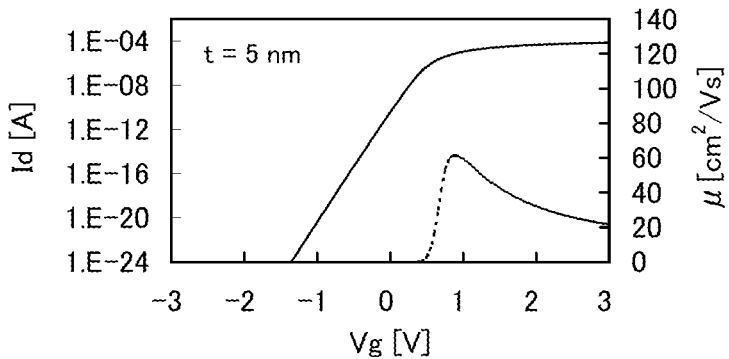

FIGS. 18A to 18C show the gate voltage $V_g$ dependence of the drain current $I_d$ (a solid line) and the field-effect mobility μ (a dotted line) of the transistor having the structure illustrated in FIG. 16B where the offset length $L_{off}$ is 5 nm. The drain current $I_d$ is obtained by calculation under the assumption that the drain voltage is +1 V and the field-effect mobility μ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

Figure 19A:
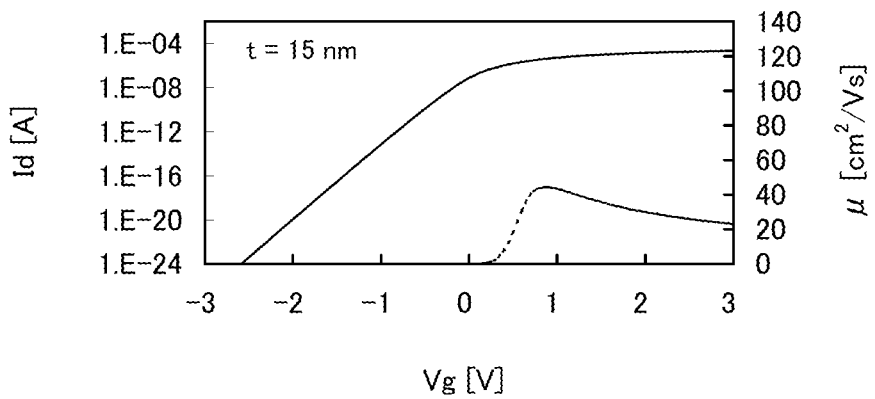
FIGS. 19A to 19C show calculation results of the gate voltage dependence of drain current and field-effect mobility of a transistor including an oxide semiconductor.
Figure 19B:
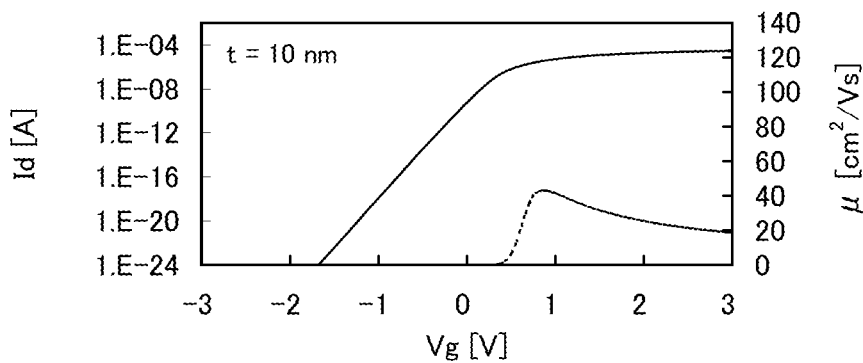
Figure 19C:
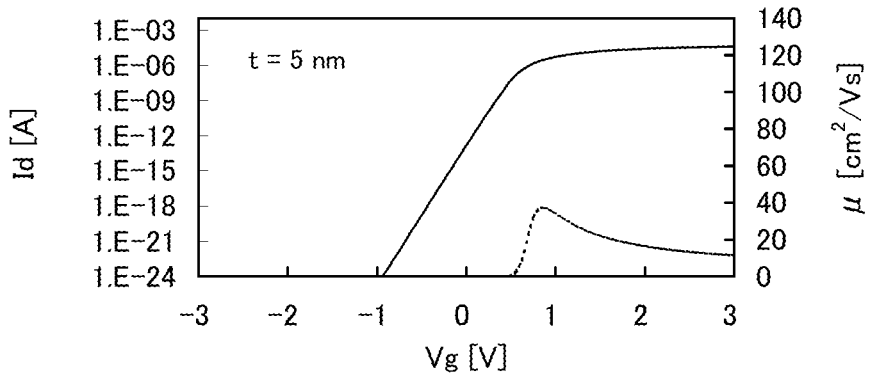

Further, FIGS. 19A to 19C show the gate voltage dependence of the drain current $I_d$ (a solid line) and the field-effect mobility μ (a dotted line) of the transistor having the structure illustrated in FIG. 16B where the offset length $L_{off}$ is 15 nm. The drain current $I_d$ is obtained by calculation under the assumption that the drain voltage is +1 V and the field-effect mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility μ and the on-state current.

Note that the peak of the field-effect mobility μ is approximately 80 cm$^2$/Vs in FIGS. 17A to 17C, approximately 60 cm$^2$/Vs in FIGS. 18A to 18C, and approximately 40 cm$^2$/Vs in FIGS. 19A to 19C; thus, the peak of the field-effect mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Next, among the transistors described in this embodiment, a transistor whose channel formation region is formed in an oxide semiconductor layer containing In, Sn, and Zn as main components will be described. Here, an oxide semiconductor layer containing In, Sn, and Zn as main components refers to, for example, an oxide semiconductor layer containing an In—Sn—Zn-based metal oxide.

A transistor whose channel formation region is formed in an oxide semiconductor layer including In, Sn, and Zn as main components can have favorable characteristics by forming an oxide semiconductor film which is not processed into the oxide semiconductor layer while heating a substrate or by performing heat treatment after the oxide semiconductor film is formed. Note that a main component refers to an element included in composition at 5 atomic % or more. Note that the substrate corresponds to the semiconductor substrate 700.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 20A:
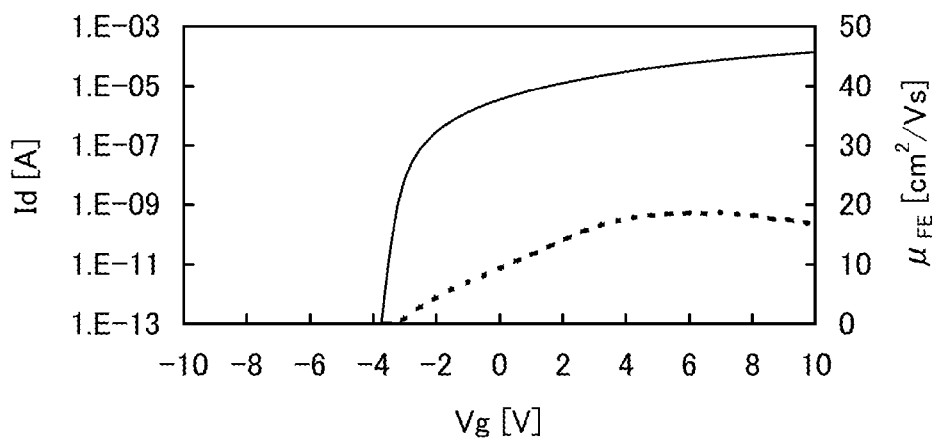
FIGS. 20A to 20C show electric characteristics of a transistor including an oxide semiconductor.
Figure 20B:
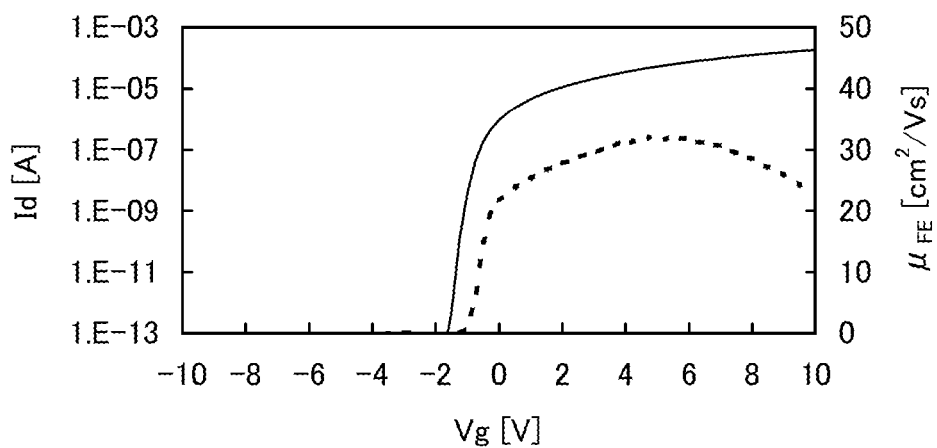
Figure 20C:
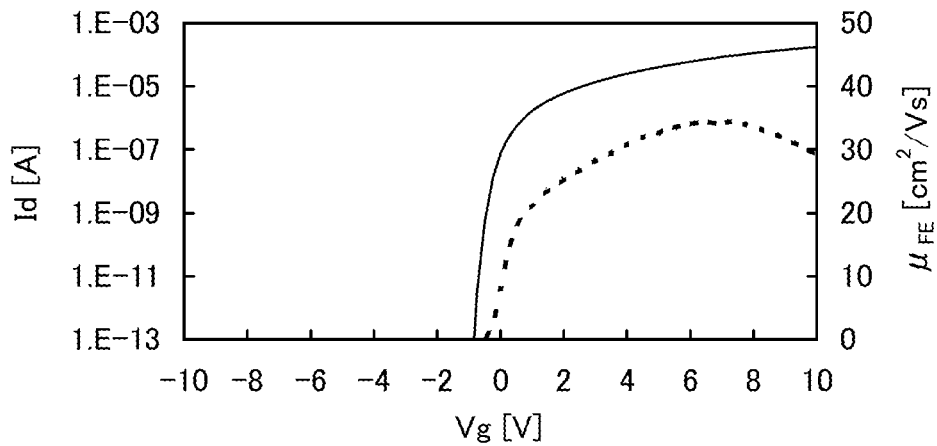

As an example, FIGS. 20A to 20C each show characteristics of a transistor that includes an oxide semiconductor layer including In, Sn, and Zn as main components and having a channel length L of 3 μm and a channel width W of 10 μm, and a gate insulating film with a thickness of 100 nm. Note that $V_d$ is set to 10 V.

FIG. 20A shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 20B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 20C shows characteristics of a transistor whose oxide semiconductor film containing In, Sn, and Zn as main components was formed by sputtering at 200° C. and then subjected to heat treatment at 650° C. The field-effect mobility of the transistor is 34.5 cm$^2$/Vsec.

The intentional heating of the substrate can reduce moisture taken into the oxide semiconductor film during the formation by sputtering. Further, the heat treatment after formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor film including In, Sn, and Zn as main components may be crystallized in the following manner: oxygen ions are implanted into the oxide semiconductor film; hydrogen, a hydroxyl group, or moisture included in the oxide semiconductor film is released by heat treatment; and the oxide semiconductor film is crystallized through the heat treatment or by another heat treatment performed later. By such crystallization treatment or recrystallization treatment, a non-single-crystal oxide semiconductor having favorable crystallinity can be obtained.

The intentional heating of the substrate during formation and/or the heat treatment after the formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 20A and 20B.

Note that the threshold voltage can also be controlled by changing the ratio of In, Sn, and Zn; when the composition ratio of In, Sn, and Zn is 2:1:3, a normally-off transistor can be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., further preferably higher than or equal to 400° C. When formation or heat treatment is performed at a high temperature, the transistor can be normally off.

By intentionally heating the substrate during formation and/or by performing heat treatment after the formation, the stability against a gate-bias stress can be increased. For example, when a gate bias is applied with an intensity of 2

MV/cm at 150° C. for one hour, drift of the threshold voltage can be less than ±1.5 V, preferably less than ±1.0 V.

A BT test is performed on the following two transistors: Sample 1 on which heat treatment is not performed after formation of an oxide semiconductor film; and Sample 2 on which heat treatment at 650° C. is performed after formation of an oxide semiconductor film.

First, $V_g$-$I_d$ characteristics of the transistors are measured at a substrate temperature of 25° C. and $V_d$ (a potential difference between the source and the drain) of 10V. Then, the substrate temperature is set to 150° C. and $V_d$ is set to 0.1 V. After that, $V_g$ of 20 V is applied so that the intensity of an electric field applied to the gate insulating film 608 is 2 MV/cm, and the condition is kept for one hour. Next, $V_g$ is set to 0 V. Then, $V_g$-$I_d$ characteristics of the transistors are measured at a substrate temperature of 25° C. and $V_d$ of 10 V. This process is called a positive BT test.

In a similar manner, first, $V_g$-$I_d$ characteristics of the transistors are measured at a substrate temperature of 25° C. and $V_d$ of 10 V. Then, the substrate temperature is set to 150° C. and $V_d$ is set to 0.1 V. After that, $V_g$ of −20 V is applied so that the intensity of an electric field applied to the gate insulating film 608 is −2 MV/cm, and the condition is kept for one hour. Next, $V_g$ is set to 0 V. Then, $V_g$-$I_d$ characteristics of the transistors are measured at a substrate temperature of 25° C. and $V_d$ of 10 V. This process is called a negative BT test.

Figure 21A:
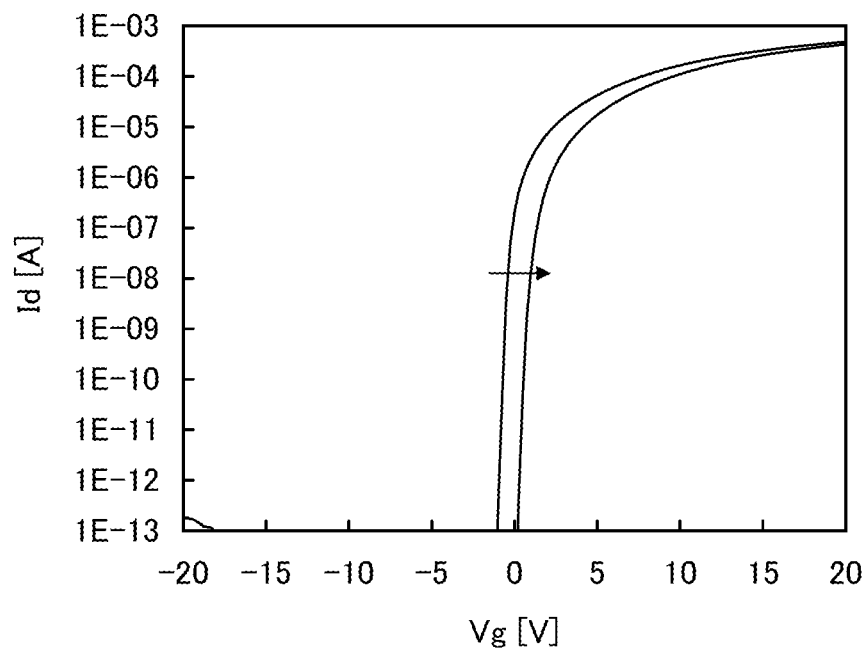
FIGS. 21A and 21B each show $V_g$–$I_d$ characteristics of a transistor of Sample 1 after a BT test.
Figure 21B:
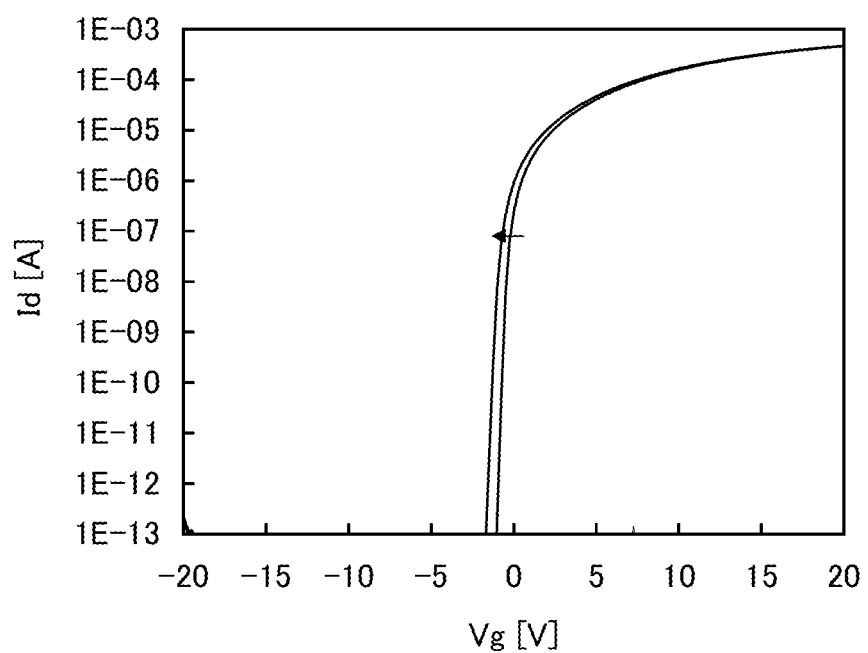
Figure 22A:
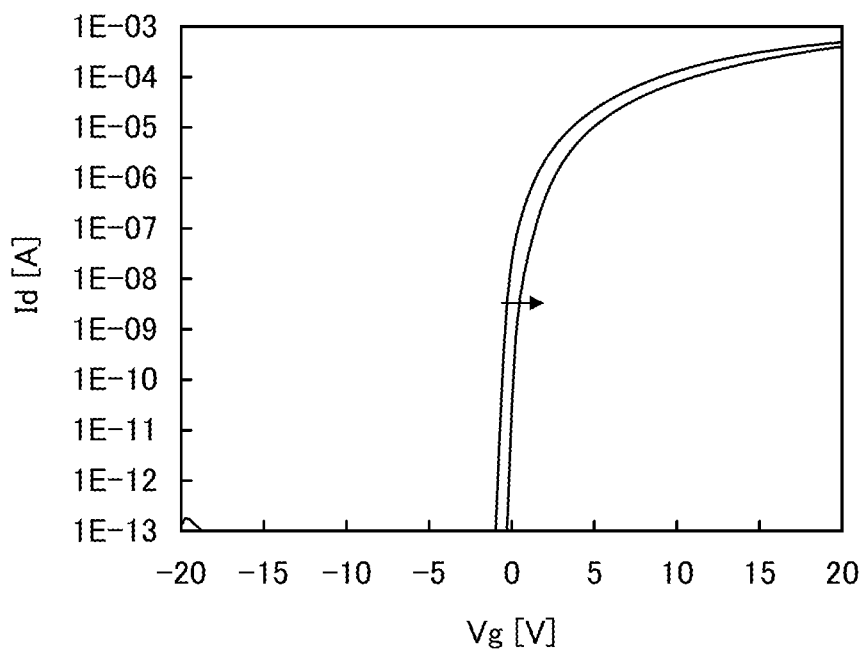
FIGS. 22A and 22B each show $V_g$–$I_d$ characteristics of a transistor of Sample 2 after a BT test.
Figure 22B:
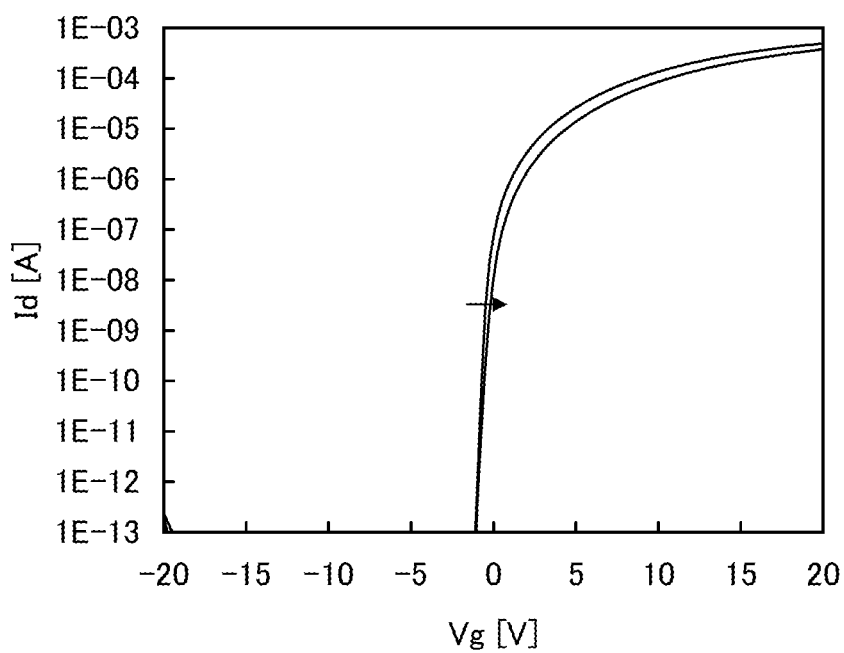

FIGS. 21A and 21B show a result of the positive BT test of Sample 1 and a result of the negative BT test of Sample 1, respectively. FIGS. 22A and 22B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor film after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor film or at an interface between the oxide semiconductor film and a stacked film; when excess oxygen is included in the oxide semiconductor film by the heat treatment, oxygen vacancy caused later can be compensated for with excess oxygen. The excess oxygen is mainly oxygen existing between lattices. When the concentration of oxygen is set in the range of $1 \times 10^{16}$/cm$^3$ to $2 \times 10^{20}$/cm$^3$, excess oxygen can be included in the oxide semiconductor film without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film is conducted. The XRD analysis is conducted using an X-ray diffractometer D8 ADVANCE manufactured by Bruker AXS, and measurement is performed by an out-of-plane method.

Sample A and Sample B are prepared and the XRD analysis is performed thereon. A method for manufacturing Sample A and Sample B will be described below. In both of Sample A and Sample B, an In—Sn—Zn—O film with a thickness of 100 nm is formed over a quartz substrate that has been subjected to dehydrogenation treatment.

The In—Sn—Zn—O film is formed with a sputtering apparatus with a power of 100 W (DC) in an oxygen atmosphere. An In—Sn—Zn—O target of In:Sn:Zn=1:1:1 [atomic ratio] is used as a target. Note that the substrate heating temperature in film formation is set at 200° C. A sample manufactured in this manner is used as Sample A.

Next, a sample manufactured by a method similar to that of Sample A is subjected to heat treatment at 650° C. As the heat treatment, heat treatment in a nitrogen atmosphere is first performed for one hour and heat treatment in an oxygen atmosphere is further performed for one hour without lowering the temperature. A sample manufactured in this manner is used as Sample B.

Figure 23:
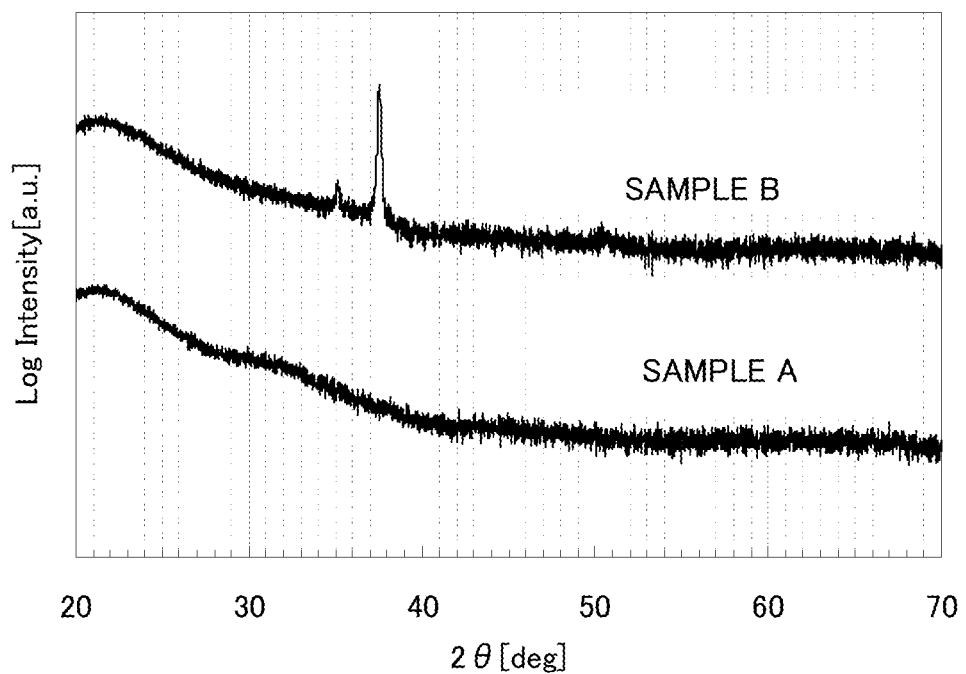
FIG. 23 shows XRD spectra of Sample A and Sample B.

FIG. 23 shows XRD spectra of Sample A and Sample B. No peak derived from crystal is observed in Sample A, whereas peaks derived from crystal are observed when 2θ is around 35 deg. and at 37 deg. to 38 deg. in Sample B.

As described above, by intentionally heating a substrate during formation of an oxide semiconductor film including In, Sn, and Zn as main components and/or by performing heat treatment after the formation, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 24:
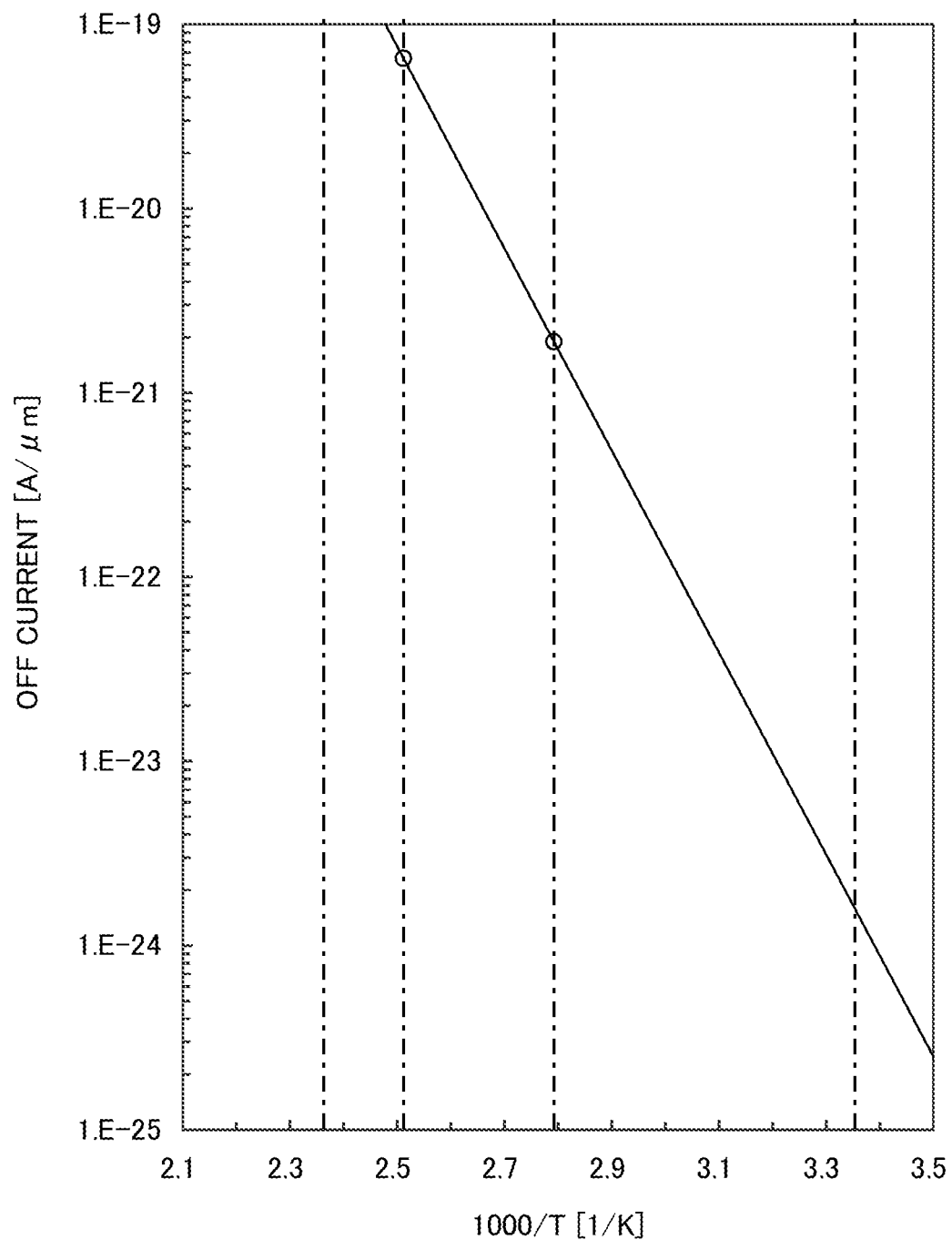
FIG. 24 shows an off-state current and substrate temperature dependence in measurement of a transistor including an oxide semiconductor.

FIG. 24 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 24, the off-state current can be lower than or equal to 1 aA/μm ($1 \times 10^{-18}$ A/μm) and lower than or equal to 100 zA/μm ($1 \times 10^{-19}$ A/μm) when the substrate temperature is 125° C. and 85° C., respectively. The off-state current in a room temperature (27° C.) can be expected to be lower than or equal to 1 zA/μm ($1 \times 10^{-21}$ A/μm) by the extrapolation method. Preferably, the off-state current can be lower than or equal to 0.1 aA/μm ($1 \times 10^{-19}$ A/μm) and lower than or equal to 10 zA/μm ($1 \times 10^{-20}$ A/μm) at 125° C. and 85° C., respectively. The off-state current in a room temperature can be expected to be lower than or equal to 0.1 zA/μm ($1 \times 10^{-22}$ A/μm) by the extrapolation method. The above values of off-state currents are clearly much lower than that of the transistor using a Si semiconductor.

Note that in order to prevent hydrogen and moisture from being included in the oxide semiconductor film during formation of the film, it is preferable to increase the purity of a sputtering gas by sufficiently suppressing leakage from the outside of a treatment chamber and degasification through an inner wall of the treatment chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from an oxide semiconductor film including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, is evaluated.

The transistor used for the measurement has a channel length L of 3 μm, a channel width W of 10 μm, Lov of 0 μm, and dW of 0 μm. Note that $V_d$ is set to 10 V. Note that the substrate temperature is −40° C., −25° C., 25° C., 75° C., 125° C., and 150° C. Here, the width of a portion where a gate electrode overlaps with one of a pair of electrodes is referred to as Lov, and the width of a portion of the pair of electrodes, which does not overlap with an oxide semiconductor film, is referred to as dW.

Figure 25:
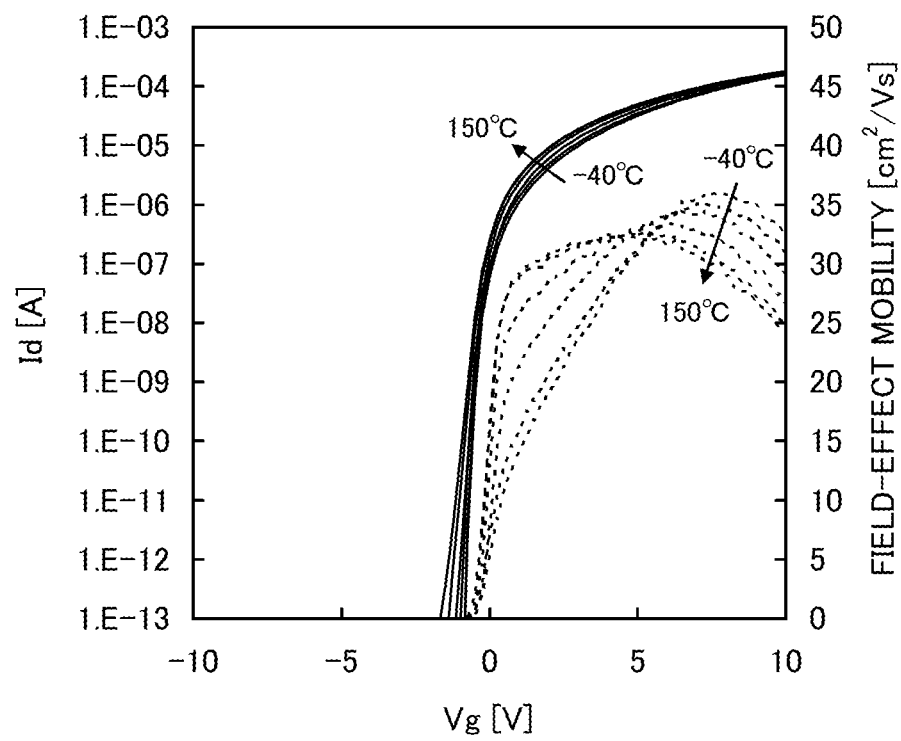
FIG. 25 shows the gate voltage dependence of drain current and field-effect mobility of a transistor including an oxide semiconductor.
Figure 26A:
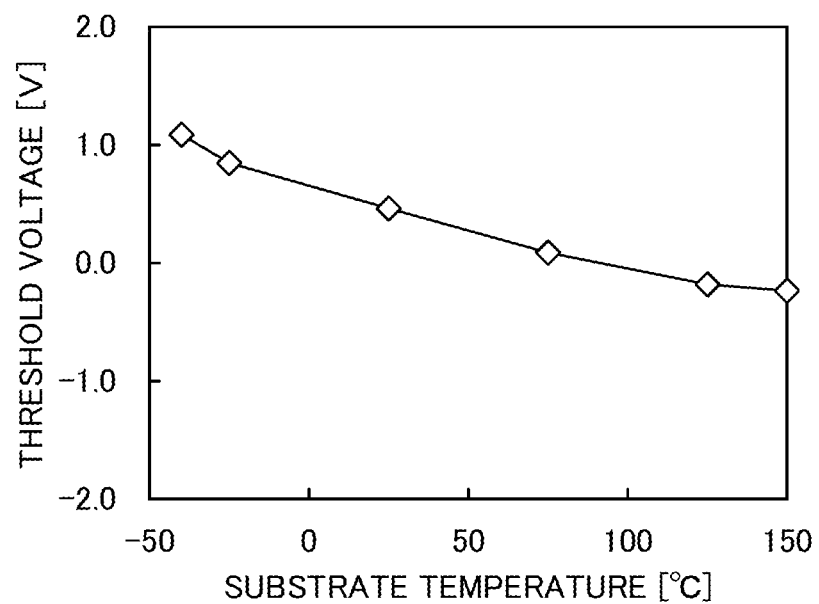
FIGS. 26A and 26B show electric characteristics and substrate temperature dependence of a transistor including an oxide semiconductor.

FIG. 25 shows the $V_g$ dependence of $I_d$ (a solid line) and field-effect mobility (a dotted line). FIG. 26A shows a relation between the substrate temperature and the threshold voltage, and FIG. 26B shows a relation between the substrate temperature and the field-effect mobility.

From FIG. 26A, it is found that the threshold voltage gets lower as the substrate temperature increases. Note that the threshold voltage is decreased from 1.09 V to −0.23 V in the range from −40° C. to 150° C.

Figure 26B:
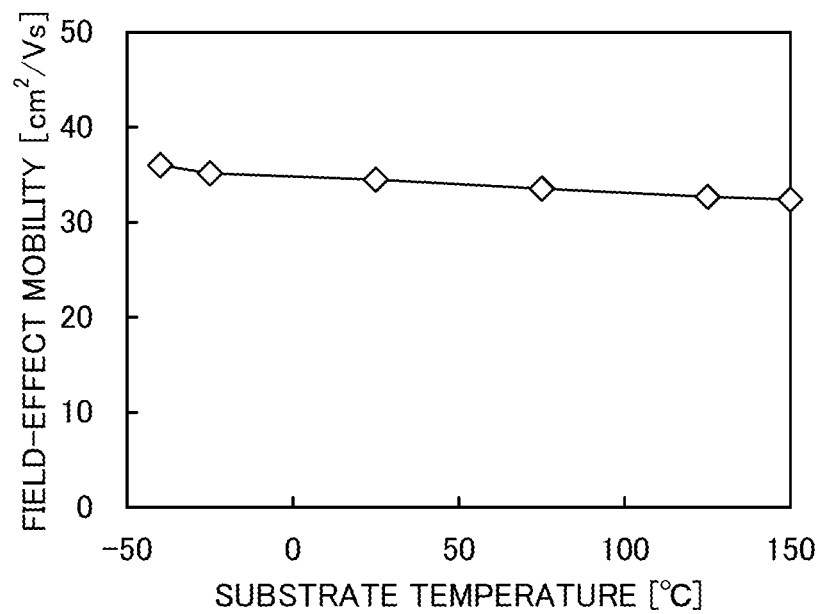

From FIG. 26B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor whose channel formation region is formed in such an oxide semiconductor including In, Sn, and Zn as main components, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Note that the contents of this embodiment or part thereof can be combined freely with the contents of other embodiments or part thereof.

This application is based on Japanese Patent Application serial no. 2011-114022 filed with Japan Patent Office on May 20, 2011, the entire contents of which are hereby incorporated by reference.

What is claimed is:

1. A semiconductor device comprising:
a first transistor;
a second transistor;
a third transistor;
a circuit comprising a first input terminal and a second input terminal;
a high-potential power supply;
a low-potential power supply; and
an output terminal,
wherein one of a source and a drain of the first transistor is electrically connected to the low-potential power supply,
wherein the other of the source and the drain of the first transistor is electrically connected to the circuit,
wherein one of a source and a drain of the second transistor is electrically connected to the circuit and one of a source and a drain of the third transistor,
wherein the other of the source and the drain of the second transistor is electrically connected to the high-potential power supply,
wherein the other of the source and the drain of the third transistor is electrically connected to the output terminal,
wherein the low-potential power supply is electrically connected to the output terminal through the first transistor and the circuit when a first data potential signal input to the first input terminal is same as a second data potential signal input to the second input terminal,
wherein the high-potential power supply is electrically connected to the output terminal through the second transistor when the first data potential signal is different from the second data potential signal, and
wherein the third transistor includes an oxide semiconductor layer including a channel formation region.

2. The semiconductor device according to claim 1, wherein the third transistor is a transistor whose leakage current in an off state per micrometer of a channel width is lower than or equal to $1 \times 10^{-17}$ A.

3. A semiconductor device comprising:
a first transistor;
a second transistor;
a third transistor;
a first circuit comprising a first input terminal;
a second circuit comprising a second input terminal;
a high-potential power supply;
a low-potential power supply; and
an output terminal,
wherein one of a source and a drain of the first transistor is electrically connected to the low-potential power supply,
wherein the other of the source and the drain of the first transistor is electrically connected to the first circuit,
wherein the first circuit is electrically connected to the second circuit,
wherein one of a source and a drain of the second transistor is electrically connected to the second circuit and one of a source and a drain of the third transistor,
wherein the other of the source and the drain of the second transistor is electrically connected to the high-potential power supply, wherein the other of the source and the drain of the third transistor is electrically connected to the output terminal, wherein the low-potential power supply is electrically connected to the output terminal through the first transistor and the first circuit and the second circuit when a second parity bit provided by the first circuit for a data potential signal input to the first input terminal is same as a first parity bit of the data potential signal input to the second input terminal, wherein the high-power supply is electrically connected to the output terminal through the second transistor when the second parity is different from the first parity bit, and wherein the third transistor includes an oxide semiconductor layer including a channel formation region.

4. The semiconductor device according to claim 3, wherein the third transistor is a transistor whose leakage current in an off state per micrometer of a channel width is lower than or equal to $1 \times 10^{-17}$ A.

5. A semiconductor device comprising:
a first transistor;
a second transistor;
a first transistor group including a third transistor, a fourth transistor, and first to fourth terminals; and
a second transistor group including fifth to eighth transistors and first to fourth terminals, wherein one of a source and a drain of the first transistor is electrically connected to a low-potential power supply line, wherein the first terminal of the first transistor group and the second terminal of the first transistor group are electrically connected to the other of the source and the drain of the first transistor, wherein the third terminal of the first transistor group is electrically connected to the first terminal of the second transistor group, wherein the fourth terminal of the first transistor group is electrically connected to the second terminal of the second transistor group, wherein the third terminal of the second transistor group is electrically connected to one of a source and a drain of the second transistor and an output terminal, wherein the fourth terminal of the second transistor group is electrically connected to the low-potential power supply line, wherein the other of the source and the drain of the second transistor is electrically connected to a high-potential power supply line, wherein in the first transistor group, one of a source and a drain of the third transistor is electrically connected to the first terminal of the first transistor group, the other of the source and the drain of the third transistor is electrically connected to the third terminal of the first transistor group, one of a source and a drain of the fourth transistor is electrically connected to the second terminal of the first transistor group, and the other of the source and the drain of the fourth transistor is electrically connected to the fourth terminal of the first transistor group, wherein in the second transistor group, one of a source and a drain of the fifth transistor and one of a source and a drain of the sixth transistor are electrically connected to the first terminal of the second transistor group, one of a source and a drain of the seventh transistor and one of a source and a drain of the eighth transistor are electrically connected to the second terminal of the second transistor group, the other of the source and the drain of the fifth transistor and the other of the source and the drain of the eighth transistor are electrically connected to the third terminal of the second transistor group, and the other of the source and the drain of the sixth transistor and the other of the source and the drain of the seventh transistor are electrically connected to the fourth terminal of the second transistor group, wherein a gate of the first transistor and a gate of the second transistor are electrically connected to a first input terminal to which a clock signal is input, wherein gates of the third and fourth transistors included in the first transistor group are electrically connected to a second input terminal to which a data potential signal is input, and gates of the fifth to eighth transistors included in the second transistor group are electrically connected to a third input terminal to which a data potential signal is input, wherein the first transistor, the third transistor, the sixth transistor, and the eighth transistor are n-channel transistors, and wherein the second transistor, the fourth transistor, the fifth transistor, and the seventh transistor are p-channel transistors.

6. The semiconductor device according to claim 5, further comprising:
a ninth transistor between the second transistor and the output terminal, wherein one of a source and a drain of the ninth transistor is electrically connected to the one of the source and the drain of the second transistor, wherein the other of the source and the drain of the ninth transistor is electrically connected to the output terminal, wherein a gate of the ninth transistor is electrically connected to the first input terminal, and wherein the ninth transistor is a transistor whose leakage current in an off state per micrometer of a channel width is lower than or equal to $1 \times 10^{-17}$ A.

7. The semiconductor device according to claim 6, wherein the ninth transistor includes an oxide semiconductor layer including a channel formation region.

8. A semiconductor device comprising:
a first transistor;
a second transistor;
a first transistor group including a third transistor, a fourth transistor, and first to fourth terminals; and
second to m-th (m is a natural number of 3 or more) transistor groups each including fifth to eighth transistors and first to fourth terminals, wherein one of a source and a drain of the first transistor is electrically connected to a low-potential power supply line, wherein the first terminal of the first transistor group and the second terminal of the first transistor group are electrically connected to the other of the source and the drain of the first transistor, wherein the third terminal of the first transistor group is electrically connected to the first terminal of the second transistor group, wherein the fourth terminal of the first transistor group is electrically connected to the second terminal of the second transistor group, wherein the first terminal of the m-th transistor group is electrically connected to the third terminal of the (m−1)th transistor group, wherein the second terminal of the m-th transistor group is electrically connected to the fourth terminal of the (m−1)th transistor group, wherein the third terminal of the m-th transistor group is electrically connected to one of a source and a drain of the second transistor and an output terminal, wherein the fourth terminal of the m-th transistor group is electrically connected to the low-potential power supply line, wherein the other of the source and the drain of the second transistor is electrically connected to a high-potential power supply line, wherein in the first transistor group, one of a source and a drain of the third transistor is electrically connected to the first terminal of the first transistor group, the other of the source and the drain of the third transistor is electrically connected to the third terminal of the first transistor group, one of a source and a drain of the fourth transistor is electrically connected to the second terminal of the first transistor group, and the other of the source and the drain of the fourth transistor is electrically connected to the fourth terminal of the first transistor group, wherein in the m-th transistor group, one of a source and a drain of the fifth transistor and one of a source and a drain of the sixth transistor are electrically connected to the first terminal of the m-th transistor group, one of a source and a drain of the seventh transistor and one of a source and a drain of the eighth transistor are electrically connected to the second terminal of the m-th transistor group, the other of the source and the drain of the fifth transistor and the other of the source and the drain of the eighth transistor are electrically connected to the third terminal of the m-th transistor group, and the other of the source and the drain of the sixth transistor and the other of the source and the drain of the seventh transistor are electrically connected to the fourth terminal of the m-th transistor group, wherein a gate of the first transistor and a gate of the second transistor are electrically connected to a first input terminal to which a clock signal is input, wherein gates of the third and fourth transistors included in the first transistor group are electrically connected to a second input terminal which a data potential signal is input, and gates of fifth to eighth transistors included in the second to m-th transistor groups are electrically connected to third to (m+1)-th input terminals to which data potential signals are input, wherein the first transistor, the third transistor, and the sixth and eighth transistors included in the second to m-th transistor groups are n-channel transistors, and wherein the second transistor, the fourth transistor, and the fifth and seventh transistors included in the second to m-th transistor groups are p-channel transistors.

9. The semiconductor device according to claim 8, further comprising:

a ninth transistor between the second transistor and the output terminal, wherein one of a source and a drain of the ninth transistor is electrically connected to the one of the source and the drain of the second transistor, wherein the other of the source and the drain of the ninth transistor is electrically connected to the output terminal, wherein a gate of the ninth transistor is electrically connected to the first input terminal, and wherein the ninth transistor is a transistor whose leakage current in an off state per micrometer of a channel width is lower than or equal to $1 \times 10^{-17}$ A.

10. The semiconductor device according to claim 9, wherein the ninth transistor includes an oxide semiconductor layer including a channel formation region.

11. A semiconductor device comprising:

first to fourth transistors;

a first transistor group including a fifth transistor, a sixth transistor, and first to fourth terminals; and a second transistor group including seventh to tenth transistors and first to fourth terminals, wherein one of a source and a drain of the first transistor is electrically connected to a low-potential power supply line, wherein the first terminal of the first transistor group and the second terminal of the first transistor group are electrically connected to the other of the source and the drain of the first transistor, wherein the third terminal of the first transistor group is electrically connected to the first terminal of the second transistor group, wherein the fourth terminal of the first transistor group is electrically connected to the second terminal of the second transistor group, wherein the third terminal of the second transistor group is electrically connected to one of a source and a drain of the second transistor, wherein the fourth terminal of the second transistor group is electrically connected to one of a source and a drain of the third transistor, wherein the other of the source and the drain of the second transistor is electrically connected to the other of the source and the drain of the third transistor, one of a source and a drain of the fourth transistor, and an output terminal, wherein the other of the source and the drain of the fourth transistor is electrically connected to a high-potential power supply line, wherein in the first transistor group, one of a source and a drain of the fifth transistor is electrically connected to the first terminal of the first transistor group, the other of the source and the drain of the fifth transistor is electrically connected to the third terminal of the first transistor group, one of a source and a drain of the sixth transistor is electrically connected to the second terminal of the first transistor group, and the other of the source and the drain of the sixth transistor is electrically connected to the fourth terminal of the first transistor group, wherein in the second transistor group, one of a source and a drain of the seventh transistor and one of a source and a drain of the eighth transistor are electrically connected to the first terminal of the second transistor group, one of a source and a drain of the ninth transistor and one of a source and a drain of the tenth transistor are electrically connected to the second terminal of the second transistor group, the other of the source and the drain of the seventh transistor and the other of the source and the drain of the tenth transistor are electrically connected to the third terminal of the second transistor group, and the other of the source and the drain of the eighth transistor and the other of the source and the drain of the ninth transistor are electrically connected to the fourth terminal of the second transistor group, wherein a gate of the first transistor and a gate of the fourth transistor are electrically connected to a first input terminal to which a clock signal is input, wherein gates of the fifth and sixth transistors included in the first transistor group are electrically connected to a second input terminal to which a data potential signal is input, and gates of the seventh to tenth transistors included in the second transistor group are electrically connected to a third input terminal to which a data potential signal is input, wherein gates of the second transistor and the third transistor are electrically connected to a fourth input terminal to which a parity bit of the data potential signal is input, wherein the first transistor, the third transistor, the fifth transistor, the eighth transistor, and the tenth transistor are n-channel transistors, and wherein the second transistor, the fourth transistor, the sixth transistor, the seventh transistor, and the ninth transistor are p-channel transistors.

12. The semiconductor device according to claim 11, further comprising:

an eleventh transistor between the second transistor and the output terminal, wherein one of a source and a drain of the eleventh transistor is electrically connected to the other of the source and the drain of the second transistor, the other of the source and the drain of the third transistor, and the one of the source and the drain of the fourth transistor, wherein the other of the source and the drain of the eleventh transistor is electrically connected to the output terminal, wherein a gate of the eleventh transistor is electrically connected to the first input terminal, and wherein the eleventh transistor is a transistor whose leakage current in an off state per micrometer of a channel width is lower than or equal to $1 \times 10^{17}$ A.

13. The semiconductor device according to claim 12, wherein the eleventh transistor includes an oxide semiconductor layer including a channel formation region.

14. A semiconductor device comprising:

first to fourth transistors;

a first transistor group including a fifth transistor, a sixth transistor, and first to fourth terminals; and second to m-th (m is a natural number of 3 or more) transistor groups each including seventh to tenth transistors and first to fourth terminals, wherein one of a source and a drain of the first transistor is electrically connected to a low-potential power supply line, wherein the first terminal of the first transistor group and the second terminal of the first transistor group are electrically connected to the other of the source and the drain of the first transistor, wherein the third terminal of the first transistor group is electrically connected to the first terminal of the second transistor group, wherein the fourth terminal of the first transistor group is electrically connected to the second terminal of the second transistor group, wherein the first terminal of the m-th transistor group is electrically connected to the third terminal of the (m−1)th transistor group, wherein the second terminal of the m-th transistor group is electrically connected to the fourth terminal of the (m−1)th transistor group, wherein the third terminal of the m-th transistor group is electrically connected to one of a source and a drain of the second transistor, wherein the fourth terminal of the m-th transistor group is electrically connected to one of a source and a drain of the third transistor, wherein the other of the source and the drain of the second transistor is electrically connected to the other of the source and the drain of the third transistor, one of a source and a drain of the fourth transistor, and an output terminal, wherein the other of the source and the drain of the fourth transistor is electrically connected to a high-potential power supply line, wherein in the first transistor group, one of a source and a drain of the fifth transistor is electrically connected to the first terminal of the first transistor group, the other of the source and the drain of the fifth transistor is electrically connected to the third terminal of the first transistor group, one of a source and a drain of the sixth transistor is electrically connected to the second terminal of the first transistor group, and the other of the source and the drain of the sixth transistor is electrically connected to the fourth terminal of the first transistor group, wherein in the m-th transistor group, one of a source and a drain of the seventh transistor and one of a source and a drain of the eighth transistor are electrically connected to the first terminal of the m-th transistor group, one of a source and a drain of the ninth transistor and one of a source and a drain of the tenth transistor are electrically connected to the second terminal of the m-th transistor group, the other of the source and the drain of the seventh transistor and the other of the source and the drain of the tenth transistor are electrically connected to the third terminal of the m-th transistor group, and the other of the source and the drain of the eighth transistor and the other of the source and the drain of the ninth transistor are electrically connected to the fourth terminal of the m-th transistor group, wherein a gate of the first transistor and a gate of the fourth transistor are electrically connected to a first input terminal to which a clock signal is input, wherein gates of the fifth and sixth transistors included in the first transistor group are electrically connected to a second input terminal which a data potential signal is input, and gates of seventh to tenth transistors included in the second to m-th transistor groups are electrically connected to third to (m+1)-th input terminals to which data potential signals are input, wherein gates of the second transistor and the third transistor are electrically connected to a (m+2)-th input terminal to which a parity bit of the data potential signal is input, wherein the first transistor, the third transistor, the fifth transistor, and the eighth and tenth transistors included in the second to m-th transistor groups are n-channel transistors, and wherein the second transistor, the fourth transistor, the sixth transistor, and the seventh and ninth transistors are p-channel transistors.

15. The semiconductor device according to claim 14, further comprising:

an eleventh transistor between the second transistor and the output terminal, wherein one of a source and a drain of the eleventh transistor is electrically connected to the other of the source and the drain of the second transistor, the other of the source and the drain of the third transistor, and the one of the source and the drain of the fourth transistor, wherein the other of the source and the drain of the eleventh transistor is electrically connected to the output terminal, wherein a gate of the eleventh transistor is electrically connected to the first input terminal, and wherein the eleventh transistor is a transistor whose leakage current in an off state per micrometer of a channel width is lower than or equal to $1 \times 10^{-17}$ A.

16. The semiconductor device according to claim 15, wherein the eleventh transistor includes an oxide semiconductor layer including a channel formation region.

* * * * *

UNITED STATES PATENT AND TRADEMARK OFFICE
CERTIFICATE OF CORRECTION

PATENT NO.         : 8,847,627 B2                                          Page 1 of 1
APPLICATION NO.    : 13/472542
DATED              : September 30, 2014
INVENTOR(S)        : Tatsuya Ohnuki It is certified that error appears in the above-identified patent and that said Letters Patent is hereby corrected as shown below:

In the Specification

Column 44, line 56 – before "can" replace "to" with --$\mu_0$-- (First Occurrence);

Column 46, line 38 – after "($\mu$" insert --,--;

Column 50, line 31 – replace "2θ" with --2θ--; and

Column 57, line 32 – replace "1 × $10^{17}$" with --1 × $10^{-17}$--.

Signed and Sealed this
Twenty-first Day of July, 2015

Michelle K. Lee
*Director of the United States Patent and Trademark Office*